United States Patent [19]
Welles, II et al.

[11] Patent Number: 5,159,598
[45] Date of Patent: Oct. 27, 1992

[54] BUFFER INTEGRATED CIRCUIT PROVIDING TESTING INTERFACE

[75] Inventors: Kenneth B. Welles, II, Scotia; Paul A. Delano, Clifton Park; Richard I. Hartley, Schenectady; Michael J. Hartman; Abhijit Chatterjee, both of Clifton Park, all of N.Y.

[73] Assignee: General Electric Company, Schenectady, N.Y.

[21] Appl. No.: 518,589

[22] Filed: May 3, 1990

[51] Int. Cl.[5] .................. G06F 11/00; G01R 31/28
[52] U.S. Cl. ................. 371/22.1; 371/22.3; 371/22.6; 371/36
[58] Field of Search ........ 371/22.1, 22.6, 36, 371/22.3

[56] References Cited
U.S. PATENT DOCUMENTS

| | | | |
|---|---|---|---|
| 4,375,683 | 3/1983 | Wensley | 371/36 |
| 4,381,562 | 4/1983 | Groom, Jr. et al. | 371/22.1 |
| 4,490,673 | 12/1984 | Blum et al. | 324/158 R |
| 4,500,988 | 2/1985 | Bennett et al. | 370/85.6 |
| 4,540,903 | 9/1985 | Cooke et al. | 307/269 |
| 4,583,224 | 4/1986 | Ishii et al. | 371/36 |
| 4,752,729 | 6/1988 | Jackson et al. | 371/22.1 |
| 4,825,439 | 4/1989 | Sakashita et al. | 371/22.1 |
| 4,973,904 | 11/1990 | Sonnek | 371/22.1 |
| 4,989,209 | 1/1991 | Littlebury et al. | 371/22.1 |

Primary Examiner—Robert W. Beausoliel
Assistant Examiner—Allen M. Lo
Attorney, Agent, or Firm—M. Snyder

[57] ABSTRACT

An auxiliary monolithic integrated circuit chip provides both buffer amplification and testing interfaces. Off-the-shelf monolithic integrated circuit chips can be connected into an electronics system using one of these auxiliary buffer chips before each input port and after each output port, to implement functional testing similar to that done on monolithic integrated circuit chips with built-in test circuitry.

60 Claims, 21 Drawing Sheets

BUFFER INTEGRATED CIRCUIT PROVIDING TESTING INTERFACE

The invention relates to a buffer integrated-circuit chip providing a testing interface, as may be included in an electronics system comprising a plurality of integrated-circuit chips mounted on a common substrate and joined by high-density interconnections.

RELATIONSHIP TO OTHER APPLICATIONS

This specification incorporates by reference U.S. Pat. No. 4,866,508 issued Sep. 12, 1989, on an application Ser. No. 912,457, filed Sep. 26, 1986 by C. W. Eichelberger, K. B. Welles, II and R. J. Wojnarowski, entitled "INTEGRATED CIRCUIT PACKAGING CONFIGURATION FOR RAPID CUSTOMIZED DESIGN AND UNIQUE TEST CAPABILITY", and assigned to General Electric Company, and allowed Apr. 3, 1989. A continuation application Ser. No. 363,646 of the same title was filed by the same inventors Jun. 8, 1989, contains claims to the testing circuitry and methods for a plural-chip integrated chip, and is assigned to General Electric Company. Patent application Ser. No. 487,481 entitled "INTERNAL TEST CIRCUITRY FOR INTEGRATED CIRCUITS, USING TOKEN PASSING TO SELECT PORTS" was filed Mar. 2, 1990 by Kenneth Brakeley Welles II, Richard Ian Hartley and Michael James Hartman and is assigned to General Electric Company. Patent application Ser. No. 513,636 entitled "TESTING OF INTEGRATED CIRCUITS INCLUDING TEST CIRCUITRY AND USING TOKEN PASSING TO SELECT INPUT PORTS" was filed Apr. 24, 1990 by Kenneth Brakeley Welles II, Richard Ian Hartley and Michael James Hartman is assigned to General Electric Company; has FIGS. 1–10 of its drawings incorporated by reference within the drawing accompanying this specification; and has its specification incorporated by reference within this specification. Patent application Ser. No. 513,636 describes and claims testing procedures for integrated circuits including built-in test circuitry as described and claimed in patent application Ser. No. 487,481.

BACKGROUND OF THE INVENTION

Patent application Ser. No. 912,457 describes a plural-chip integrated circuit in which a number of monolithic integrated-circuit chips are flush-mounted in wells located on the surface of a common substrate and covered over with an insulating polyimide layer. These chips are connected to each other and to on-substrate metallization by High Density Interconnection (HDI) technology. The HDI connections are made through vias in the polyimide layer to bond pads as small as 25 microns across, which can be placed anywhere on the surfaces of the monolithic i-c chips or on the substrate; and connections can be made routing right over active portions of the integrated circuits by virtue of the intervening insulating polyimide layer. Up to four layers of metal interconnection separated by insulating polyimide layers may be used. A limited number of conventional-size bond pads allowing for plural-chip i-c pin-out are provided on the substrate.

Also described is the testing circuitry included within each monolithic i-c chip. Each chip includes a serial-in/parallel-out (SIPO) register for receiving a succession of test vectors supplied thereto in bit-serial form and for cyclically applying that succession of test vectors in bit-parallel form, either to the input ports of the chip or to each output port of each preceding chip as selected by test mode signals. Each chip includes a parallel-in/serial-out (PISO) register for receiving test results in parallel-bit form, either from the output ports of the chip or from each input port of each succeeding chip as selected by test mode signals, and converting the test results to bit-serial output form. The SIPO registers on the chips are also provided with serial-out capabilities, permitting their cascade interconnection as an extended shift register, through which test vectors supplied in serial form may be successively written to each of the SIPO registers. Similarly, the PISO registers on the chips are also provided with serial-in capabilities, permitting their cascade interconnection as another extended shift register, through which test results may be successively read in serial form from each of the PISO registers.

Patent application Ser. Nos. 487,481 and 513,636 each describe a more recently developed and preferred type of monolithic integrated circuit chip with built-in test capability, in which the component SIPO and PISO registers included in each chip can be accessed on an individual, rather than a serial, basis.

Occasions arise, particularly where the fast system prototyping capability of HDI technology is being taken advantage of, in which a system is designed to include off-the-shelf i-c chips. Since customarily i-c chips specifically for use in HDI technology are designed with output drive capability only sufficient to drive the low-capacitance high-density interconnections, and since off-the-shelf i-c chips have large bond pads that exhibit larger capacitances, where speeds of response are to be maintained in transferring data from an i-c chip specifically designed for HDI use to an off-the-shelf i-c chip, a high-speed buffer will be needed to interface between those i-c chips. This high-speed buffer will include a buffer amplifier with substantial output drive capability for each bit line in the interface and will be constructed on a separate i-c chip.

It is useful to include built-in test capability for the buffer that is compatible with that for the i-c chips designed specifically for HDI use. This built-in test circuitry should provide for the testing of interconnections to the buffer chip from a preceding i-c chip designed specifically for HDI use, which provision can be readily implemented because the designs of both i-c chips can take into consideration the constraints of HDI technology. Provision must be made for applying test input signals from the input port of the buffer chip to the output port of a preceding chip specifically designed for HDI use.

Provision for the testing of interconnections from the buffer i-c chip to a succeeding off-the-shelf i-c chip is complicated by the fact that the off-the-shelf i-c chip customarily has no provision for built-in testing that allows the driving of test input signals from it back to the preceding buffer i-c chip. (The testing of interconnections between two i-c chips designed for HDI use is usually implemented, as previously noted, by driving test input signals back from the succeeding i-c chip to the preceding i-c chip.) The testing of interconnections from the buffer i-c chip to the succeeding off-the-shelf chip must therefore be done as part of testing the functionality of the off-the-shelf i-c chip by driving test input signals from the preceding buffer i-c chip to the input port(s) of the off-the-shelf i-c chip and by sensing test response signals from the output port(s) of the off-the-shelf i-c chip. (During testing, if the off-the-shelf i-c chip has a plurality of signal-input ports during normal or non-test operating conditions, they are considered portions of a single test-input port having a bit-width equal to the sum of the bit-widths of the individual signal-input ports; and, if the off-the-shelf i-c chip has a plurality of signal-output ports during normal or non-test operating conditions, similarly, they are considered portions of a single test-output port.) If the off-the-shelf i-c chip connected directly to an i-c chip designed for HDI use, there would be no means available for sensing the test response at the test-output port of the off-the-shelf i-c chip. This is because an i-c chip designed for HDI use is not designed to sense the conditions at its input port(s) during testing, but rather is designed only to sense conditions at its output port(s) during testing. It becomes necessary then to insert a testing interface for sensing test responses after the off-the-shelf i-c chip, which testing interface is provided by another i-c chip.

Where there are two off-the-shelf i-c chips in cascade, it is preferable to test the interconnections to the earlier chip, by testing just the functionality of that earlier chip, rather than by testing the combined functionality of both off-the-shelf i-c chips. Accordingly, there should be inserted between the two off-the-shelf i-c chips an i-c chip providing the capability of sensing test responses. It is also preferable to test the interconnections from the later off-the-shelf chip to the succeeding chip designed for HDI use by testing just the functionality of that later chip, rather than the combined functionality of both off-the-shelf chips. Accordingly, there should be inserted between the two off-the-shelf chips a chip providing for driving input test signals into the latter of them.

A single i-c buffer chip with capabilities of providing buffer amplification, sensing test responses, and driving test signals back through its input port reduces the variety of chips required to interface between off-the-shelf i-c chips and i-c chips specifically designed for HDI use. A respective buffer chip with such combined capabilities can be used before each off-the-shelf i-c chip and can also be used after each off-the-shelf i-c chip not otherwise followed by another chip. Also, a respective buffer chip with such combined capabilities can be used after each chip with built-in testing capability not otherwise followed by another chip, in order to provide low-impedance drive capabilities together with the means to test the interconnections to that buffer chip.

To facilitate testing the interconnections to a succeeding chip specifically designed for HDI use, the single i-c chip combining buffer amplification and built-in testing capability will include means for disabling its buffer amplification function during such testing. The low source impedances associated with buffer amplification are not applied to the interconnections currently under test, in order to avoid short-circuiting responses to the interconnection test. This can be implemented using tristate drivers as the buffer amplifiers for each bit-place in the output port of the buffer.

SUMMARY OF THE INVENTION

The invention is embodied in a buffer integrated circuit providing a testing interface. Tristate drivers are included, which have respective data output bit terminals that together form a data output port. Multiplexer means select to a test output terminal the respective logic condition at one of these data output bit terminals. Control signal bits having a first logic state are applied to respective control input bit terminals at the tristate drivers to condition selected ones of them to offer a relatively low source impedance compared to that if control signal bits having a second logic state opposite to the first were applied to those control bit input terminals. Means are provided for applying data signal bits to data bit input terminals of each of the tristate drivers.

In preferred embodiments of the buffer integrated circuit a serial-in/parallel-out register provides storage for test vectors received serially a bit at a time. First switch means selectively apply bits from a data input port to data bit input terminals of the tristate drivers, and second switch means selectively apply bits of the test vector stored in the serial-in/parallel-out register to the data bit input terminals of the tristate drivers.

BRIEF DESCRIPTION OF THE DRAWING

FIG. 20 is a schematic diagram showing how selective enablement of portions of the anterior portion of a bit slice component per FIG. 15 or 13 can be done.

DETAILED DESCRIPTION

Figure 11:
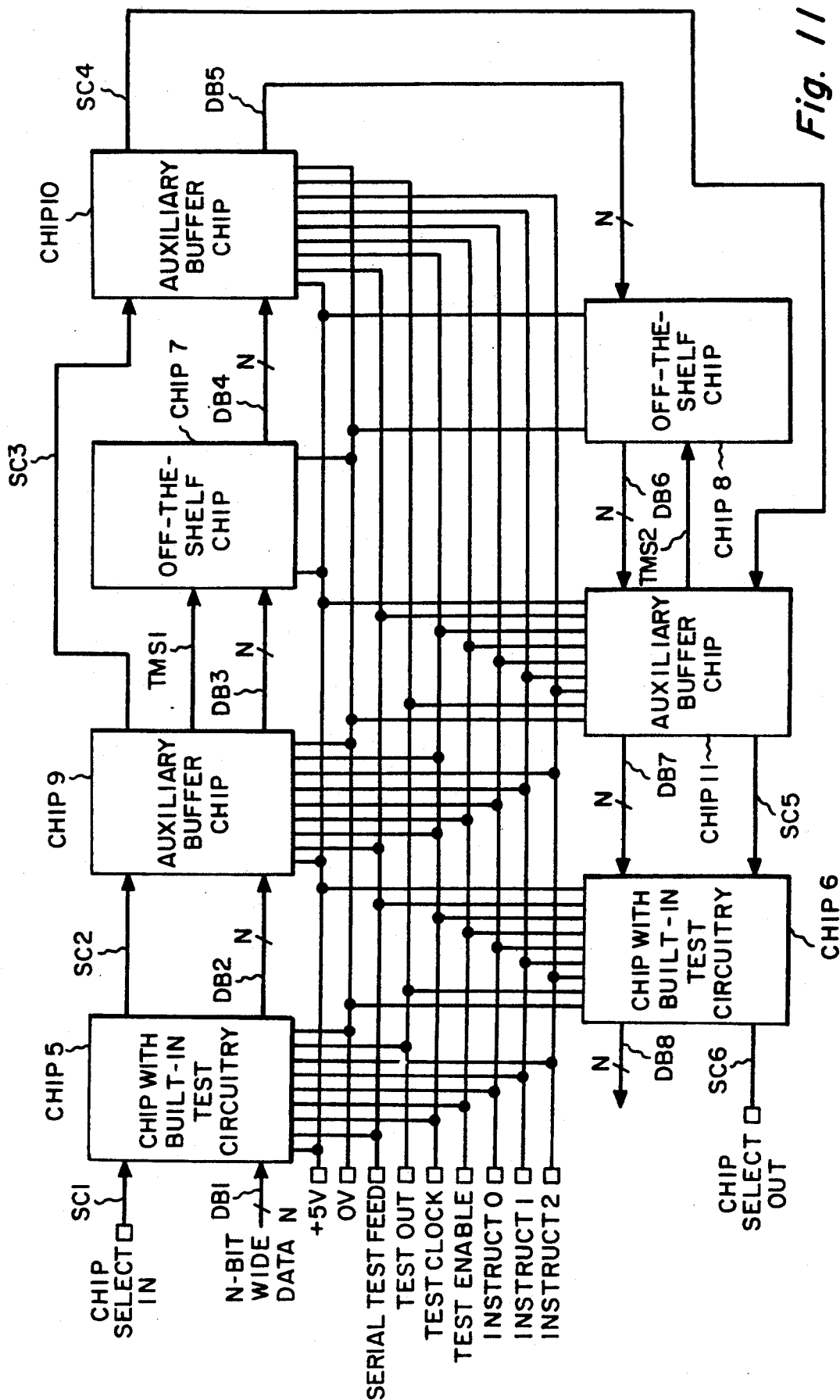
FIG. 11 is a schematic diagram of integrated circuit chips with high-density interconnections therebetween, some of which chips are auxiliary buffer chips structured in accordance with the invention.

FIG. 11 represents a portion of an electronics system constructed using high-density interconnection (HDI) technology. A plurality of monolithic integrated circuits CHIP5 CHIP6, CHIP7, CHIP8, CHIP9, CHIP10 and CHIP11 are mounted on a common substrate and have high density interconnections to a zero-volt operating voltage bond pad, a plus-five-volt operating voltage bond pad, a SERIAL TEST FEED bond pad, a TEST OUT bond pad, a TEST CLOCK bond pad, a TEST ENABLE bond pad, and three instruction bond pads (INSTRUCT 0, INSTRUCT 1 and INSTRUCT 2). Data bus connections DB1, DB2, DB3, DB4, DB5, DB6, DB7 and DB8, each arbitrarily N bits wide, link together these monolithic integrated circuits, any prior monolithic integrated circuit and any subsequent monolithic integrated circuit. The integer N is typically eight. CHIP5 and CHIP6 have built-in test circuitry as described in patent application Ser. No. 487,481 and Ser. No. 513,636. CHIP5 and CHIP6 are to be used together with off-the-shelf, commercial monolithic integrated circuits CHIP7 and CHIP8, which have no built-in test circuitry or have another form of built-in test circuitry. Such other form of test circuitry might use JTAG boundary-scan architecture, named after the Joint Test Action Group, a collaborative organization of major semiconductor users in Europe and North America. CHIP9, CHIP 10 and CHIP 11 are each an auxiliary buffer chip embodying the invention and are used to buffer between CHIP5 and CHIP7, CHIP7 and CHIP8, and between CHIP8 and CHIP6, respectively. CHIP5, CHIP9, CHIP10, CHIP11 and CHIP6 have respective portions of a shift register located therein, which are connected in cascade between a CHIP SELECT IN bond pad and a CHIP SELECT OUT bond pad by HDI connections SC1, SC2, SC3, SC4, SC5 and SC6.

The auxiliary buffer chip CHIP9 provides for testing of the interconnections in the N-bit-wide data bus DB2 by driving a selected one of those interconnections at a time with a ONE-ZERO pattern that can be sensed using the built-in test circuitry of CHIP5 and applied to the TEST OUT bond pad. CHIP9 also provides for driving test vectors at relatively low source impedance through the interconnections in data bus DB3 to the data input port of off-the-shelf CHIP7 during function testing of CHIP7.

The auxiliary buffer chip CHIP10 provides for sensing the responses of off-the-shelf CHIP7 to the input test vectors and applying those responses a bit at a time to the TEST OUT bond pad. CHIP10 also provides for driving input test vectors at relatively low source impedance through the interconnections in data bus DB5 to the data input port of off-the-shelf CHIP8 during functional testing of CHIP8.

The auxiliary buffer chip CHIP11 provides for sensing the responses of off-the-shelf CHIP8 and applying those responses a bit at a time to the TEST OUT bond pad. CHIP11 also provides for sensing ONE-ZERO patterns transmitted by CHIP6 during the testing of interconnections in the N-bit-wide data bus DB7 between CHIP6 and CHIP11.

Figure 1:
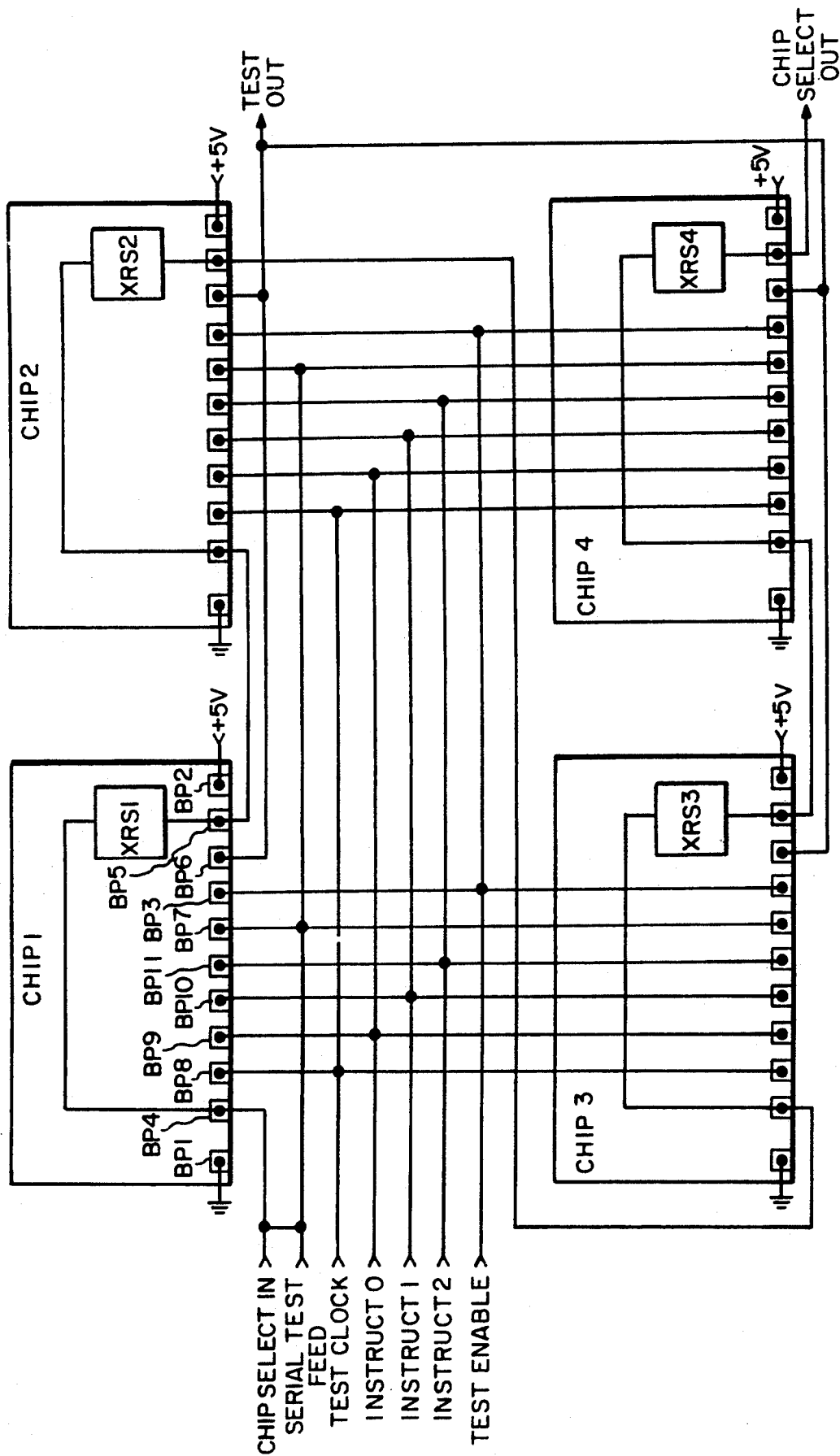
FIGS. 1-10 of allowed U.S. patent application Ser. No. 513,636 filed Apr. 24, 1990 are incorporated together with the accompanying specification within this specification and drawing.

An electronic system can be constructed in accordance with the invention similar to that of FIG. 1 except for omitting CHIP8, CHIP11 and interconnection DB6; connecting SC4 and SC5 directly to each other; and connecting DB5 and DB7 directly to each other. Also electronic systems with more than two off-the-shelf chips in cascade can be constructed in accordance with the invention by introducing a respective auxiliary buffer circuit chip between each pair of successive off-the-shelf chips. Electronics systems with tree connections rather than cascade connections of chips can also be constructed in accordance with the invention, of course.

Figure 12:
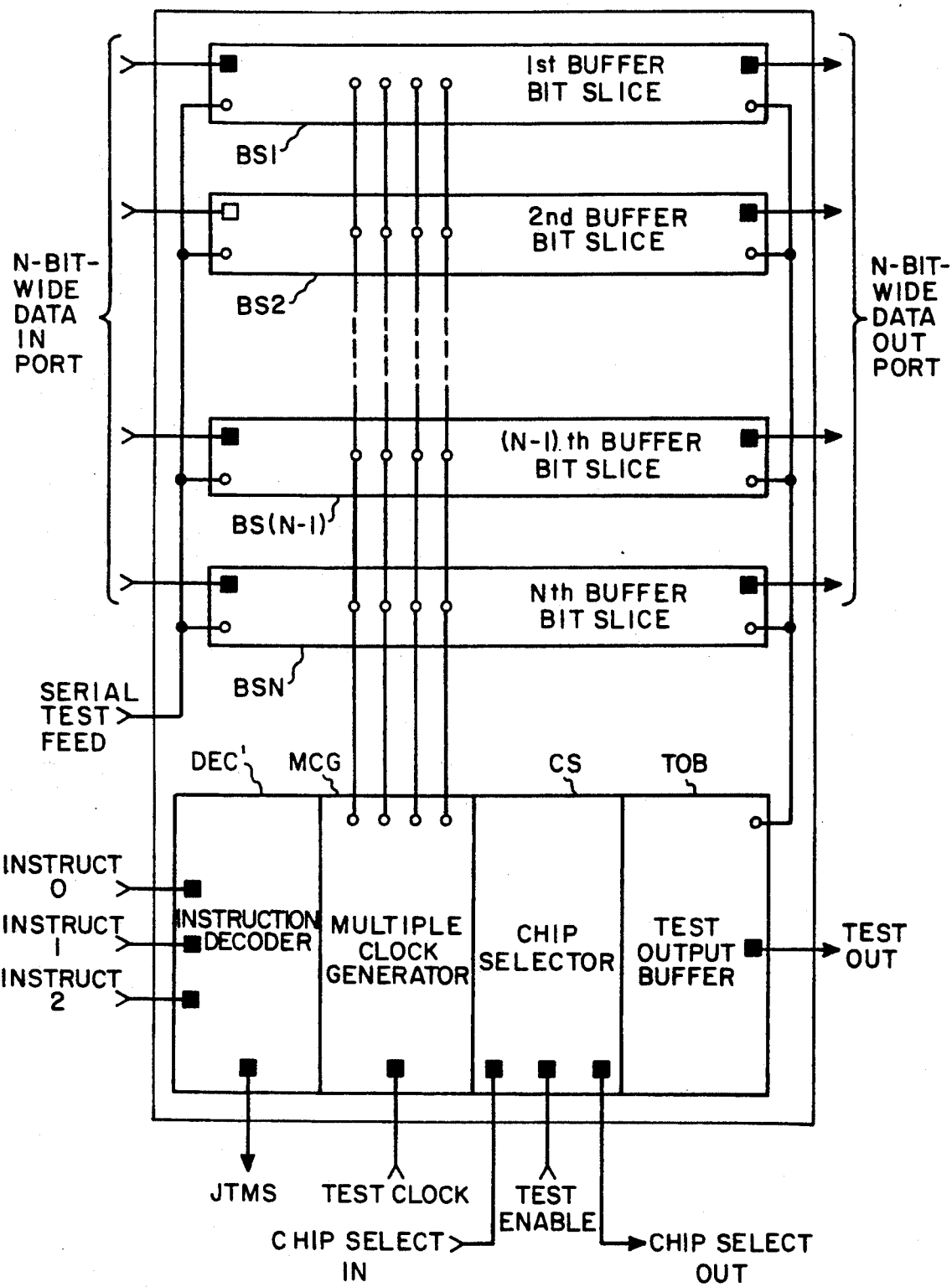
FIG. 12 is a schematic diagram of an auxiliary buffer chip structured in accordance with the invention, which diagram is useful for visualizing how the components of such chip are arranged and interconnected.
Figure 13:
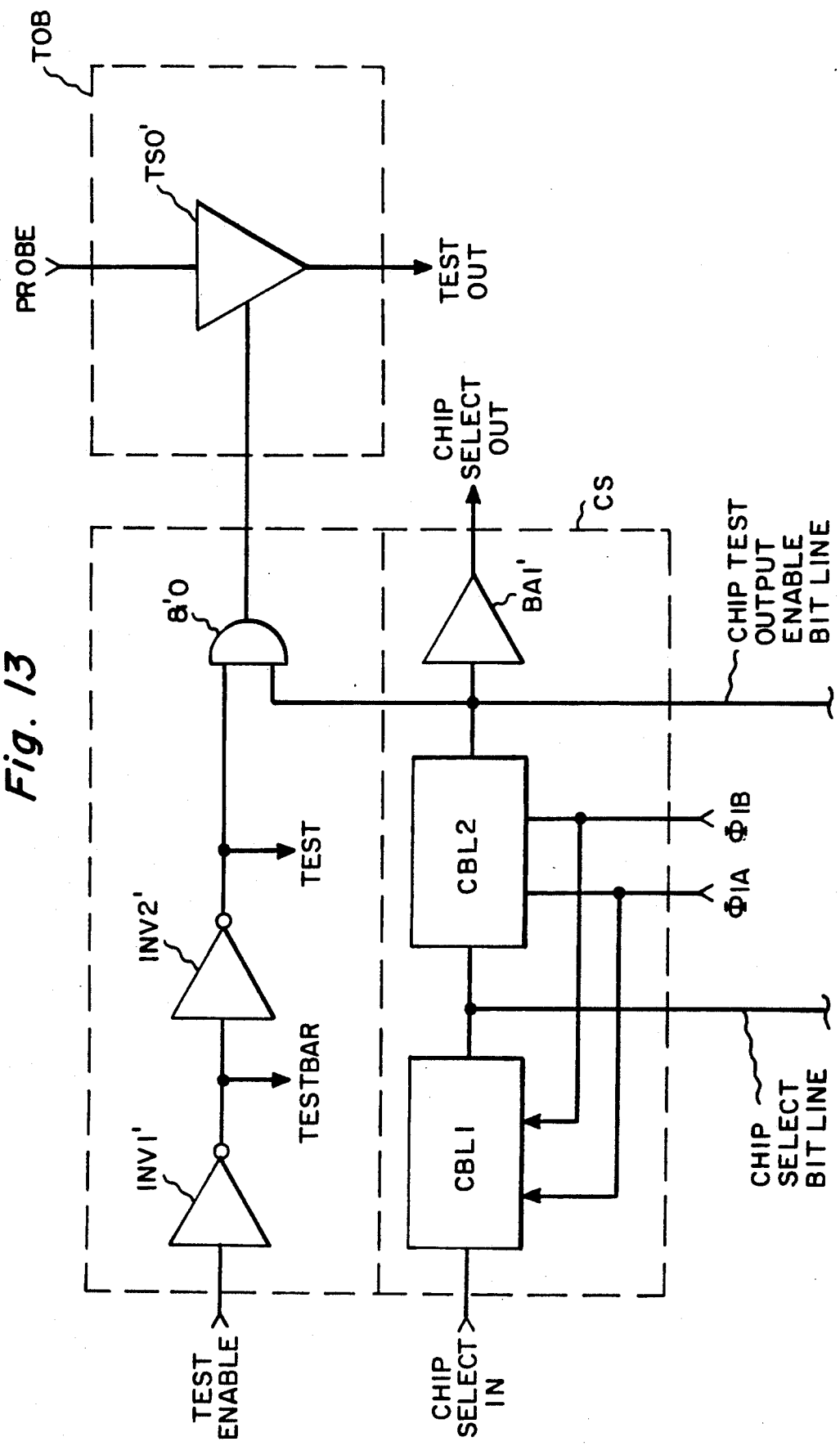
FIG. 13 is a schematic diagram showing the portion of a chip select register within a single auxiliary buffer chip and test enable circuitry associated with that chip select register.
Figure 14:
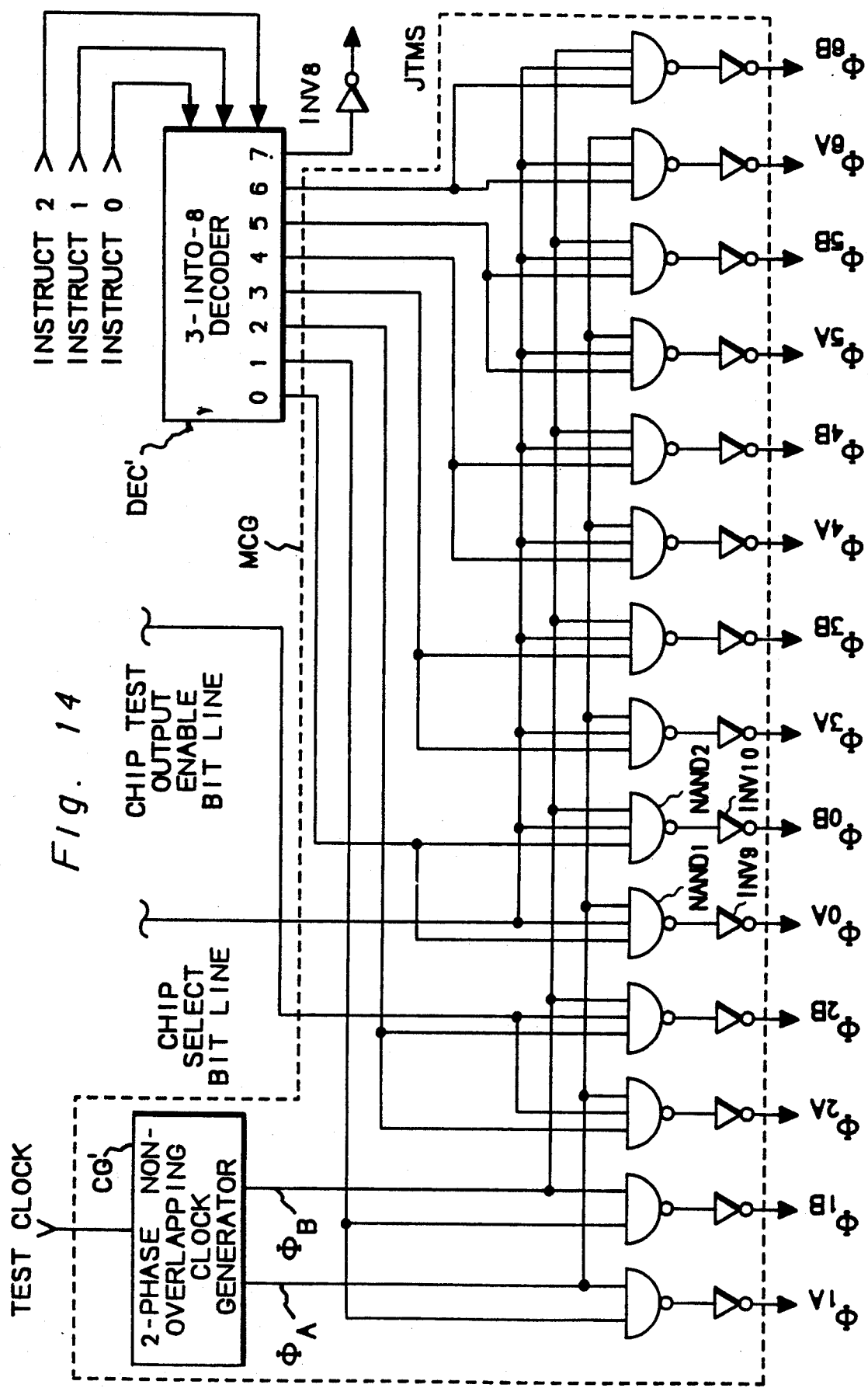
FIG. 14 is a schematic diagram showing in detail the circuitry of the instruction decoder, clock generator and chip selector components for the FIG. 12 auxiliary buffer chip.

FIG. 12 is a representation of an auxiliary buffer circuit constructed in accordance with the invention. A plurality, N in number, of bit slices BS1, BS2, ... BS(N-1), BSN connect the N-bit-wide DATA IN port of the auxiliary buffer circuit to the N-bit-wide DATA OUT port of the same circuit. A chip selector CS responds to single-bit tokens passed to it to enable a multiple clock generator MCG to deliver clock signals to bit slices BS1, BS2, ... BS(N-1), BSN. These single-bit tokens may, for example, comprise a CHIP SELECT token and a CHIP OUTPUT TEST ENABLE token as described in patent application Ser. No. 487,481 and Ser. No. 513,636. Providing it is supplied the TEST ENABLE bit via the TEST ENABLE connection, chip selector CS will enable a test output buffer TOB to connect a selected one of bit slices BS1, BS2, ... BS(N-1), BSN to a TEST OUT connection from the FIG. 12 auxiliary buffer circuit. The bit slices BS1, BS2, ... BS(N-1), BSN each connect from a common SERIAL TEST FEED connection through which test vectors and test instructions are supplied. The CHIP SELECT token bit enables multiple clock generator MCG to supply clocking signals to the bit slices BS1, BS2, ... BS(N-1), BSN at selected times, as controlled by an instruction decoder DEC' responsive to coded commands received via three instruction lines INSTRUCT 2, INSTRUCT 1 and INSTRUCT 0. (When a three-bit command is referred to in this specification, the initial bit of that command is assumed to be applied via the INSTRUCT 2 instruction line; the intermediate bit of that command is assumed to be applied via the INSTRUCT 1 instruction line and the final bit of that command is assumed to be applied via the INSTRUCT 0 instruction line.) These clocking signals control the loading of test vectors and test instructions into bit slices BS1, BS2, ... BS(N-1), BSN from the SERIAL TEST FEED connection. Instruction decoder DEC', multiple clock generator MCG, chip selector CS and test output buffer TOB compare quite closely to elements found on an integrated circuit with built-in test circuitry as described in patent application Ser. No. 487,481 and Ser. No. 513,636. FIGS. 13 and 14 show details this circuitry and facilitate such comparison.

Figure 2:
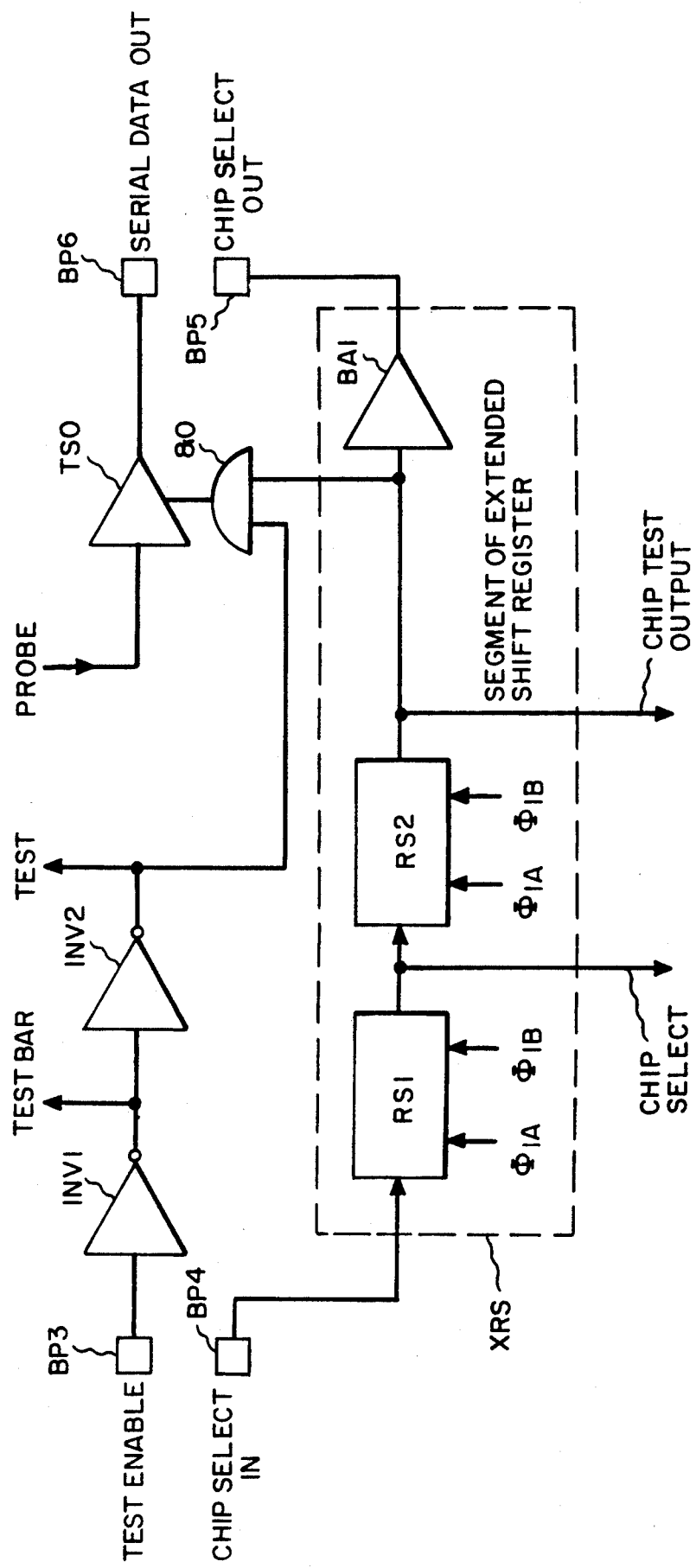

In FIG. 13 the chip selector CS comprises a cascade connection of clocked bit latches CBL1 and CBL2 that correspond in structure and in function with shift register stages RS1 and RS2 of the FIG. 2 circuitry of a chip having built-in test circuitry. The order in which clocked bit latches CBL1 and CBL2 are connected in cascade is arbitrarily chosen, though once an order is chosen it is well to adhere to it thereafter as a standard. Elements INV1', INV2', &0' and BA1' correspond to elements with similar, but unprimed, call-outs shown in FIG. 2. The test output buffer TOB includes a tristate driver TSO' between a PROBE line and a TEST OUT connection, which tristate driver TSO' has a counterpart tristate driver TSO in FIG. 2.

Figure 3:
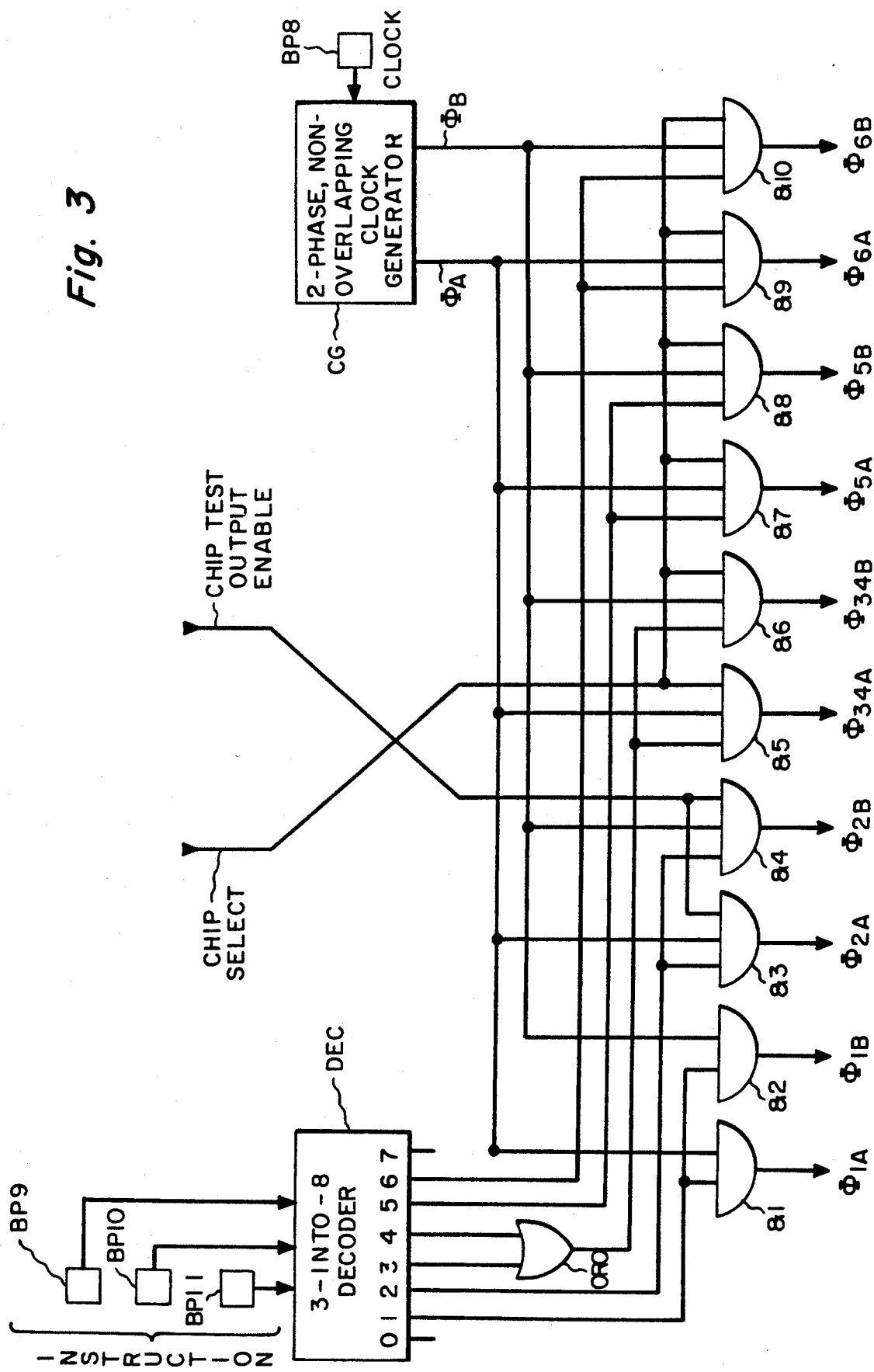
Figure 4:
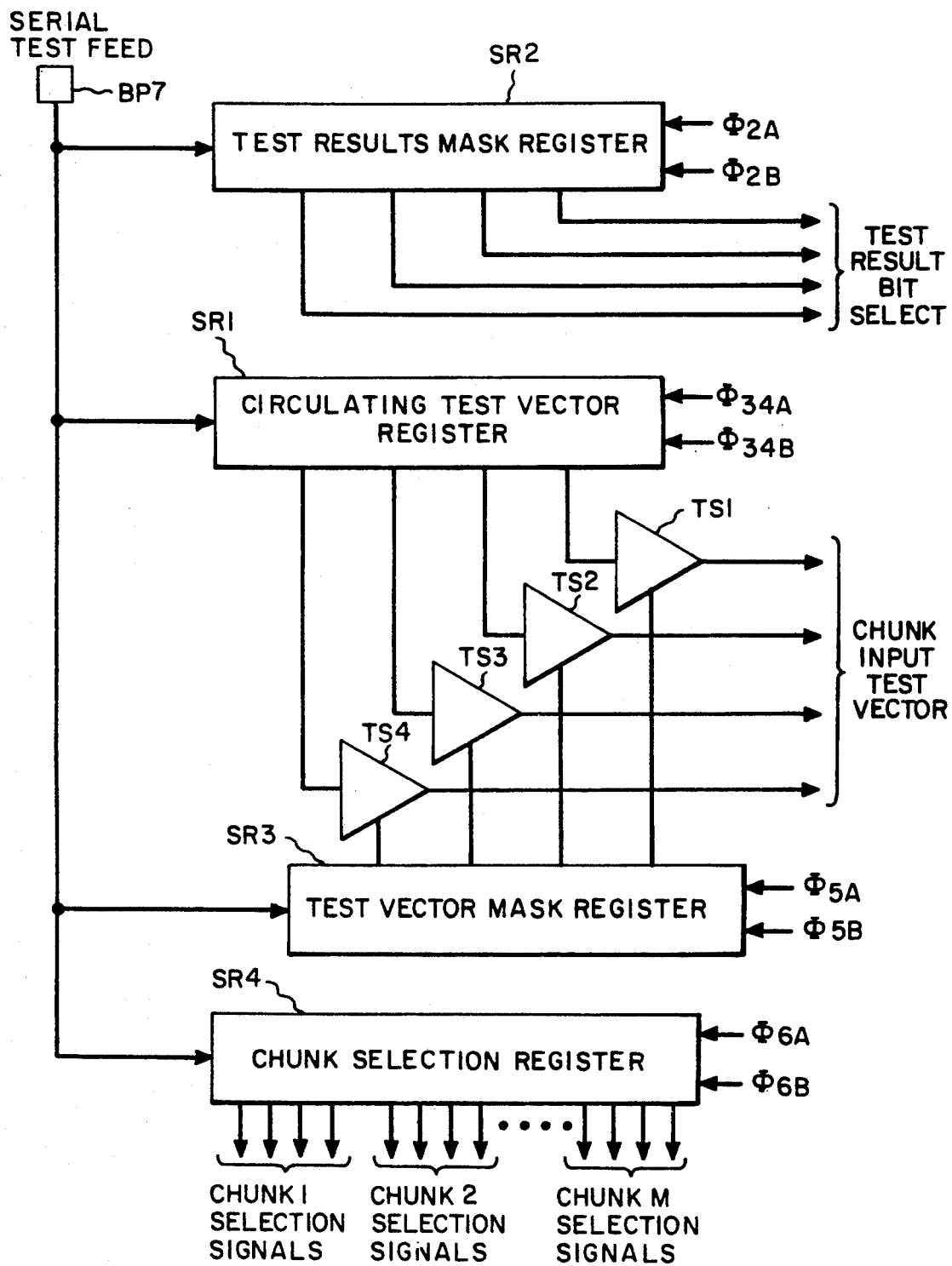
Figure 5:
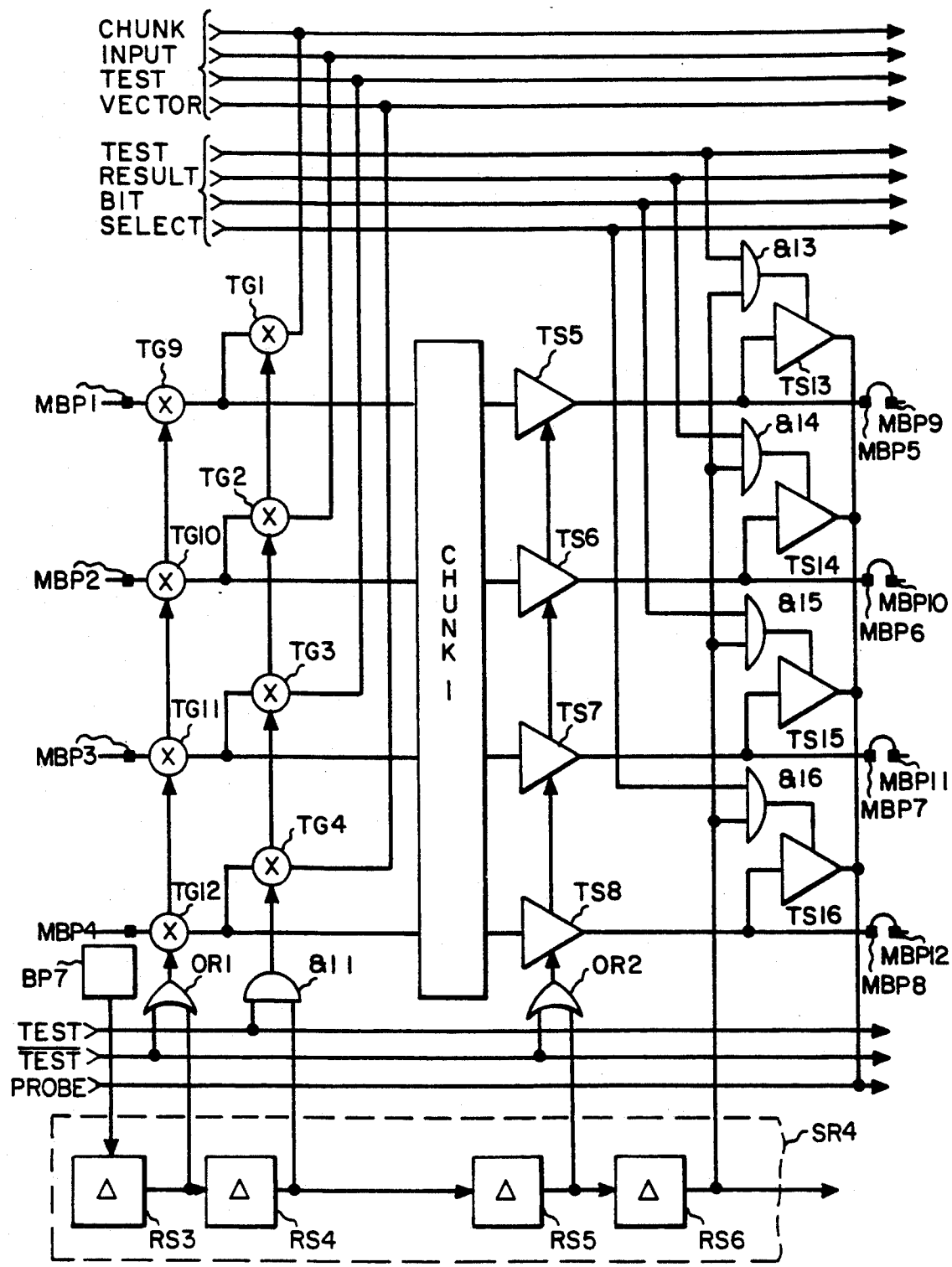
Figure 6:
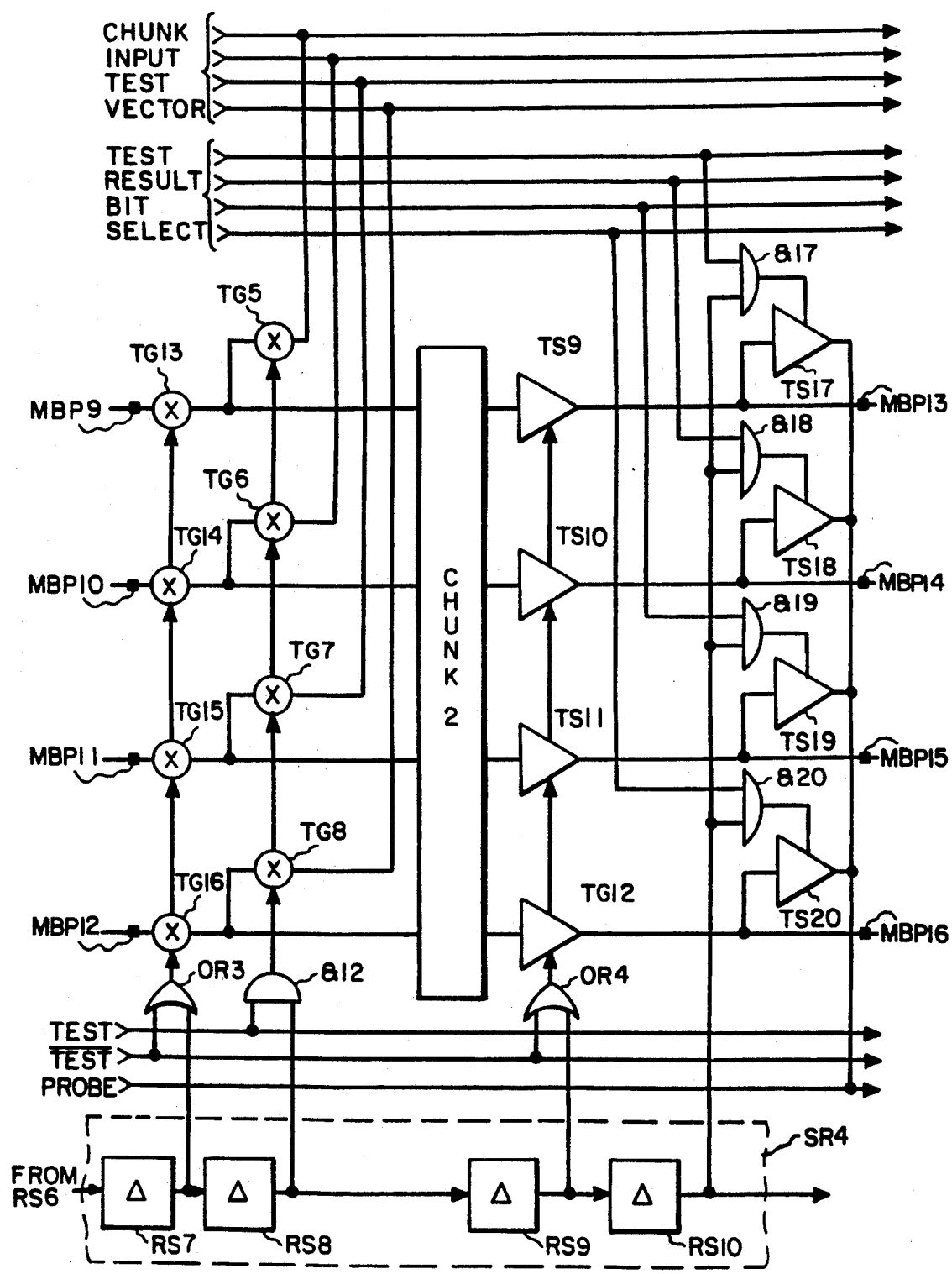
Figure 7:
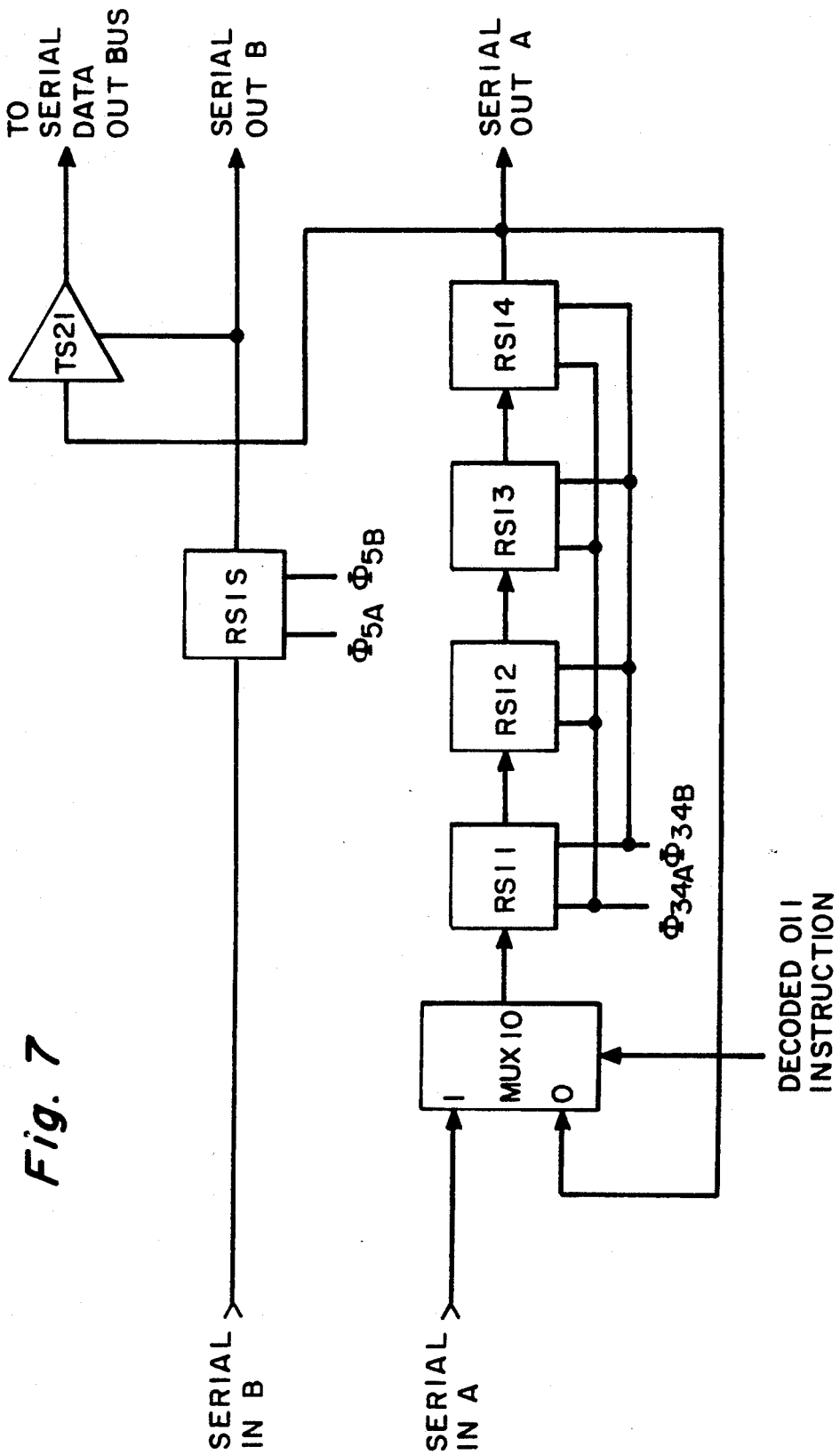
Figure 8:
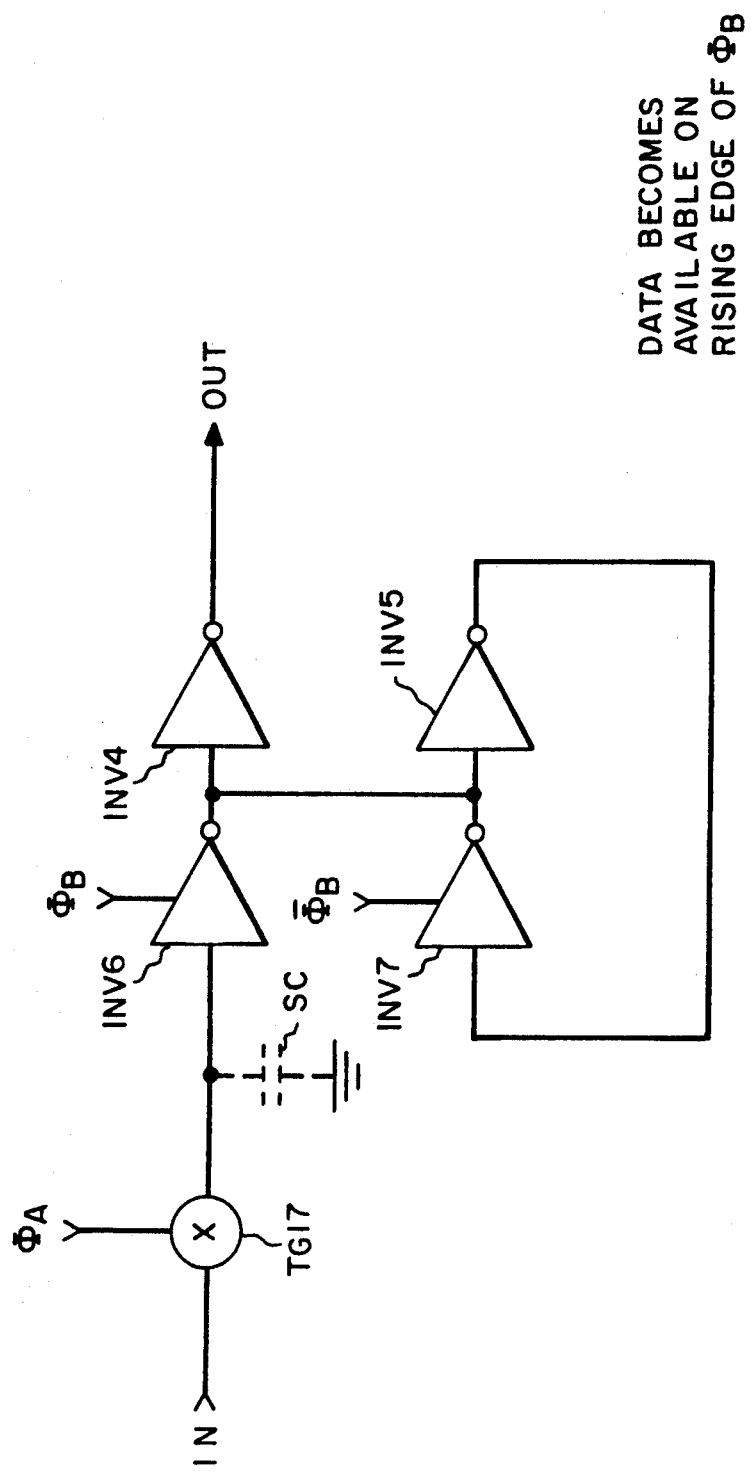
Figure 9:
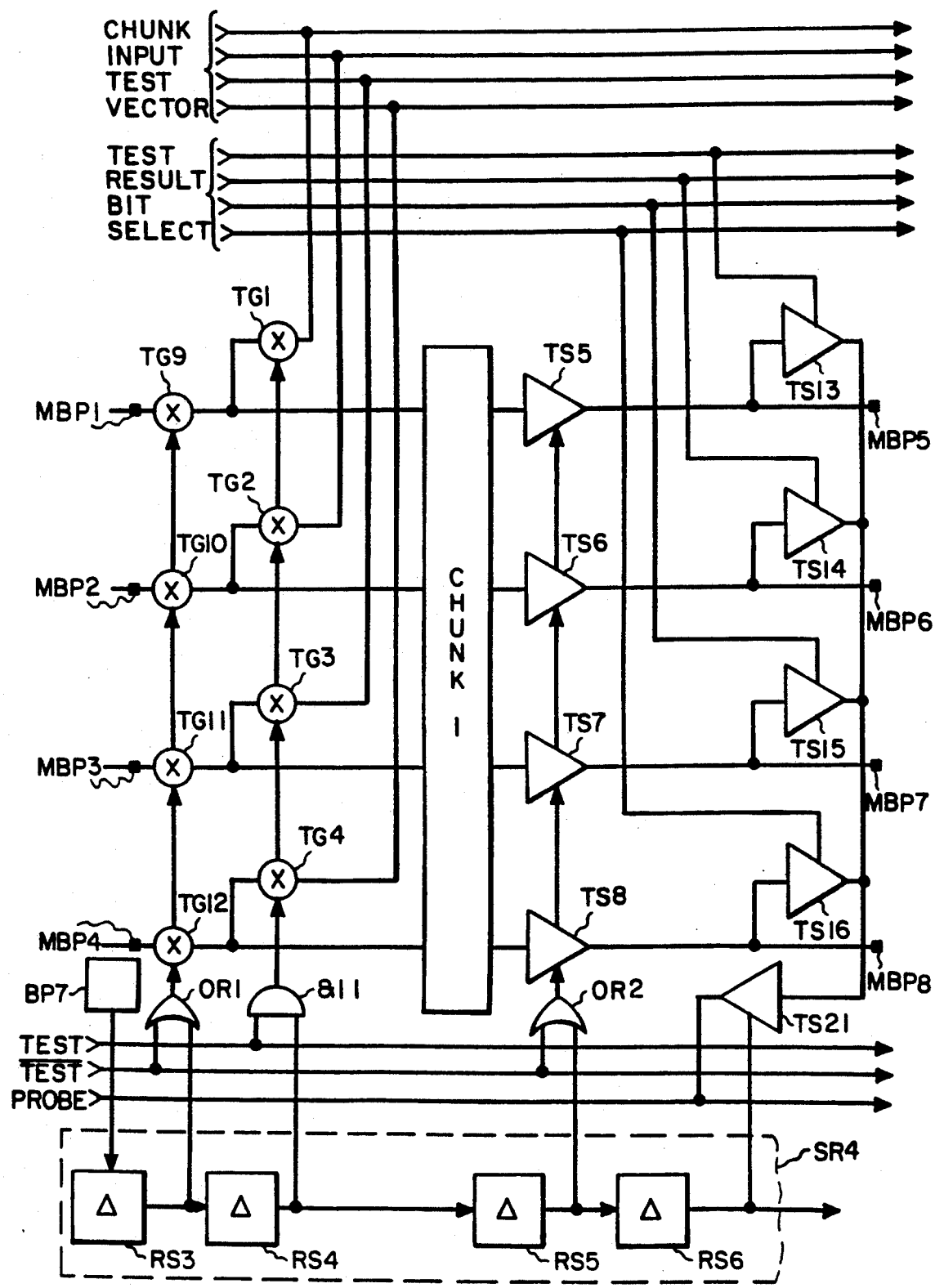
Figure 10:
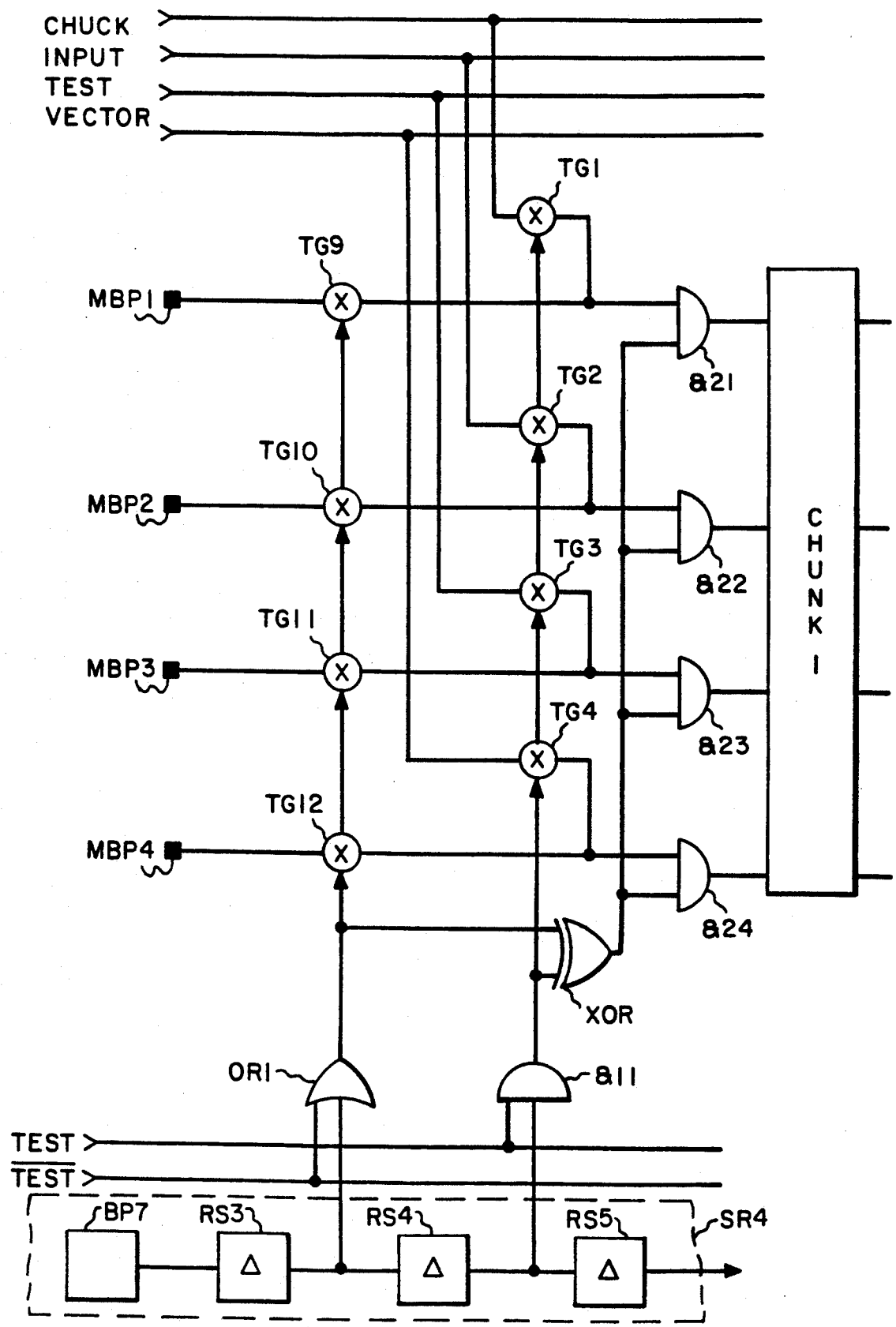

In FIG. 14 the three-into-eight decoder DEC' resembles decoder DEC of FIG. 3, used in an integrated circuit with built in test circuitry, although the decoder outputs are used somewhat differently. The decoding of a 111 instruction causes a ONE at the 7 output of decoder DEC, which ONE is inverted by an inverter INV8 to generate a ZERO output that can be used, as will be explained in detail further on in the specification, in JTAG testing of an off-the-shelf integrated circuit chip designed for JTAG testing. The decoding of a 000 instruction causes a ONE at the 0 output of decoder DEC, that can be used in implementing triple modular redundancy operation, as will be explained in detail further on in the specification.

The multiple clock generator MCG is shown in FIG. 14 as including a clock generator CG' that is the counterpart of clock generator CG of FIG. 3 and that converts a single-phase clock signal received at the TEST CLOCK connection to two non-overlapping clock signal phases $\Phi_A$ and $\Phi_B$. Alternatively, the two non-overlapping clock signal phases $\Phi_A$ and $\Phi_B$ can be supplied to the auxiliary buffer circuit via a pair of TEST CLOCK connections, to simplify on-chip circuitry. The AND gates &1, &2, &3, &4, &5, &6, &7, &8, &9 and &10 of FIG. 3 each find in FIG. 14 a counterpart in a respective combination comprising a NAND gate and a logic inverter in the NAND gate output connection. A NAND gate NAND1 with a logic inverter INV9 in its output connection generates a ONE for $\Phi_A$ clock signal responsive to the $\Phi_A$ clock signal being ONE, the chip select bit for the auxiliary buffer chip stored in clocked bit latch CBL1 being a ONE, and decoder DEC' simultaneously decoding a 000 instruction to generate a ONE at its zero output. A NAND gate NAND2 with a logic inverter INV10 in its output connection generates a ONE for $\Phi_{0B}$ clock signal responsive to the $\Phi_B$ clock signal being a ONE, the chip select bit being a ONE, and decoder DEC' simultaneously decoding a 000 instruction to generate a ONE at its zero output. The selective generation of $\Phi_{0A}$ and $\phi_{0B}$ clocking signals in a selected auxiliary buffer circuit chip is a feature not found in the chips with built-in test circuitry as particularly described in patent application Ser. No. 487,781 and in patent application Ser. No. 513,636.

Figure 15:
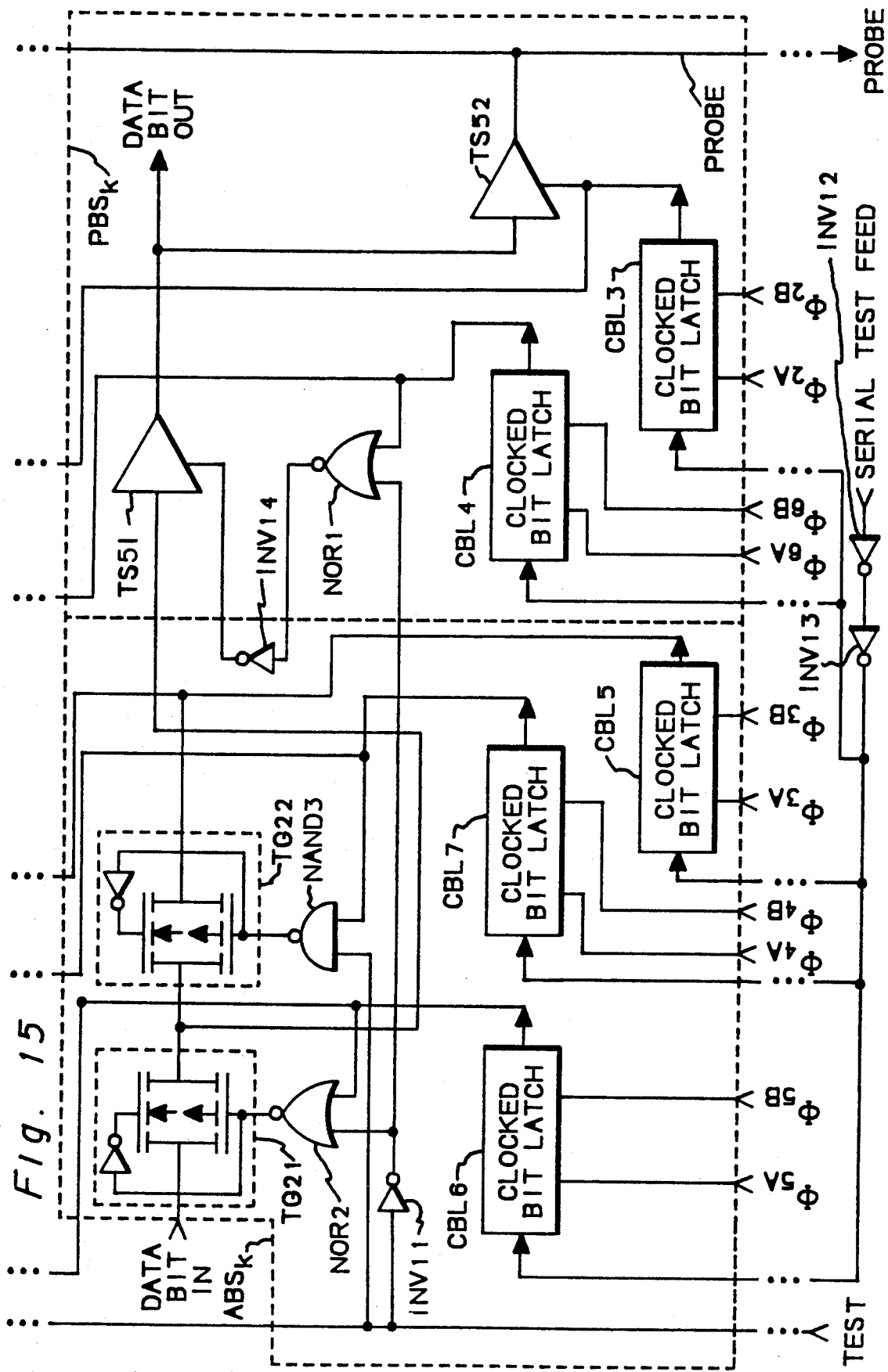
FIG. 15 is a schematic diagram showing in detail a bit slice component for the FIG. 12 auxiliary buffer chip.

FIG. 15 shows more particularly a form the $k^{th}$ one of bit slices BS1, BS2, . . . BS(N-1), BSN of FIG. 12 may take, where k is any integer one through N. This $k^{th}$ representative bit slice has an anterior portion $ABS_k$ connecting from a DATA BIT IN connection and a posterior portion $PBS_k$ connecting to a DATA BIT OUT connection. These connections are via mini bond pads. This $k^{th}$ representative bit slice is assumed to be sandwiched between the next more significant and next less significant bit slices, which are similar in structure to the $k^{th}$ bit slice, which are omitted from FIG. 15 because of the constraints on drawing plate size, and which adjoin the $k^{th}$ bit slice at respective ones of its sides shown at the top and the bottom of FIG. 15, respectively.

A tristate driver TS51 in the posterior section $PBS_k$ of the $k^{th}$ bit slice drives the DATA BIT OUT connection. If so conditioned by its control bit being a ONE, tristate driver TS51 can drive the DATA BIT OUT connection from a sufficiently low source impedance to drive the capacitance of a succeeding off-the-shelf integrated circuit chip. If a transmission gate TG21 used as first switch means in the anterior portion $ABS_k$ of the bit slice is conductive to connect its DATA BIT IN connection to the data input of tristate driver TS51 during normal, non-test operation, tristate driver TS51 will apply the data bit at the DATA BIT IN connection to the DATA BIT OUT connection. Another transmission gate TG22 used as a second switch means in the anterior portion $ABS_k$ of the bit slice is non-conductive except during testing, when transmission gate TG22 is used to selectively apply a bit of an input test vector to the data input of tristate driver TS51. During functional testing of a succeeding off-the-shelf chip, transmission gate TG21 is non-conductive and tristate driver TS51 applies a bit of the input test vector to the DATA BIT OUT connection from relatively low source impedance. During testing of the interconnection to the DATA BIT IN connection from a preceding chip with built-in test circuitry, both transmission gates TG21 and TG22 are conditioned for conduction.

TEST signal is distributed to each bit slice, from inverter INV2' of FIG. 11. TESTBAR signal may also be distributed to each bit slice, from inverter INV1' of FIG. 13, but is shown in FIG. 15 as being regenerated from TEST signal by a logic inverter INV11. A PROBE line threads each bit slice and supplies the test output bit used as input signal by the tristate driver TSO' of FIG. 13. The SERIAL TEST FEED connection through a mini bond pad on the auxiliary buffer circuit chip is buffered in the cascaded inverters INV 12 and INV 13 and supplies the serial input ports of serial-in/parallel-out registers that are distributed amongst the bit slices BS1, BS2, . . . BS(N-1), BSN.

A first of these serial-in/parallel-out registers is formed by the cascade connection of clocked bit latches like CBL3, which are selectively clocked by $\Phi_{2A}$ and $\Phi_{2B}$ non-overlapping two-phase clock signals from the multiple clock generator MCG of FIG. 14. This register stores in each of its clocked bit latches, such as CBL3, a bit that controls the output source impedance of a respective tristate driver, such as TG52, that applies the logic condition at a corresponding DATA BIT OUT connection to the PROBE line. A ONE in one of the clocked bit latches, such as CBL3, will condition its corresponding tristate driver (such as TS52) to impose the logic condition at the corresponding DATA BIT OUT connection on the PROBE LINE, by causing the source impedance at the output connection of that corresponding tristate driver to be substantially lower than that of the other tristate drivers applying their output signals to the PROBE line. Clocking a single ONE through this first serial-in/parallel-out register including clocked bit latch CBL3, by selectively applying clock signals $\Phi_{2A}$ and $\Phi_{2B}$ during testing, polls to the PROBE LINE and thence to the TEST OUT mini bond pad the bit conditions at the N-bit-wide DATA OUT port of the auxiliary buffer circuit.

A second of the serial-in/parallel-out registers connected for receiving SERIAL TEST FEED serially via the cascaded logic inverters INV12 and INV13 is formed by the cascade connection of clocked bit latches like CBL4 in FIG. 15, which latches are selectively clocked by non-overlapping two-phase $\Phi_{6A}$ and $\Phi_{6B}$ clock signals from the multiple clock generator MCG of FIG. 14. This register stores in each of its clocked bit latches (such as CBL4) a bit that when a ONE (as during functional testing of a following off-the-shelf chip) will condition a corresponding tristate driver (such as TS51) that is in a data path through a bit slice to exhibit low source impedance at its output connection. This bit is applied through an OR gate also receptive of TESTBAR signal. In FIG. 15 a representative one of these OR gates, the one between clocked bit latch CBL4 and tristate driver TS51, is shown as composed of a NOR gate NOR1 with a logic inverter INV14 in its output connection. TESTBAR signal is a ONE during normal, non-test operation and is applied through the OR gate formed by NOR1 and INV14 to condition tristate driver TS51 to provide relatively low source impedance drive from its output connection. When testing interconnection from the DATA BIT OUT terminal that tristate TS51 output connects to, it should be conditioned for high source impedance from its output connection. This allows the condition at DATA BIT OUT terminal to be determined by a test vector supplied from the succeeding chip in the system and then be sensed via tristate driver TS52, the PROBE line and tristate driver TS0' in FIG. 13.

A third of the serial-in/parallel-out registers connected for receiving SERIAL TEST FEED serially via the cascaded logic inverters INV12 and INV13 is formed by the cascade connection of clocked bit latches like CBL5 in FIG. 15, which are selectively clocked by non-overlapping two-phase $\Phi_{3A}$ and $\Phi_{3B}$ clock signals from the multiple clock generator MCG of FIG. 14. Each clocked bit latch (such as CBL5) of this third serial-in/parallel-out register stores a respective bit of an input test vector for selective application by a corresponding transmission gate (such as TG22) to a corresponding tristate driver (such as TS52) used for driving a DATA BIT OUT mini bond pad for the auxiliary buffer chip.

A fourth of the serial-in/parallel-out registers connected for receiving SERIAL TEST FEED serially via the cascaded logic inverters INV12 and INV13 is formed by the cascade connection of clocked bit latches like CBL6 in FIG. 15, which are selectively clocked by non-overlapping two-phase $\Phi_{5A}$ and $\Phi_{5B}$ clock signals from the multiple clock generator MCG of FIG. 14. Each clocked bit latch (such as CBL6) of this fourth serial-in/parallel-out register stores a respective control bit for a corresponding transmission gate (such as TG21) that is used as a first switch means in the bit slice for selectively connecting a corresponding DATA BIT IN mini bond pad to the data bit input connection of a corresponding tristate driver (such as TS51) driving a corresponding DATA BIT OUT mini bond pad. This control bit is applied via a corresponding NOR gate (such as NOR2) that also receives TESTBAR signal (as from logic inverter INV 11) as an input bit.

TESTBAR signal is a ONE when TEST signal is a ZERO during normal, non-testing operations. TESTBAR signal being a ONE conditions the corresponding NOR gate (such as NOR2) to have a ZERO output bit. Transmission gate TG21 is of a type conditioned by a ZERO output bit from NOR gate NOR2 to be conductive. Accordingly, during normal, non-testing operation the transmission gates (such as TG21) used as first switch means in the bit slices each apply a respective DATA BIT IN to the data input connection of the tristate driver (such as TS51) driving the DATA BIT OUT for that bit slice. This is done irrespective of the control bit condition stored in the corresponding clocked bit latch (such as CBL6) of the fourth serial-in/parallel-out register.

During testing, when TEST signal is ONE and TESTBAR signal is ZERO, NOR gate NOR2 response depends on the bit condition stored in the corresponding clocked bit latch CBL6. If that bit is a ZERO, on the one hand, NOR gate NOR2 response is a ONE, conditioning transmission gate TG21 not to conduct. This will be the case during functional testing of an off-the-shelf chip following the auxiliary buffer circuit chip, when the test vector bits from the clocked bit latches (such as CBL5) of the third serial-in/parallel-out register are to be applied to the tristate drivers (such as TS51) driving the DATA BIT OUT mini bond pads. Suppose the bit stored in a clocked bit latch (such as CBL6) of the fourth serial-in/parallel-out register is a ONE, on the other hand, as will be the case during the testing of an high-density interconnection to the DATA BIT IN mini bond pad to which selective connection is made by the corresponding transmission gate (such as TG21). This ONE will condition the corresponding NOR gate (such as NOR2) to generate a ZERO response that conditions the corresponding transmission gate (such as TG21) to be conductive.

A fifth of the serial-in/parallel-out registers connected for receiving SERIAL TEST FEED serially via the cascaded logic inverters INV12 and INV13 is formed by the cascade connection of clocked bit latches like CBL7 in FIG. 15, which are selectively clocked by non-overlapping, two-phase $\Phi_{4A}$ and $\Phi_{4B}$ clock signals from the multiple clock generator MCG of FIG. 14. Each clocked bit latch (such as CBL7) of this fifth serial-in/parallel-out register stores a respective control bit for a corresponding transmission gate (such as TG22) used as a second switch means in the bit slice, for selectively applying a test vector bit stored in a corresponding clocked bit latch (such as CBL5) of the third serial-in/parallel-out register to the data bit input connection of a corresponding tristate driver (such as TS51) for a corresponding DATA BIT OUT mini bond pad. This control bit is applied via a corresponding NAND gate (such as NAND3), which gate requires a TEST signal that is ONE in order to respond to this control bit. During normal, non-test operation, when TEST signal is a ZERO, the NAND gate responses (such as that of NAND3) will be ONEs conditioning the second switch means transmission gates (such as TG22) all to be non-conductive, so test vector bits are not applied to the paths for normal data. The conditioned response of this NAND gate (such as NAND3) to its control bit is that of a logic inverter. When a control bit stored in a clocked bit latch (such as CBL7) of the fifth SIPO register is a ZERO, its corresponding NAND gate (such as NAND3) supplies a ONE to its corresponding second switch means transmission gate (such as TG22) to condition it for non-conduction. This condition obtains for all but a selected one of the second switch means transmission gates during the testing of interconnections to the auxiliary buffer circuit chip, for example. When a control bit stored in a clocked bit latch, such as CBL7, of the fifth SIPO register is a ONE, its corresponding NAND gate (such as NAND3) supplies a ZERO to its corresponding second switch means transmission gate (such as TG22) to condition it for conduction. This applies a test vector bit from a corresponding bit latch (such as CBL5) in the third SIPO register to a corresponding tristate driver (such as TS51) for the corresponding DATA BIT OUT mini bond pad.

During testing a high-density interconnection to a DATA BIT IN mini bond pad its corresponding second switch means transmission gate will be made to conduct. All the second switch means transmission gates (such as TG22) can be rendered conductive during functional testing of an off-the-shelf chip following the auxiliary buffer circuit chip.

Figure 16:
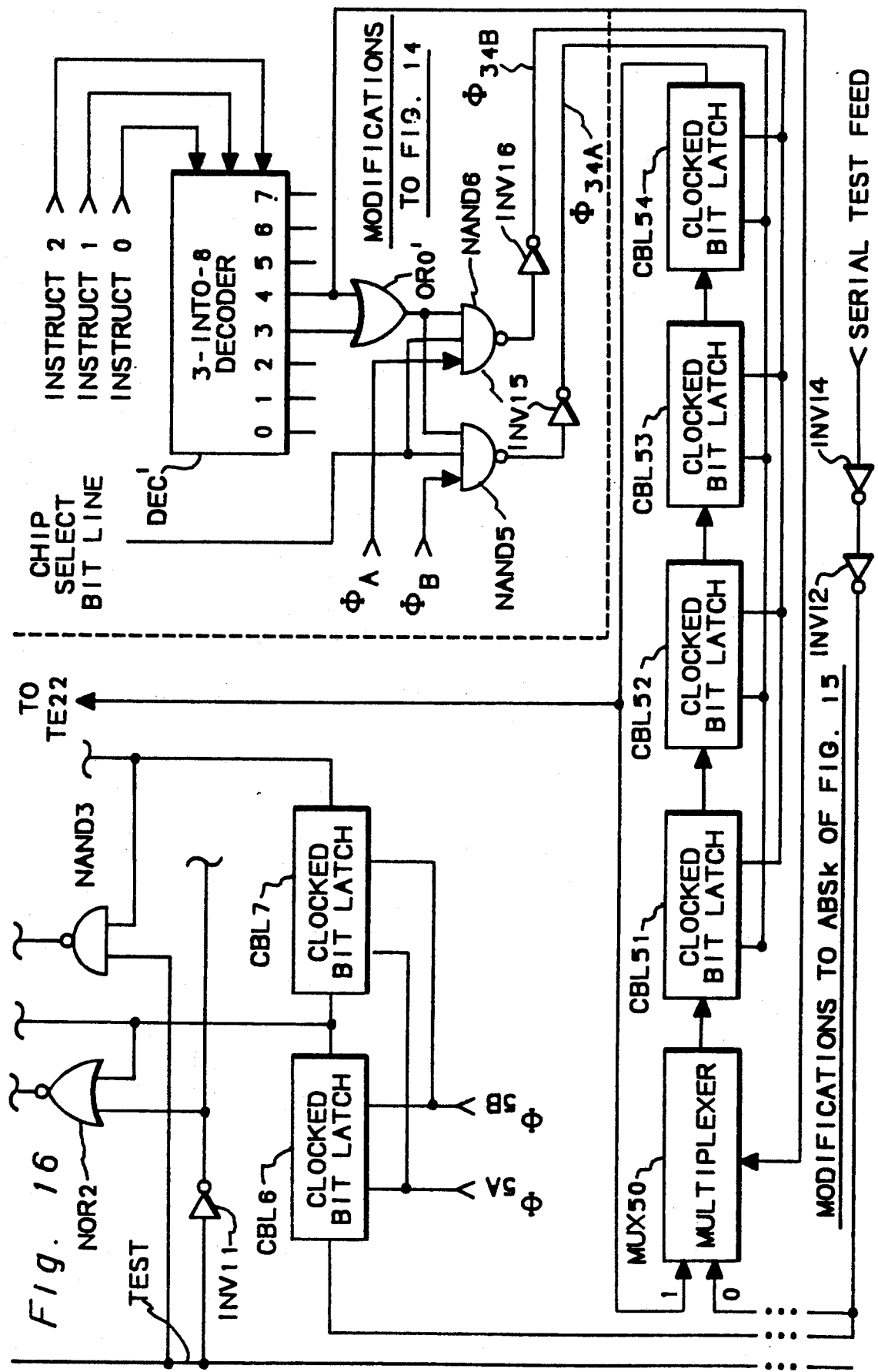
FIG. 16 is a schematic diagram of modifications that can be made to the FIG. 12 and FIG. 15 circuitry.

FIG. 16 shows in the upper right corner thereof a modification that can be made in the FIG. 14 circuitry of an auxiliary buffer circuit chip. The remainder of FIG. 16 shows a corresponding modification that can be made in the FIG. 15 circuitry of the same auxiliary buffer circuitry chip to the anterior portion $ABS_k$ of each bit slice. These modifications make testing of high-density interconnections from a chip with built-in test circuitry to an auxiliary buffer circuitry chip better conform to the testing of high-density interconnections between two chips with built-in test circuitry, where each chip with built-in test circuitry is of a type described in patent application Ser. No. 487,481 and Ser. No. 513,636. In such a chip with built-in test circuitry a SIPO register that can store a plurality of input test vectors for successive application is used, which is loaded responsive to one command, such as an 011 command, received on the instruction lines INSTRUCT 0, INSTRUCT 1 AND INSTRUCT 2. This SIPO register has its stored test vectors successively presented responsive to another command, such as a 100 command.

To make two corresponding commands available to a similar SIPO register in the auxiliary buffer circuitry chip, which register will replace the third SIPO register comprised of clocked bit latches (such as CBL5) separate fourth and fifth SIPO registers for storing control bits for the first switch means transmission gates (such as TG21) and for the second switch means transmission gates (such as TG22) are replaced with a single SIPO register selectively clocked with non-overlapping two-phase $\Phi_{5A}$ and $\Phi_{5B}$ clock signals. In each bit slice anterior portion, such as $ABS_k$, there is a cascading in a prescribed order of the clocked bit latches (such as CBL6 and CBL7) that contain control bits for the first switch means transmission gate (such as TG21) and the second switch means transmission gate (such as TG22).

In each bit slice anterior portion (such as $ABS_k$) the single clocked bit latch (such as CBL5) in the third SIPO register is replaced by a plurality (usually even in number) of cascaded clocked bit latches (such as CBL51, CBL52, CBL53 and CBL54) and a multiplexer (such as MUX50) for selectively connecting those clocked bit latches in a ring by themselves or in a chain with similar cascaded clocked bit latches in other bit slice anterior portions. The decoder DEC' output when it receives a 100 command conditions multiplexers such as MUX50 to connect the cascaded clocked bit latches such as CBL51, CBL52, CBL53 and CBL54 in ring connection with each other. An OR gate ORO', NAND gates NAND5 and NAND6, and logic inverters INV15 and INV16 perform substantially the same functions as OR gate ORO and AND gates &5 and &6 of FIG. 2 of patent application Ser. No. 487,481 or of patent application Ser. No. 513,636 with regard to providing non-overlapping two-phase $\Phi_{34A}$ and $\Phi_{34B}$ clocking signals to the clocked bit latches such as CBL51, CBL52, CBL53 and CBL54 in the replacement third SIPO register whenever a 011 or 100 command is received by decoder DEC'.

Modifications alternative to those shown in FIG. 16 can be made to the auxiliary buffer chip to provide for storing the control bits for the first switch means (such as TG21) and the second switch means (such as TG22) in a single SIPO register. As an example, a single SIPO register may be used to store the control bits for the first switch means in its initial half and to store the control bits for the second switch means in its final half. As a further example, a single SIPO register may be used to store the control bits for the second switch means in its initial half and to store the control bits for the first switch means in its final half. In either example of alternative modification, the SIPO register for storing switch means control bits could be selectively clocked by $\Phi_{5A}$ and $\Phi_{5B}$ two-phase clocking signal.

Rather than replacing the fourth and fifth SIPO registers which respectively include clocked bit latch CBL6 and clocked bit latch CBL7 with a single SIPO register as described, in order to accommodate the replacement third SIPO register that stores a plurality of test vectors, one could arrange to clock the fifth SIPO register with the two-phase $\Phi_{0A}$ and $\Phi_{0B}$ clock signal. This is not possible in one type of auxiliary buffer circuitry chip for use in fault-tolerant reconfigurable electronics, to be described with reference to FIGS. 15 and 16 further on in this specification, since this type of auxiliary buffer circuitry chip requires an additional SIPO register for storing token bits to determine which of a plurality of its data input ports is to be connected selectively to its data output port.

Assuming the use of an auxiliary buffer chip of this type, including the modifications shown in FIG. 16, the interconnections from a chip with built-in test circuitry to the auxiliary buffer circuit can be tested in the manner now to be described. Consider the testing of interconnections in data bus DB2 connecting CHIP5 to CHIP9 in FIG. 11, for example. The CHIP SELECT OUT mini bond pad of CHIP5 is assumed to be connected directly to the CHIP SELECT IN mini bond pad of CHIP9, reflective of the pipeline connection including them and the intervening data bus DB2. A ONE functioning as a CHIP SELECT token is clocked into CHIP5 responsive to a 001 command on the instruction lines INSTRUCT 0, INSTRUCT 1 and INSTRUCT 2. CHIP5 is then programmed for performing its role in the interconnection testing of data bus DB2 following the procedures described in patent application Ser. No. 513,636. Thereafter, the 001 command is reapplied to the instruction lines for another two clock cycles while entering a ONE followed by ZERO to the CHIP SELECT IN port, so that two successive ONEs reside in the clocked chip select bus, one the CHIP SELECT token in CHIP9 and the other a CHIP TEST OUTPUT ENABLE token in CHIP5. A 101 command is applied to the instruction lines while a string of ONEs is applied to the SERIAL TEST FEED line, which procedure provides, during times TEST ENABLE SIGNAL is high, a respective ONE as control bit for each of the transmission gates used as a first or second switch means in the bit slices of CHIP9, conditioning CHIP9 for applying input test vectors to the data bus DB2 to be sensed in CHIP5. A 011 command is provided on the instruction lines to condition the loading of the input test vector register of CHIP9 (comprising its clocked bit latch CBL5 etc.) with a string of alternating ONEs and ZEROs applied to the SERIAL TEST FEED line. The remainder of the interconnection testing procedure for data bus DB2 comprises the alternate application of 010 command to the instruction lines for one TEST CLOCK cycle, thereby conditioning CHIP5 to select for sensing a next one of the interconnections in data bus DB2, and of 100 command for an even-numbered plurality of TEST CLOCK cycles, thereby causing CHIP9 to generate a pattern of alternating ONEs and ZEROs for application to that next selected interconnection.

Also, the testing of interconnections to a chip with built-in test circuitry from the auxiliary buffer circuit can be tested, such as the interconnections in data bus DB7 connecting from CHIP11 to CHIP6 in FIG. 11, for example. The CHIP SELECT OUT mini bond pad of CHIP11 is assumed to be connected directly to the CHIP SELECT IN mini bond pad of CHIP6, reflective of the pipeline connection including them and the intervening data bus DB7. A leading one of two successive ONEs, which functions as a CHIP SELECT token, is clocked into CHIP11 responsive to a 001 command on the instruction lines INSTRUCT 0, INSTRUCT 1 and INSTRUCT 2. A 110 command is applied to the instruction lines while a string of ZEROs is applied to the SERIAL TEST FEED line, which procedure provides a ZERO as control bit to each of the tristate drivers used to drive the DATA BIT OUT mini bond pads in the bit slices of CHIP11, conditioning these tristate drivers to exhibit relatively high source impedances to the interconnections in data bus DB7. A 010 command is applied to the instruction lines for one TEST CLOCK cycle to load a ONE applied to the SERIAL TEST FEED line into the initial clocked bit latch in the CHIP11 SIPO register containing clocked bit latch CBL3. Thereafter, the 001 command is reapplied to the instruction lines for another two clock cycles while entering a ONE followed by ZERO to the CHIP SELECT IN port, so that two successive ONEs reside in the clocked chip select bus, one the CHIP SELECT token in CHIP6 and the other a CHIP TEST OUTPUT ENABLE token in CHIP11. CHIP6 is then programmed for performing its role in the interconnection testing of data bus DB7 following the procedures described in patent application Ser. No. 513,636. The remainder of the interconnection testing procedure for data bus DB7 comprises the alternate application of 010 command to the instruction lines for one TEST CLOCK cycle, conditioning CHIP11 to select for sensing a next one of the interconnections in data bus DB7, and of 100 command for an even-numbered plurality of TEST CLOCK cycles, causing CHIP6 to generate a pattern of alternating ONEs and ZEROs for application to that next selected interconnection.

The functional testing of an off-the-shelf chip connected between two auxiliary buffer chips, such as CHIP7 of FIG. 11 connected between CHIP9 and CHIP10, is performed as follows. The CHIP SELECT OUT mini bond pad of CHIP9 is assumed to be connected directly to the CHIP SELECT IN mini bond pad of CHIP10, reflective of the pipeline connection including them and the intervening data bus DB3, CHIP7 and data bus DB4. Two successive ONEs, one of which functions as a CHIP SELECT token and the other of which functions as a CHIP TEST OUTPUT ENABLE token, are clocked into CHIP9 responsive to a 001 command on the instruction lines INSTRUCT 0, INSTRUCT 1 and INSTRUCT 2. A 101 command is applied to the instruction lines while a string of alternating ONEs and ZEROs is applied to the SERIAL TEST FEED line, which procedure provides, during times TEST ENABLE SIGNAL is high, a respective ONE for application as control bit to each of the transmission gates used as a second switch means in the bit slices of CHIP9, conditioning CHIP9 for applying input test vectors to the data bus DB3 to be applied to the data input port of off-the-shelf chip CHIP7. This procedure also provides, during times TEST ENABLE SIGNAL is high, a respective ZERO for application as control bit to each of the transmission gates used as a first switch means in the bit slices of CHIP9, conditioning CHIP9 not to accept input data supplied via data bus DB2. A 110 command is applied to the instruction lines while a string of ONEs is applied to the SERIAL TEST FEED line, which procedure provides a ONE as control bit to each of the tristate drivers used to drive the DATA BIT OUT mini bond pads in the bit slices of CHIP9, conditioning these tristate drivers to exhibit relatively low source impedances for driving the interconnections in data bus DB3, the N-bit-wide data input port of off-the-shelf chip CHIP7 and the capacitances associated with them. A 010 command is applied to the instruction lines for a number N of TEST CLOCK cycles to load a string of ZEROs applied to the SERIAL TEST FEED line into the CHIP9 SIPO register containing clocked bit latch CBL3.

Thereafter, the 001 command is reapplied to the instruction lines for another two clock cycles while entering a ONE followed by ZERO to the CHIP SELECT IN port, so that two successive ONEs reside in the clocked chip select bus, one the CHIP SELECT token in CHIP9 and the other a CHIP TEST OUTPUT ENABLE token in CHIP10. A 101 command is applied to the instruction lines while a string of alternating ZEROs and ONEs is applied to the SERIAL TEST FEED line, which procedure provides during times TEST ENABLE SIGNAL is high a respective ONE for application as control bit to each of the transmission gates used as a first switch means in the bit slices of CHIP10, conditioning CHIP10 for accepting CHIP7 response to input test vectors supplied to CHIP7 from CHIP9. This procedure also provides a respective ZERO for application as control bit to each of the transmission gates used as a second switch means in the bit slices of CHIP10, conditioning CHIP10 not to accept input test vectors from its SIPO register for test vectors. A 110 command is applied to the instruction lines while a string of ONEs is applied to the SERIAL TEST FEED line, which procedure provides a ONE as control bit to each of the tristate drivers used to drive the DATA BIT OUT mini bond pads in the bit slices of CHIP10, conditioning these tristate drivers to exhibit relatively low source impedances. A 010 command is applied to the instruction lines for one TEST CLOCK cycle to load a ONE applied to the SERIAL TEST FEED line into the initial clocked bit latch in the CHIP10 SIPO register containing clocked bit latch CBL3. The remainder of the functional testing procedure for off-the-shelf chip CHIP7 comprises the application of 010 command to the instruction lines for conditioning CHIP10 to successively sense each one of the interconnections in data bus DB5 at the data output port of CHIP10.

Figure 17:
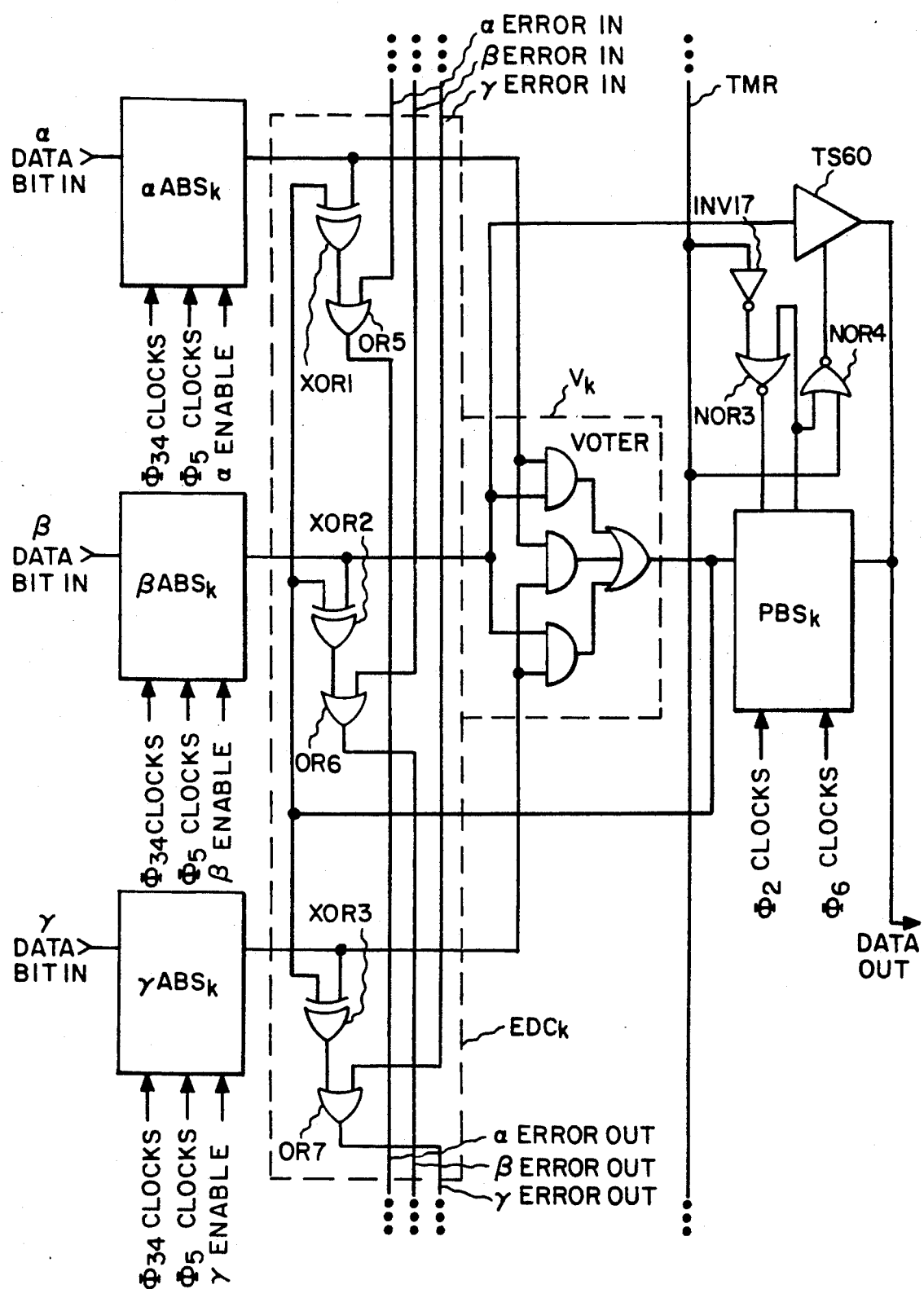
FIG. 17 is a schematic diagram of an alternative bit slice component for the FIG. 12 auxiliary buffer chip, which suits it for use in triple modular redundancy circuits.

FIG. 17 shows how the bit slice of an auxiliary buffer circuitry chip as thus far described can be modified to implement triple-mode-redundant (TMR) operation. Each posterior portion $PBS_k$ of a $k^{th}$ bit slice has not just one anterior portion $ABS_k$ of the $k^{th}$ bit slice associated with it, but rather has associated with it three anterior portions $\alpha ABS_k$, $\beta ABS_k$ and $\gamma ABS_k$ of that $k^{th}$ bit slice. The CBL5 clocked bit latches in the portions $\alpha ABS_1$, $\alpha ABS_2$, $\alpha ABS_3$, etc. are in cascade connection to form a shift register for the SERIAL TEST FEED signal (supplied via bond pad BP7 and cascaded logic inverters INV12 and INV13). Also, the CBL7 clocked bit latches in the portions $\alpha ABS_1$, $\alpha ABS_2$, $\alpha ABS_3$, etc. are in another cascade connection to form a shift register for the SERIAL TEST FEED signal; and the CBL8 clocked bit latches in the portions $\beta ABS_1$, $\beta ABS_2$, $\beta ABS_3$, etc. are in yet another cascade connection to form a shift register for the SERIAL TEST FEED signal. Similarly, the CBL5 clocked bit latches in the portions $\beta ABS_1$, $\beta ABS_2$, $\beta ABS_3$, etc. are in cascade connection to form a shift register for the SERIAL TEST FEED signal; the CBL7 clocked bit latches in the portions $\beta ABS_1$, $\beta ABS_2$, $\beta ABS_3$, etc. are in another cascade connection to form a shift register for the SERIAL TEST FEED signal; and the CBL8 clocked bit latches in the portions $\beta ABS_1$, $\beta ABS_2$, $\beta ABS_3$, etc. are in yet another cascade connection to form a shift register for the SERIAL TEST FEED signal. Similarly, also, the CBL5 clocked bit latches in the portions $\gamma ABS_1$, $\gamma ABS_2$, $\gamma ABS_3$, etc. are in cascade connection to form a shift register for the SERIAL TEST FEED signal; the CBL7 clocked bit latches in the portions $\gamma ABS_1$, $\gamma ABS_2$, $\gamma ABS_3$, etc. are in another cascade connection to form a shift register for the SERIAL TEST FEED signal; and the CBL8 clocked bit latches in the portions $\gamma ABS_1$, $\gamma ABS_2$, $\gamma ABS_3$, etc. are in yet another cascade connection to form a shift register for the SERIAL TEST FEED signal.

The first switch means transmission gate and second switch means transmission gate in each of these anterior portions $\alpha ABS_k$, $\beta ABS_k$ and $\gamma ABS_k$ do not, during TMR operation, apply bits directly to the data bit input terminal of a corresponding tristate driver for DATA BIT OUT located in the posterior portion PBS of the $k^{th}$ bit slice, but rather apply bits as inputs to a voter circuit $V_k$, the output of which voter circuit $V_k$ is applied to the data bit input connection of that corresponding tristate driver to generate DATA BIT OUT signal.

The anterior portions $\alpha ABS_k$, $\beta ABS_k$ and $\gamma ABS_k$ of the $k^{th}$ bit slice have respective mini bond pad connections $\alpha$ DATA BIT IN, $\beta$ DATA BIT IN and $\gamma$ DATA BIT IN for receiving their respective input data bits. Each functions as the anterior portion $ABS_k$ has been described as functioning except for $\alpha ABS_k$ responding to clock signals applied thereto to move bits through its SIPO registers only when an $\alpha$ENABLE signal that is a ONE is supplied thereto, except for $\beta ABS_k$ responding to clock signals applied thereto to move bits through its SIPO registers only when a $\beta$ENABLE signal that is a ONE is supplied thereto, and except for $\gamma ABS^k$ responding to clock signals applied thereto to move bits through its SIPO registers only when a $\gamma$ENABLE signal that is a ONE is supplied thereto. The DATA BIT OUT mini bond pad can be conditioned to respond only to data bits supplied from $\alpha ABS_k$, $\beta ABS_k$ and $\gamma ABS_k$.

Voter circuitry $V_k$ is of a type that responds with a ONE when and only when a majority of its input bits are ONEs. A ONE appearing on a line TMR that threads the bit slices of the auxiliary buffer circuit chip is inverted to a ZERO by a logic inverter INV17, and this ZERO applied as one input of a NOR gate NOR3 conditions that gate to behave as a logic inverter that is used in place of the logic inverter INV14 of FIG. 15. This permits the posterior portion $PBS_k$ of the $k^{th}$ bit slice to perform as previously described, responding to the data bit generated by the voter circuit $V_k$. The ONE in the TMR line as applied to another NOR gate NOR4 conditions its response to be a ZERO, conditioning a tristate driver TS60 to exhibit relatively high source impedance to the DATA BIT OUT mini bond pad. A ZERO on the TMR line conditions NOR gate NOR 4 to behave as a logic inverter, responding to signals from the posterior portion $PBS_k$ of the bit slice to selectively condition tristate driver TS60 to apply response to $\beta$DATA BIT IN to the DATA BIT OUT mini bond pad from a relatively low source impedance. The ZERO on the TMR line is inverted to a ONE by the logic inverter INV17 to condition NOR gate NOR3 response to be ZERO irrespective of its input bit supplied from the posterior portion of $PSB_k$ of the bit slice, conditioning the tristate driver therein that drives the DATA BIT OUT mini bond pad to exhibit relatively high source impedance. The ZERO on the TMR line in effect removes the voter circuit $V_k$ from determining DATA BIT OUT signal, causing DATA BIT OUT signal to be determined solely by $\beta$DATA BIT IN.

The $k^{th}$ bit slice includes respective error determination circuitry $ED_k$ that together with the error determination circuitry of the other bit slices can determine whether a data word applied to an N-bit-wide $\alpha$ DATA IN input port, a data word applied to an N-bit-wide $\beta$ DATA IN input port or a data word applied to an N-bit-wide $\gamma$ DATA IN input port of the TMR auxiliary buffer circuitry chip differs from the other two data words. Exclusive-OR gates XOR1, XOR2 and XOR3 permit respective comparisons of the $k^{th}$ bit slice DATA BIT OUT to the data bits supplied from $\alpha ABS_k$, $\beta ABS_k$ and $\gamma ABS_k$ anterior portions of the $k^{th}$ bit slice. A comparison XOR2 and XOR3; a lack of comparison results in a ONE response. An OR gate OR5 receptive of XOR1 response is one of a chain of OR gates that determine if there is a departure of the bits processed by the $\alpha ABS_k$ anterior portions of the bit slices from the bits processed by the $\beta ABS_k$ and $\gamma ABS_k$ anterior portions of the bit slices. An OR gate OR6 receptive of XOR2 response is one of a chain of OR gates that determine if there is a departure of the bits processed by the $\beta ABS$ portions of the bit slices from the bits processed by the $\alpha ABS$ and $\gamma ABS$ portions. An OR gate OR7 receptive of XOR3 response is one of a chain of OR gates that determine if there is a departure of the bits processed by the $\gamma ABS$ portions of the bit slices from the bits processed by the $\alpha ABS$ and $\beta ABS$ portions.

Figure 18:
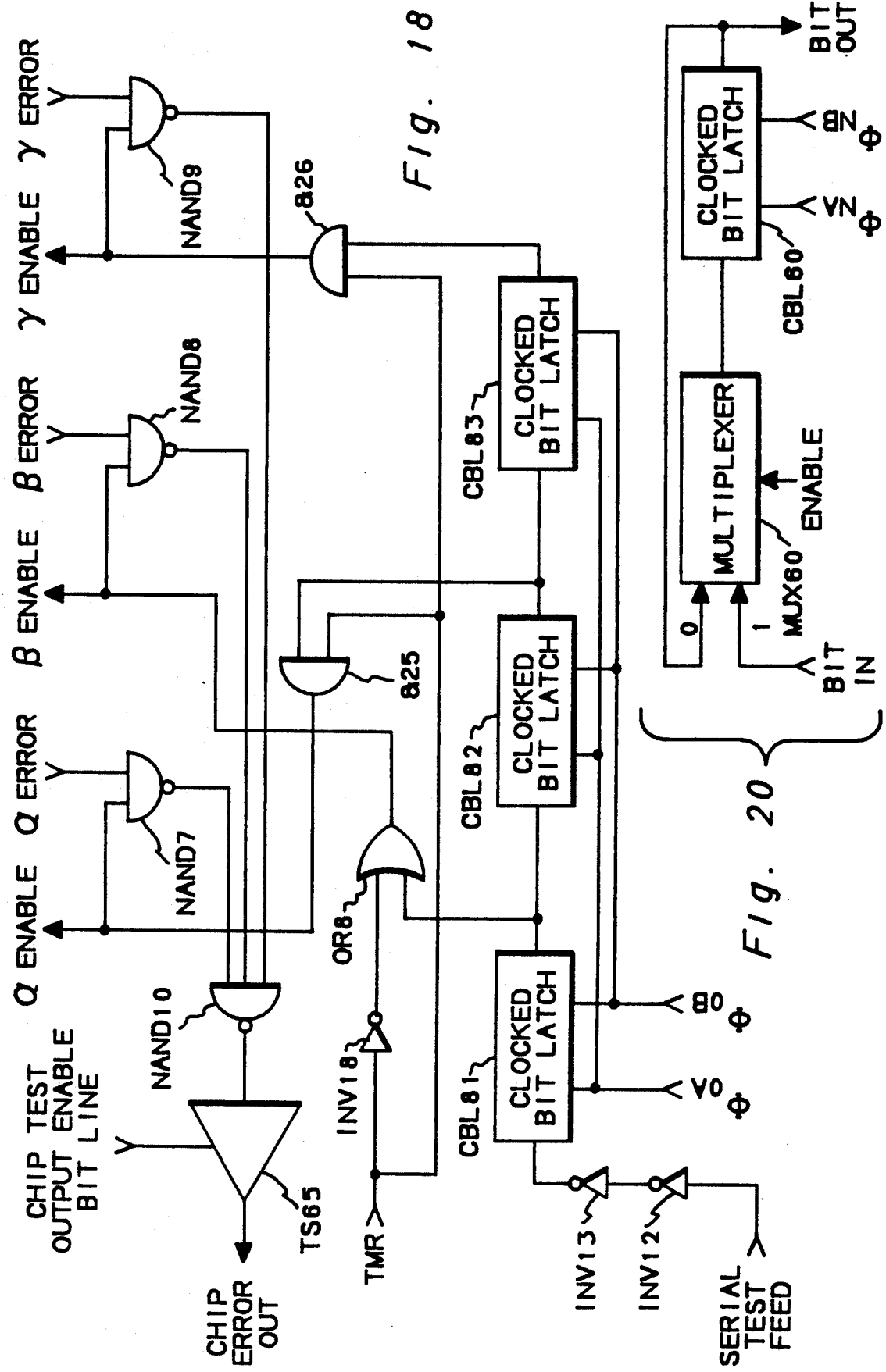
FIG. 18 is a schematic diagram showing the circuitry for selectively generating clocking signals for the three input portions of the FIG. 17 bit slice component.

FIG. 18 shows how $\alpha$ENABLE, $\beta$ENABLE and $\gamma$ENABLE signals are generated for use in the FIG. 17 bit slices. Clocked bit latches CBL81, CBL82 and CBL83 are in cascade connection within a serial-in/parallel-out register selectively clocked by non-overlapping, two-phase $\Phi_{0A}$ and $\Phi_{0B}$ clock signal. Clocked bit latches CBL81, CBL82 and CBL83 store respective token bits respectively indicating whether the $\beta$ENABLE bit, the $\alpha$ENABLE bit and the $\gamma$ENABLE bit is to be generated.

If the TMR line has a ONE thereon, a logic inverter INV18 responds to apply a ZERO to one input of an OR gate OR8, the other input of which has the contents of clocked bit latch CBL81 applied thereto. The contents of latch CBL81 determine whether or not an $\beta$ENABLE bit that is a ONE is supplied. The ONE on the TMR line is applied as inputs to AND gates &25 and &26, enabling them to transmit the contents of clocked bit latches CBL82 and CBL83 respectively to the $\alpha$ENABLE line and to the $\gamma$ENABLE line.

If the TMR line has a ZERO thereon, logic inverter INV 18 responds to apply a ONE to one input of OR gate OR8 generating a ONE for $\beta$ENABLE signal. The ZERO on the TMR line as applied to the inputs of AND gates &25 and &26 causes them to apply ZEROs to the $\alpha$ENABLE and $\gamma$ENABLE lines.

The $\alpha$ENABLE, $\beta$ENABLE and $\gamma$ENABLE bits are also used to select which of the $\alpha$ERROR, $\beta$ERROR and $\gamma$ERROR signals will be responded to by a CHIP ERROR OUT signal applied to CHIP ERROR OUT mini bond pad by a tristate driver TS65. The CHIP ERROR OUT mini bond pads of all auxiliary buffer chips in an electronic system are connected to a shared CHIP ERROR bus. The presence of a CHIP TEST OUTPUT ENABLE token bit in the second clocked bit latch CBL2 of an auxiliary buffer chip enables its tristate driver TS65 to apply its CHIP ERROR OUT signal at relatively low source impedance to that shared CHIP ERROR bus. A NAND gate NAND7 has an output response that is a ONE unless its αENABLE input signal is a ONE, in which case its output response is the complement of its αERROR input signal received from the αERROR OUT connection of the last bit slice in the OR gate chain for αERROR OUT signals. A NAND gate NAND8 has an output response that is a ONE unless its βENABLE input signal is a ONE, in which case its output response is the complement of its βERROR input signal received from the βERROR OUT signals. A NAND gate NAND9 has an output response that is a ONE unless its γENABLE input signal is a ONE, in which case its output response is the complement of its γERROR input signal received from the γERROR OUT connection of the last bit slice in the OR gate chain for the γERROR OUT signals. If only one of the αENABLE, βENABLE and γENABLE signals is a ONE and the other two are ZEROs, NAND gate NAND10 receives two ONEs and the logic complement of the one of the αERROR, βERROR and γERROR signals selected to be CHIP ERROR OUT signal. NAND10 responds to supply the selected one of the αERROR, βERROR and γERROR signals CHIP ERROR OUT signal to the data input connection of tristate driver TS65.

Alternatively, the auxiliary buffer chip of the type shown in FIGS. 17 and 18 can be programmed such that a ONE appears at its CHIP ERROR OUT mini bond pad no matter which one of the αERROR, βERROR and γERROR signals is a ONE indicative of one of the anterior portions αABS$_k$, βABS$_k$ and γABS$_k$ of a k$^{th}$ bit slice responding differently than the other two. To do this, respective ONEs are shifted into each of the clocked bit latches CBL81, CBL82 and CBL83 within the serial-in/parallel-out register selectively clocked by non-overlapping, two-phase $\Phi_{0A}$ and $\Phi_{0B}$ clock signal. If the TMR line has a ONE thereon, each of the αENABLE, βENABLE and γENABLE signals is a ONE, NAND gate NAND10 receives the logic complements of each of the αERROR, βERROR and γERROR signals. Since at most only one of these αERROR, βERROR and γERROR signals is a ONE, at least two of their logic complements will be ONEs. Accordingly, NAND gate NAND10 output will be a ZERO only when one of the αERROR, βERROR and γERROR signals is a ONE, causing its logic complement to be a ZERO.

In accordance with De Morgan's Rules NAND gates NAND7, NAND8, NAND9 and NAND10 together provide means for ANDing the αERROR and αENABLE signals to generate a first AND response; means for ANDing the βERROR and βENABLE signals to generate a second AND response; means for ANDing the γERROR and γENABLE signals to generate a third AND response; and means for ORing the first, second and third AND responses to generate a fault indication for the auxiliary buffer chip at its CHIP ERROR OUT mini bond pad.

To program an auxiliary buffer chip of the type shown in FIGS. 17 and 18 for normal operation in which its α, β and γ inputs are each applied to its voter circuits V$_k$, for all values of k from 1 to N, the following procedure is performed. After the chip has been selected by applying a 001 command and a sufficient number of CLOCK cycles to shift the CHIP SELECT token bit to its clocked bit latch CBL1, a 000 command is applied to the auxiliary buffer chip for three CLOCK cycles, while a 111 sequence is supplied to the SERIAL TEST FEED bond pads of the auxiliary buffer chips. This locates respective TMR SELECT BITs in the clocked bit latches CBL83, CBL82 and CBL81 (refer to FIG. 18), respectively causing the γENABLE bit, the βENABLE bit and the αENABLE bit to be generated. A 101 command and a sufficient number of CLOCK cycles is applied to the auxiliary buffer chip while the SERIAL TEST FEED bond pad receives a string of alternating ZEROs and ONEs. Since the γENABLE bit, the βENABLE bit and the αENABLE bit are each generated simultaneously, a respective replica of that string of alternating ZEROs and ONEs is shifted into each of the SIPO registers for storing control bits for the first and second switch means in the γ, β and α anterior bit slice portions of the auxiliary buffer chip, to condition the first switch means therein to conduct and to condition the second switch means therein not to conduct. This applies the γ DATA IN bits, the β DATA IN bits and the α DATA IN bits to the voter circuits in the posterior bit slice portions of the auxiliary buffer chip.

When the generation of αENABLE, βENABLE and γENABLE signals is done as shown in FIG. 18, if TMR line has a ONE thereon, each of the clocked bit latches in the αABS portions of the bit slices of a TMR auxiliary buffer chip is arranged to be rewritten only if αENABLE line has a ONE thereon by virtue of a token bit stored in clocked bit latch CBL82; each of the clocked bit latches in the βABS portions of these bit slices is arranged to be rewritten only if a βENABLE line has a ONE thereon by virtue of a token bit stored in clocked bit latch CBL81; and each of the clocked bit latches in the γABS portions of these bit slices is arranged to be rewritten only if γENABLE line has a ONE thereon by virtue of a token bit stored in clocked bit latch CBL83. Alternative arrangements for preventing rewriting of clocked bit latches by withholding clocking signal from them are also possible, of course. The capability of independently accessing the clocked bit latches in the αABS portions of the bit slices of a TMR auxiliary buffer chip, the clocked bit latches in the βABS portions of these bit slices, and the clocked bit latches in the γABS portions of these bit slices is important in using auxiliary buffer chips to implement fault-tolerant electronic systems, as will be described further on. The capability of independently accessing the clocked bit latches in the αABS portions, the βABS portions and the γABS portions of the bit slices also permits their test vector registers to be independently programmed, if one so desires, rather than concurrently programmed as described in the previous paragraph.

Figure 19:
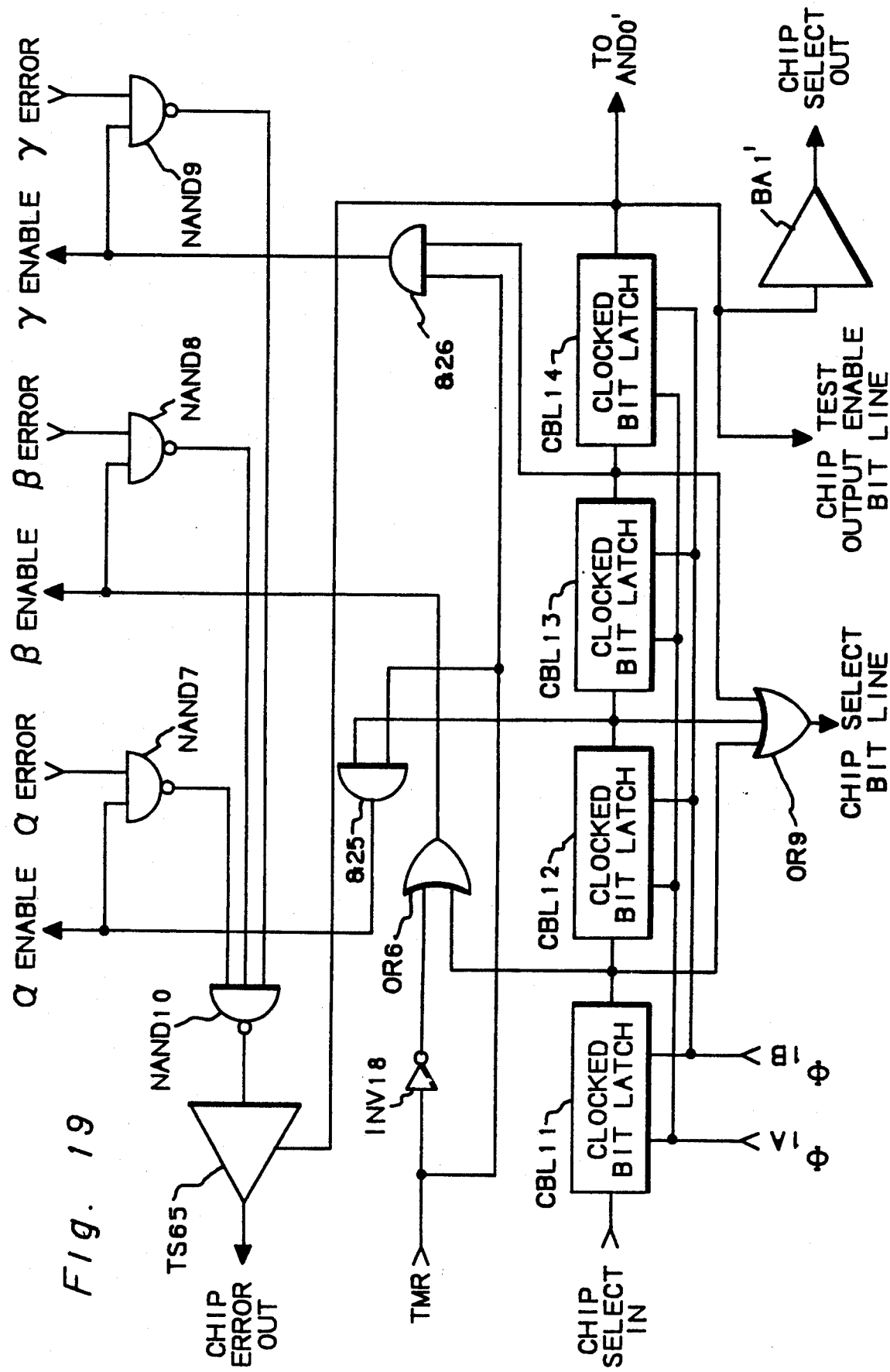
FIG. 19 is a schematic diagram showing alternative circuitry for selectively generating clocking signals for the three input portions of the FIG. 17 bit slice component.

FIG. 19 shows an alternative way to generate αENABLE, βENABLE and γENABLE signals for use in the FIG. 17 bit slices. The clocked bit latch CBL1 of FIG. 13 is replaced by three clocked bit latches CBL11, CBL12, and CBL13, clocked in parallel with $\phi_A$ and $\phi_{1B}$ clocking signals and connected in cascade for data. The CHIP SELECT BIT LINE is supplied a CHIP SELECT BIT at selected times from an OR gate OR9, responsive to there being a ONE stored in at least one of the clocked bit latches CBL11, CBL12, and CBL13, which supply their contents as input signals to OR gate OR9. A ONE stored in clocked bit latch CBL11 is used in the generation of a βENABLE signal in the same way that in FIG. 18 a ONE stored in clocked bit latch CBL81 is used in the generation of a βENABLE signal. A ONE stored in clocked bit latch CBL12 is used in the generation of an αENABLE signal in the same way that in FIG. 18 a ONE stored in clocked bit latch CBL82 is used in the generation of an αENABLE signal. A ONE stored in clocked bit latch CBL13 is used in the generation of a γENABLE signal in the same way that in FIG. 18 a ONE stored in clocked bit latch CBL83 is used in the generation of a γENABLE signal.

The FIG. 19 way to generate αENABLE, βENABLE and γENABLE signals is advantageous over the FIG. 18 way in that the $\Phi_{0A}$ and $\Phi_{0B}$ clocking signals are not appropriated for implementing triple modular redundancy, but rather further use is made of the $\Phi_{1A}$ and $\Phi_{1B}$ clocking signals. This permits the use of a third SIPO register that stores a plurality of test vectors and circulates them. At the same time separate fourth and fifth SIPO registers can be used for storing control bits for the first and second switch means respectively that are associated with the α DATA IN port; separate sixth and seventh SIPO registers can be used for storing control bits for the first and second switch means respectively that are associated with the β DATA IN port; and separate eighth and ninth SIPO registers can be used for storing control bits for the first and second switch means respectively that are associated with the γ DATA IN port. One disadvantage of the FIG. 19 way to generate αENABLE, βENABLE and γENABLE signals is that is not as easy to select among these signals, since the selection procedures are not localized in the one auxiliary buffer chip. Another disadvantage of the FIG. 19 way to generate αENABLE, βENABLE and γENABLE signals is that the chip selection procedures differ somewhat from those for chips with built-in test circuitry as described in "TESTING OF INTEGRATED CIRCUITS INCLUDING TEST CIRCUITRY AND USING TOKEN PASSING TO SELECT INPUT PORTS".

It should be noted that the order in which clocked bit latches CBL11, CBL12, CBL13 and CBL14 are connected in cascade is arbitrarily chosen, though once an order is chosen it is well to adhere to it thereafter as a standard. Note also that there are alternative ways to develop clocking signals for the SIPO registers that are the logical equivalents to those particularly shown.

FIG. 20 illustrates one way to keep a clocked bit latch from being written except when an enable signal is supplied. Clocked bit latch CBL60 is preceded by a multiplexer MUX60 that selects latch CBL60 output bit as its input bit unless an ENABLE signal is ONE to select a BIT IN input bit as input bit to clocked bit latch CBL60.

Figure 21:
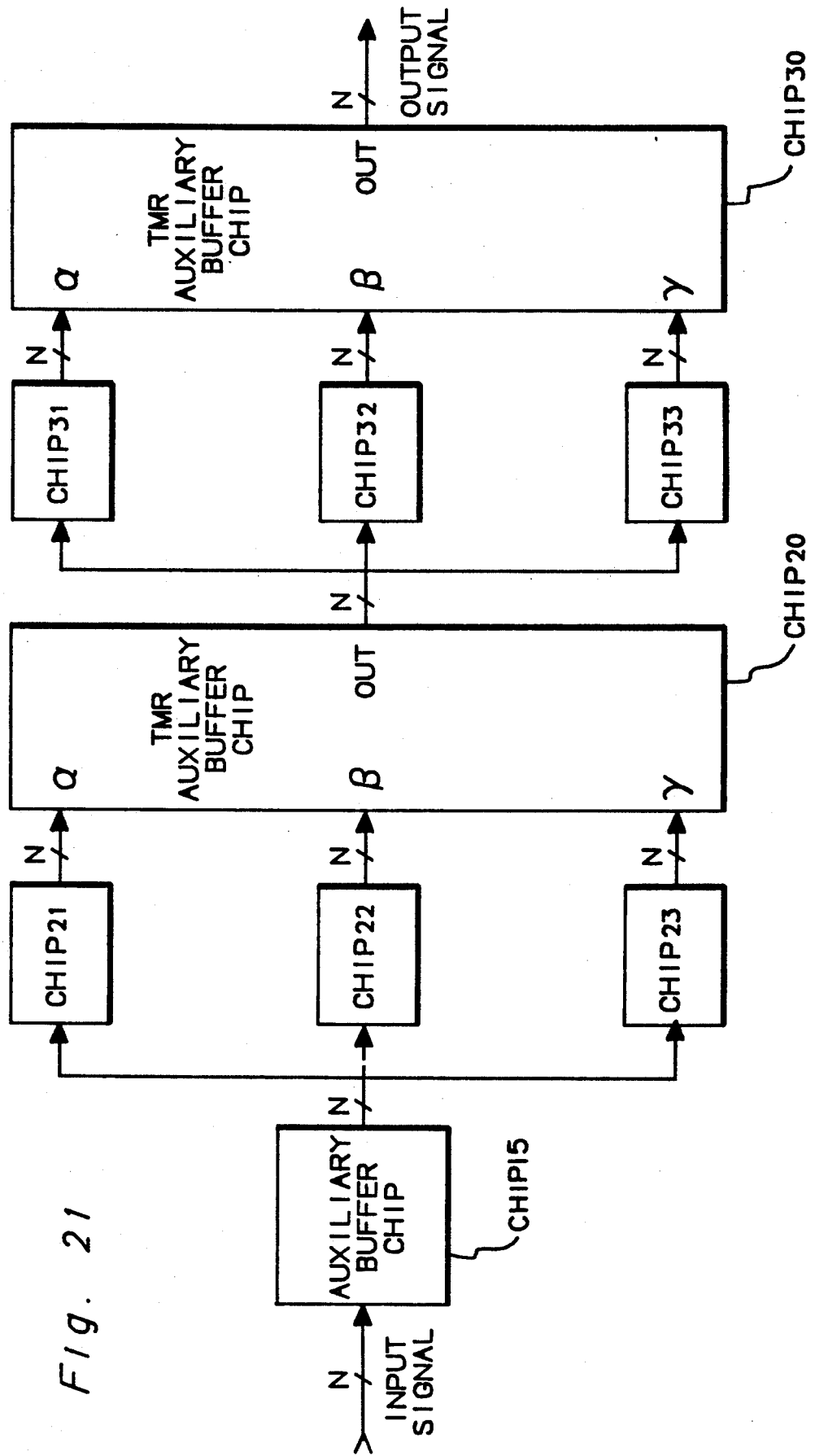
FIG. 21 is a schematic diagram of a system having triple modular redundancy of circuitry and using auxiliary buffer chips embodying the invention.

FIG. 21 shows the normal data path through an electronics system using triple modular redundancy and having a pipeline architecture. An input signal is applied via an auxiliary buffer chip CHIP15, to each of that are similar to each other. If CHIP 21, CHIP 22 and CHIP 23 have built-in test circuitry of the type described in patent application Ser. No. 513,636 input signal may be applied directly to those chips rather than through auxiliary buffer chip CHP15. A TMR auxiliary buffer chip CHIP20 generates a majority-logic response to the data supplied to its α, β and γ input ports from the output ports of CHIP31, CHIP32 and CHIP33, respectively, which majority-logic response is the output signal of the system. Tree architectures with a respective TMR auxiliary buffer chip before each branching of the data path are also possible. Each of the chips including auxiliary buffer chips CHIP15, CHIP20 and CHIP30 that have built-in test circuitry have connections to zero-volt operating voltage bus, plus-five-volt operating voltage bus, TEST CLOCK bus, SERIAL TEST FEED bus, TEST OUT bus, TEST ENABLE bus, and the three instruction busses INSTRUCT 0, INSTRUCT 1 and INSTRUCT 2 although these shared busses and the connections to them are omitted from FIG. 21 to avoid its appearing cluttered. If all the chips in the electronics system have built-in test circuitry, full HDI testing of the system is possible as well as chip-by-chip functional testing.

Figure 22:
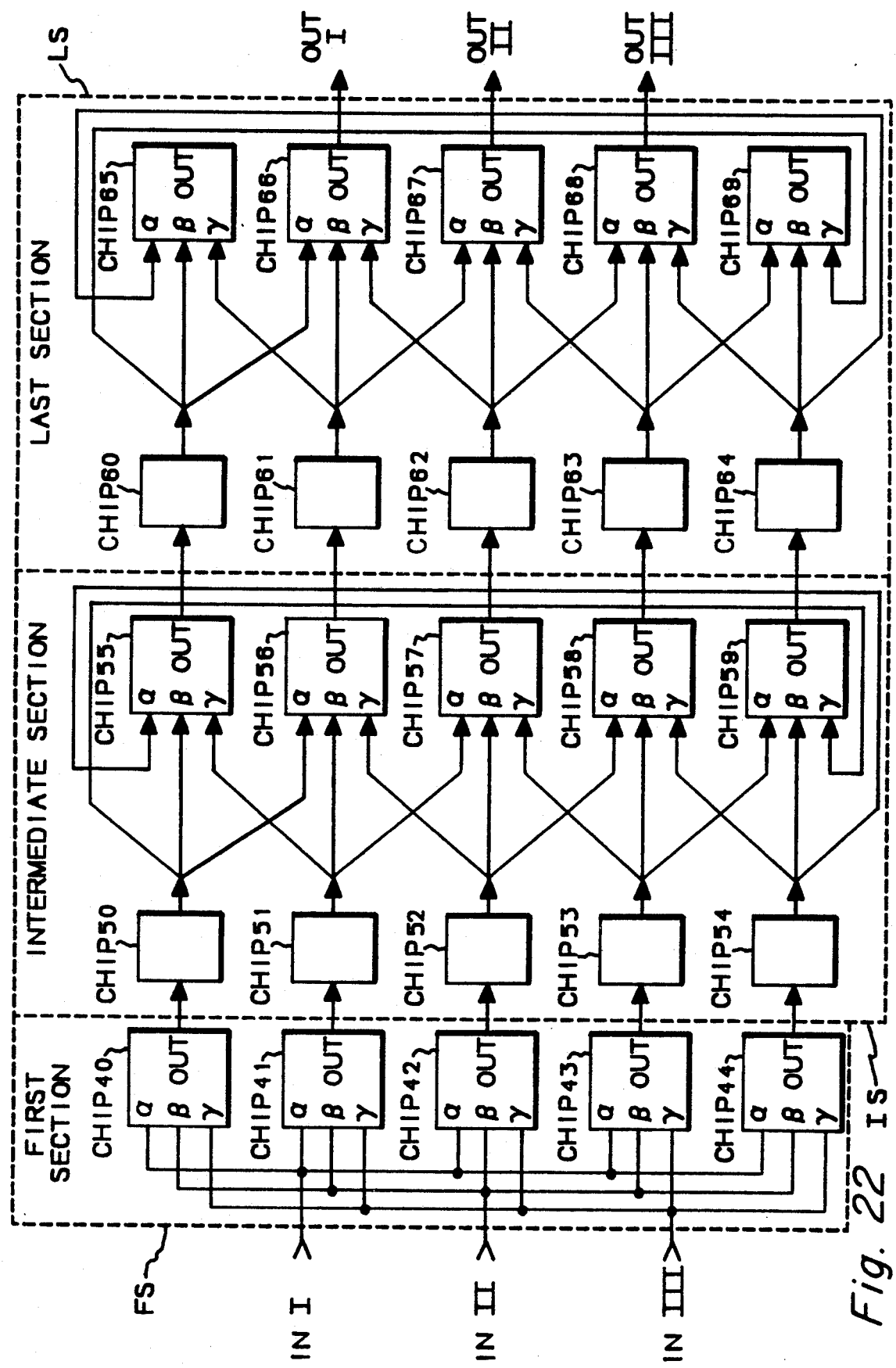
FIG. 22 is a schematic diagram of a fault-tolerant electronics system using auxiliary buffer chips embodying the invention.

FIG. 22 shows a fault-tolerant electronic system constructed using auxiliary buffer chips CHIP40, CHIP41, CHIP42, CHIP43, CHIP44, CHIP55, CHIP56, CHIP57, CHIP58, CHIP59, CHIP65, CHIP66, CHIP67, CHIP68, and CHIP69 of the type described in connection with FIG. 13, with FIGS. 14 and 15 modified per FIG. 16 and with FIGS. 17 and 18. The fault-tolerant electronic system is to provide a three-channel pipeline for input signals IN I, IN II and IN III and comprises a first section FS, at least one intermediate section such as section IS, and a last section LS. Extended pipelines with more intermediate sections are also possible, as well as tree structures with branching after a first section or intermediate section(s).

Besides its auxiliary buffer chips, each intermediate section includes therein five chips similar to each other, any two of which the system will tolerate being faulty. Intermediate section IS has, for example, the five similar chips CHIP50, CHIP51, CHIP52, CHIP53, and CHIP54 therein. Besides its auxiliary buffer chips, each last section includes therein five chips similar to each other, any two of which the system will tolerate being faulty. Last section LS has, for example, the five similar chips CHIP60, CHIP61, CHIP62, CHIP63, and CHIP64 therein. One may note that in the last section LS the output connections of CHIP65 and CHIP69 are not connected to any subsequent circuitry. CHIP65 and CHIP69 are included in FIG. 22 primarily for their β-error detectors; and they can be dispensed with, as will be described later on.

The basic scheme used to tolerate faults in each group of five chips similar to each other is to select three good chips in the group through which to route the three channels of the pipeline. This selection is made by a small computer hereinafter called a "routing computer", which is not shown in FIG. 22 and is typically a microprocessor included in the fault-tolerant electronics system. Whether an auxiliary buffer chip is faulty or the succeeding chip it drives is faulty is of no consequence in selecting the channel routing, it is observed, and such a pair of elements can be considered as a combination inasfar as the detection of faults is concerned. It is assumed that detecting whether there is any fault in any such combination is done using the fault detection circuitry in the succeeding auxiliary buffer chip(s) to compare the test responses of that combination with the test responses of the other, similar combinations.

Unless a fault is encountered, presume the channel for responses to IN I input signal preferably to be through CHIP41, CHIP51, CHIP56, CHIP61 and CHIP66 row; the channel for responses to IN II input signal preferably to be through CHIP42, CHIP52, CHIP57, CHIP62 and CHIP67 row; and the channel for responses to IN III input signal preferably to be through CHIP43, CHIP53, CHIP58, CHIP63 and CHIP68 row. When a fault is encountered in the normal routing for a channel, the routing of that channel is shifted upward or downward by a row together with the routing of any channel that must be displaced to accommodate the new routing of the channel in which a fault was encountered.

Initially, auxiliary buffer chips CHIP40 and CHIP41 are programmed to select their $\alpha$ inputs to their respective outputs; auxiliary buffer chips CHIP43 and CHIP44 are programmed to select their $\gamma$ inputs to their respective outputs; and all the other auxiliary buffer chips in FIG. 22 are programmed to select their $\beta$ inputs to their respective outputs. In the description of such programming that follows, the presumption continues that the auxiliary buffer chips are all of the type described in connection with FIG. 13, with FIGS. 14 and 15 modified per FIG. 16 and with FIGS. 17 and 18.

The input signals applied to the $\beta$ DATA input port of an auxiliary buffer chip are selected to be reproduced at its output port, in part by conditioning the second switch means (transmission gates TG22) in all the $\beta ABS_k$ anterior portions of the bit slices to be non-conductive and by conditioning the first switch means (transmission gates TG21) in all the $\beta ABS_k$ anterior portions of the bit slices to be conductive, so the $\beta$ DATA BIT IN signals are applied to the voters $V_k$ in the various bit slices. Then, to cause the voters $V_k$ in the various bit slices to have responses corresponding to their respective $\beta$ DATA BIT IN signals, in each $k^{th}$ bit slice the voter $V_k$ is caused to have a ZERO applied thereto from one of the $\alpha ABS_k$ and $\gamma ABS_k$ anterior portions and to have a ONE applied thereto from the other of the $\alpha ABS_k$ and $\gamma ABS_k$ anterior portions. To implement this, the first switch means (transmission gates TG21) in all the $\alpha ABS_k$ and $\gamma ABS_k$ anterior portions of the bit slices are conditioned to be non-conductive, and the second switch means (transmission gates TG22) in all the $\alpha ABS_k$ and $\gamma ABS_k$ anterior portions of the bit slices are conditioned to be conductive to apply the $\alpha ABS_k$ test vector register contents and the $\gamma ABS_k$ test vector register contents to the voters $V_k$. The input signals applied to the $\alpha$ DATA input port or to the $\gamma$ DATA input port of an auxiliary buffer chip can be selected to be reproduced at its output port by an analogous procedure.

To program an auxiliary buffer chip to select its $\beta$ input to its output, by way of more specific example the following procedure may be performed, after the chip has been selected by applying a 001 command and a sufficient number of TEST CLOCK cycles to all the auxiliary buffer chips in FIG. 22, thereby to shift the CHIP SELECT token bit to the auxiliary buffer chip being programmed. A 000 command is applied to the auxiliary buffer chips for three TEST CLOCK cycles, while a 001 sequence is supplied to the SERIAL TEST FEED bond pads of the auxiliary buffer chips. In the chip being programmed this locates the TMR SELECT BIT in the clocked bit latch CBL81 (refer to FIG. 18), causing the $\beta$ENABLE bit to be generated. A 101 command and a sufficient number of TEST CLOCK cycles are applied to all the auxiliary buffer chips in FIG. 22 while their SERIAL TEST FEED bond pads receive a string of alternating ZEROs and ONEs to shift that string of alternating ZEROs and ONEs into the SIPO register storing control bits for the first and second switch means in the $\beta$ anterior bit slice portions of the auxiliary buffer chip being programmed, to condition the first switch means therein to conduct and to condition the second switch means therein not to conduct. This applies the $\beta$ DATA IN bits to the voter circuits in the posterior bit slice portions of the auxiliary buffer chip being programmed. Subsequently, a 000 command is applied to the auxiliary buffer chips for one TEST CLOCK cycle while a ZERO is supplied as SERIAL TEST FEED. In the chip being programmed this shifts the TMR SELECT BIT to the clocked bit latch CBL82 (refer to FIG. 18), thereby to cause the $\alpha$ENABLE bit to be generated. A 011 command and a sufficient number of TEST CLOCK cycles are applied to all the auxiliary buffer chips in FIG. 22, while their SERIAL TEST FEED bond pads receive a string of ZEROs, to shift that string of ZEROs into the SIPO register storing an input test vector for the $\alpha$ anterior bit slice portions of the auxiliary buffer chip being programmed. A 101 command and a sufficient number of TEST CLOCK cycles are applied to all the auxiliary buffer chips in FIG. 22 while their SERIAL TEST FEED bond pads receive a string of alternating ONEs and ZEROs, to shift that string of alternating ONEs and ZEROs into the SIPO register storing control bits for the first and second switch means in the $\alpha$ anterior bit slice portions of the auxiliary buffer chip being programmed, conditioning those $\alpha$ anterior bit slice portions to select the string of ZEROs stored therein as an input test vector to the voter circuits of the posterior bit slice portions in cascade thereafter. Subsequently, a 000 command is applied to the auxiliary buffer chips for one TEST CLOCK cycle while a ZERO is supplied as SERIAL TEST FEED. In the chip being programmed this shifts the TMR SELECT BIT to the clocked bit latch CBL83 (refer to FIG. 18), thereby to cause the $\gamma$ENABLE bit to be generated. A 011 command and a sufficient number of TEST CLOCK cycles are applied to all the auxiliary buffer chips in FIG. 22, while their SERIAL TEST FEED bond pads receive a string of ONEs, to shift that string of ONEs into the SIPO register storing an input test vector for the $\gamma$ anterior bit slice portions of the auxiliary buffer chip being programmed. A 101 command and a sufficient number of TEST CLOCK cycles are applied to all the auxiliary buffer chips in FIG. 22 while their SERIAL TEST FEED bond pads receive a string of alternating ONEs and ZEROs to shift that string of alternating ONEs and ZEROs into the SIPO register storing control bits for the first and second switch means in the $\gamma$ anterior bit slice portions of the auxiliary buffer chip being programmed, conditioning those $\gamma$ anterior bit slice portions to select the string of ONEs stored therein as an input test vector to the voter circuits of the posterior bit slice portions in cascade thereafter. In the voter circuits the all-ZEROs input test vector for the $\alpha$ anterior bit slice portions and the all-ONEs input test vector for the $\gamma$ anterior bit slice portions negate each other in the voting, so the responses of the voter circuits depend solely on the $\beta$ DATA IN bits.

To program an auxiliary buffer chip to select its $\alpha$ input to its output, by way of more specific example the following procedure may be performed, after the chip has been selected by applying a 001 command and a sufficient number of TEST CLOCK cycles to all the auxiliary buffer chips in FIG. 22, thereby to shift the CHIP SELECT token bit to the auxiliary buffer chip being programmed. A 000 command is applied to the auxiliary buffer chips for three TEST CLOCK cycles, while a 001 sequence is supplied to the SERIAL TEST FEED bond pads of the auxiliary buffer chips. In the chip being programmed this locates the TMR SELECT BIT in the clocked bit latch CBL81 (refer to FIG. 18), causing the βENABLE bit to be generated. A 011 command and a sufficient number of TEST CLOCK cycles are applied to all the auxiliary buffer chips in FIG. 22 while their SERIAL TEST FEED bond pads receive a string of ONEs to shift that string of ONEs into the SIPO register storing an input test vector for the β anterior bit slice portions of the auxiliary buffer chip being programmed. A 101 command and a sufficient number of TEST CLOCK cycles are applied to all the auxiliary buffer chips in FIG. 22 while their SERIAL TEST FEED bond pads receive a string of alternating ONEs and ZEROs to shift that string of alternating ONEs and ZEROs into the SIPO register storing control bits for the first and second switch means in the β anterior bit slice portions of the auxiliary buffer chip being programmed, conditioning those β anterior bit slice portions to select the string of ONEs stored therein as an input test vector to the voter circuits of the posterior bit slice portions in cascade thereafter. Subsequently, a 000 command is applied to the auxiliary buffer chips for one TEST CLOCK cycle while a ZERO is supplied as SERIAL TEST FEED. In the chip being programmed this shifts the TMR SELECT BIT to the clocked bit latch CBL82 (refer to FIG. 18), thereby to cause the αENABLE bit to be generated. A 101 command and a sufficient number of TEST CLOCK cycles are applied to all the auxiliary buffer chips in FIG. 22 while their SERIAL TEST FEED bond pads receive a string of alternating ZEROs and ONEs to shift that string of alternating ZEROs and ONEs into the SIPO register storing control bits for the first and second switch means in the α anterior bit slice portions of the auxiliary buffer chip being programmed, to condition the first switch means therein to conduct and to condition the second switch means therein not to conduct. This applies the α DATA IN bits to the voter circuits in the posterior bit slice portions of the auxiliary buffer chip being programmed. Subsequently, a 000 command is applied to the auxiliary buffer chips for one TEST CLOCK cycle while a ZERO is supplied as SERIAL TEST FEED. In the chip being programmed this shifts the TMR SELECT BIT to the clocked bit latch CBL83 (refer to FIG. 18), thereby to cause the γENABLE bit to be generated. A 011 command and a sufficient number of TEST CLOCK cycles are applied to all the auxiliary buffer chips in FIG. 22 while their SERIAL TEST FEED bond pads receive a string of ZEROs to shift that string of ZEROs into the SIPO register storing an input test vector for the γ anterior bit slice portions of the auxiliary buffer chip being programmed. A 101 command and a sufficient number of TEST CLOCK cycles are applied to all the auxiliary buffer chips in FIG. 22 while their SERIAL TEST FEED bond pads receive a string of alternating ONEs and ZEROs to shift that string of alternating ONEs and ZEROs into the SIPO register storing control bits for the first and second switch means in the γ anterior bit slice portions of the auxiliary buffer chip being programmed, conditioning those γ anterior bit slice portions to select the string of ZEROs stored therein as an input test vector to the voter circuits of the posterior bit slice portions in cascade thereafter. In the voter circuits the all-ONEs input test vector for the β anterior bit slice portions and the all-ZEROs input test vector for the γ anterior bit slice portions negate each other in the voting, so the responses of the voter circuits depend solely on the α DATA IN bits.

To program an auxiliary buffer chip to select its γ input to its output, by way of more specific example the following procedure may be performed, after the chip has been selected by applying a 001 command and a sufficient number of TEST CLOCK cycles to all the auxiliary buffer chips in FIG. 22, thereby to shift the CHIP SELECT token bit to the auxiliary buffer chip being programmed. A 000 command is applied to the auxiliary buffer chips for three TEST CLOCK cycles, while a 001 sequence is supplied to the SERIAL TEST FEED bond pads of the auxiliary buffer chips. In the chip being programmed this locates the TMR SELECT BIT in the clocked bit latch CBL81 (refer to FIG. 18), causing the βENABLE bit to be generated. A 011 command and a sufficient number of TEST CLOCK cycles are applied to all the auxiliary buffer chips in FIG. 22 while their SERIAL TEST FEED bond pads receive a string of ZEROs to shift that string of ZEROs into the SIPO register storing an input test vector for the β anterior bit slice portions of the auxiliary buffer chip being programmed. A 101 command and a sufficient number of TEST CLOCK cycles are applied to all the auxiliary buffer chips in FIG. 22 while their SERIAL TEST FEED bond pads receive a string of alternating ONEs and ZEROs to shift that string of alternating ONEs and ZEROs into the SIPO register storing control bits for the first and second switch means in the β anterior bit slice portions of the auxiliary buffer chip being programmed, conditioning those β anterior bit slice portions to select the string of ZEROs stored therein as an input test vector to the voter circuits of the posterior bit slice portions in cascade thereafter. Subsequently, a 000 command is applied to the auxiliary buffer chips for one TEST CLOCK cycle while a ZERO is supplied as SERIAL TEST FEED. In the chip being programmed this shifts the TMR SELECT BIT to the clocked bit latch CBL82 (refer to FIG. 18), thereby to cause the αENABLE bit to be generated. A 011 command and a sufficient number of TEST CLOCK cycles are applied to all the auxiliary buffer chips in FIG. 22 while their SERIAL TEST FEED bond pads receive a string of ONEs to shift that string of ONEs into the SIPO register storing an input test vector for the α anterior bit slice portions of the auxiliary buffer chip being programmed. A 101 command and a sufficient number of TEST CLOCK cycles are applied to all the auxiliary buffer chips in FIG. 22 while their SERIAL TEST FEED bond pads receive a string of alternating ONEs and ZEROs to shift that string of alternating ONEs and ZEROs into the SIPO register storing control bits for the first and second switch means in the α anterior bit slice portions of the auxiliary buffer chip being programmed, conditioning those α anterior bit slice portions to select the string of ONEs stored therein as an input test vector to the voter circuits of the posterior bit slice portions in cascade thereafter. Subsequently, a 000 command is applied to the auxiliary buffer chips for one TEST CLOCK cycle while a ZERO is supplied as SERIAL TEST FEED. In the chip being programmed this shifts the TMR SELECT BIT to the clocked bit latch CBL83 (refer to FIG. 18), thereby to cause the γENABLE bit to be generated. A 101 command and a sufficient number of TEST CLOCK cycles are applied to all the auxiliary buffer chips in FIG. 22 while their SERIAL TEST FEED bond pads receive a string of alternating ZEROs and ONEs to shift that string of alternating ZEROs and ONEs into the SIPO register storing control bits for the first and second switch means in the γ anterior bit slice portions of the auxiliary buffer chip being programmed, to condition the first switch means therein to conduct and to condition the second switch means therein not to conduct. This applies the γ DATA IN bits to the voter circuits in the posterior bit slice portions of the auxiliary buffer chip being programmed. In the voter circuits the all-ONEs input test vector for the α anterior bit slice portions and the all-ZEROs input test vector for the β anterior bit slice portions negate each other in the voting, so the responses of the voter circuits depend solely on the γ DATA IN bits.

It is noted that a plurality of auxiliary buffer circuits can be programmed in parallel so the responses of the voter circuits depend solely on the β DATA IN bits, or so the responses of the voter circuits depend solely on the α DATA IN bits, or so the responses of the voter circuits depend solely on the γ DATA IN bits. This is particularly useful when establishing the initial routes for signals through the FIG. 22 fault-tolerant electronics system Such parallel programming is accomplished by initially applying a 001 command and a sufficient number of TEST CLOCK cycles to all the auxiliary buffer chips in FIG. 22, while supplying a pattern of CHIP SELECT token bits to the CHIP SELECT IN connection of the initial auxiliary buffer chip in the chip selector chain, thereby to shift a respective CHIP SELECT token bit to each auxiliary buffer chip being programmed.

The routing computer starts its routing procedure with the last section LS of the fault-tolerant electronics system; and as the routing through each section of the system is determined by the routing computer, the routing computer next determines the routing to be taken through the next earlier section of the system. By regressing through the system to choose routing, the routing computer always has available to it knowledge as to which output connections of each next earlier section are going to be used to conduct the responses to the IN I, IN II, and IN III input signals. This identifies the auxiliary buffer chips at the output end of this next earlier section, the error detectors of which provide information for selecting the routes through three of the five similar chips at the input end of this next earlier section.

More particularly, for example, the routing computer may select the routing through each section responsive to a respective sixteen-bit routing command. A mode bit of this routing command is furnished responsive to a counter in the routing computer and indicates whether the section of the system currently under consideration by the routing computer is or is not an initial section. Five bit pairs in the routing command correspond to respective ones of the output connections from the section being considered. The bit pair corresponding to the output connection conducting response to IN I input signal is made to have a 01 value; the bit pair corresponding to the output connection conducting response to IN II input signal is made to have a 10 value; the bit pair corresponding to the output connection conducting response to IN III input signal is made to have a 11 value; and the bit pairs corresponding to the other two output connections are each made to have a 00 value. The remaining five bits of the routing command are supplied from the β-error detectors of respective ones of the auxiliary buffer chips of the section currently being considered by the computer. Assume the bits are ZERO except where a respective auxiliary buffer chip detects a β-error, in each which case the corresponding bit is a ONE. If more than two of these five remaining bits are ONEs the routing computer determines that the system errors exceed the capability of the system to circumvent faults. The routing command format of a mode bit, followed by five bit pairs indicating the status of the output connections of the section currently being considered, followed by a remaining five bits indicative of whether there are faults in the input connections of the section currently being considered, will be assumed to be followed throughout the following description.

The routing computer responds to the routing command for each successively considered section of the system to select fault-free routings through that section for the three channels. Where there must be rerouting in order to find fault-free routes for each of the three channels, the routing computer will generate the appropriate sequences of instructions and accompanying TEST CLOCK signal cycles for the auxiliary buffer chips. The routing computer, after determining the routes through any section except a first section, generates five bit pairs indicative of the positioning of the 00, 00, 01, 10 and 11 channel markers with respect to the five input connections of that section and thus with respect to the five output connections of the next preceding section. These five bit pairs become part of the routing command for that next preceding section.

Suppose, for example, there is no fault in the chips CHIP66, CHIP67 and CHIP68 of the last section LS nor in the chips CHIP56, CHIP57 and CHIP58 of the immediately preceding intermediate section IS. Then, the sixteen-bit routing command associated with the last section LS will be of the form 00001101100X000X, where X is a bit that may be either a ONE or a ZERO. The initial ZERO in this routing command is the mode bit that indicates that the section currently under consideration is not a first section. The next five bit pairs in this particular routing command may be identified with the output of CHIP65 not being utilized for conducting response to any one of the input signals, with the output of CHIP66 being utilized for conducting response to the IN I input signal, with the output of CHIP67 being utilized for conducting response to the IN II input signal, with the output of CHIP68 being utilized for conducting response to the IN III input signal, and with the output of CHIP69 not being utilized for conducting response to any one of the inputs signals, respectively. The remaining five bits of this particular routing command correspond with the β-error detector responses of CHIP65, CHIP66, CHIP67, CHIP68 and CHIP69. These responses indicate that the faults in the preceding CHIP55-CHIP60, CHIP56-CHIP61, CHIP57-CHIP62, CHIP58-CHIP63 and CHIP59-CHIP64 combinations are within the capacity of the system to tolerate faults, since at least three of these bits are ZEROs. Furthermore, there are ZEROs in the positions corresponding to the bit pairs associated with the 01, 10 and 11 channel markers being in their preferred positions. The routing computer responds to any of the four routing commands of the form 00001101100X000X to leave routing unchanged.

If none of the β-error detectors of CHIP56, CHIP57 and CHIP58 in the intermediate section IS provides an indication of fault, the routing command for section IS will be of the form 00001101100X000X. The routing computer responds to that command to leave routing through section IS unchanged and to generate a 001101100 five bit pair pattern descriptive of the position of the channels at the input connections to intermediate section IS and thus at the input connections of the first section FS.

The routing command for the first section FS will be of the form 10001101100X000X, assuming that the β-error indicators of CHIP41, CHIP42 and CHIP43 indicate them not to have faults. The routing computer responds to that routing command to keep routing through first section FS unchanged.

In an alternative example, suppose that the auxiliary buffer chip CHIP67 detects a fault in the combination comprising CHIP57 and CHIP62. The routing command for the last section LS will then be 0000110110000100. Suppose that this routing command and a 0000110110000101 one both direct the routing computer to select a route through CHIP60 and CHIP66 for responses to IN I input signal, to select a route through CHIP61 and CHIP67 for responses to IN II input signal, and to select a route through CHIP63 and CHIP68 for responses to IN III input signal. The routing computer will cause a 001 instruction to be supplied to the auxiliary buffer chips in FIG. 22 for a sufficient number of TEST CLOCK cycles to move the CHIP SELECT token bit through the clocked CHIP SELECT bus threading through those chips to select CHIP66; thereafter the routing computer will program CHIP66 to select its α input to its output, using a procedure like that previously described. Then, the routing computer will cause a 001 instruction to be supplied to the auxiliary buffer chips in FIG. 22 for another TEST CLOCK cycle to move the CHIP SELECT token bit to select CHIP67; thereafter the routing computer will program CHIP67 to select its α input to its output, using a procedure like that previously described. Finally, the routing computer generates five bit pairs indicative of the positioning of the 00, 00, 01, 10 and 11 channel markers with respect to the five input connections of that section and thus with respect to the five output connections of the next preceding section. These five bit pairs have a 0110001100 pattern that becomes a part of the routing command for the preceding intermediate section IS.

Continuing the alternative example, suppose the β-error detectors of CHIP55 and CHIP56 indicate faults in the CHIP 40-CHIP50 and CHIP41-CHIP51 combinations and that the β-error detectors of CHIP57, CHIP58 and CHIP59 do not indicate faults in the CHIP 42-CHIP52, CHIP 43-CHIP53, and CHIP44-CHIP54 combinations. The routing command for the intermediate section IS will then be 0011000110011000. This routing command directs the routing computer to select a route through CHIP54 and CHIP44 for responses to IN I input signal, to select a route through CHIP52 and CHIP42 for responses to IN II input signal, and to select a route through CHIP53 and CHIP43 for responses to IN III input signal. The routing computer will cause a 001 instruction to be supplied to the auxiliary buffer chips in FIG. 22 for a sufficient number of TEST CLOCK cycles to move the CHIP SELECT token bit through the clocked CHIP SELECT bus threading through those chips to select CHIP56; thereafter the routing computer will program CHIP56 to select its γ input to its output using a procedure like that previously described. The initial programming of auxiliary buffer chips CHIP55 and CHIP58 is satisfactory and is left undisturbed. Finally, the routing computer generates five bit pairs indicative of the positioning of the 00, 00, 01, 10 and 11 channel markers with respect to the five input connections of that section and thus with respect to the five output connections of the first section FS. These five bit pairs have a 000101101 pattern that becomes a part of the routing command for the first section FS.

The routing command for the first section FS will then be 10000101101XX000. Responsive to this routing command, the routing computer causes a 001 instruction to be supplied to the auxiliary buffer chips in FIG. 22 for a sufficient number of TEST CLOCK cycles to move the CHIP SELECT token bit through the clocked CHIP SELECT bus threading through those chips to select CHIP44; thereafter the routing computer will program CHIP44 to select its α input to its output, using a procedure like that previously described. The initial programming of auxiliary buffer chips CHIP42 and CHIP43 is satisfactory and is left undisturbed. Note that since each of the chips CHIP40, CHIP41, CHIP42, CHIP43 and CHIP44 in the first section FS can select to its output any of the input signals IN I, IN II and IN III any possible displacement of channel routing after that first section can be accommodated by the selection procedures available with those first section FS chips.

The fault correction procedures described above utilize just the β-error detectors of the FIG. 22 auxiliary buffer chips. More concise sets of instructions to the auxiliary buffer chips from the routing computer are made possible by using the α-error and γ-error detectors as well. In the last section LS, using the α-error detector of CHIP66 can allow CHIP65 to be dispensed with, and using the γ-error detector of CHIP68 can allow CHIP69 to be dispensed with.

Modifications of the fault-tolerant systems that have been described can, of course, use auxiliary buffer chips of the type described in connection with FIG. 13, with FIGS. 14 and 15 modified per FIG. 16 and with FIGS. 17 and 18. The programming procedures described above must be modified suitably to take into account the difference in the way the αENABLE, βENABLE and γENABLE bits are stored and the difference in the way the CHIP SELECT bit is determined, which modifications in programming should be obvious in view of the foregoing specification.

Modifications of the fault-tolerant systems that have been described which use groups of only four, rather than five, chips will tolerate only one faulty chip per group, rather than two; but the cost in redundancy is only one-third, rather than two-thirds, increase in the number of chips in the electronics system.

The Technical Sub-Committee of the Joint Test Action Group has proposed in the JTAG Boundary-Scan Architecture Standard Proposal, Version 2.0, published Mar. 30, 1988, boundary-scan tests that can be conducted despite the electronics system employing the auxiliary buffer chips described above. The JTAG standard uses four test signals in implementing the boundary-scan testing. The TCK signal is the test clock in the JTAG standard and corresponds to the TEST CLOCK signal used in the auxiliary buffer chips; the TDI signal of the JTAG standard corresponds to the SERIAL TEST FEED signal used in the auxiliary buffer chips; and the TDO signal of the JTAG standard corresponds to the TEST OUT signal used in the auxiliary buffer chips. The JTAG testing is initiated by the TMS signal of the standard going to ZERO for five consecutive TCK clock cycles. This TMS test mode signal can be selectively generated for a specified off-the-shelf chip by the auxiliary buffer chip driving its input port, responsive to that auxiliary buffer chip being supplied a 111 instruction for five TEST CLOCK cycles. In FIG. 11 this is illustrated by off-the-shelf chip CHIP7 being provided TMS signal from auxiliary buffer chip CHIP9 via connection TMSI at selected times. Alternatively, the TMS signal can be selectively generated for a specified off-the-shelf chip by the auxiliary buffer chip connected from its output port, responsive to that auxiliary buffer chip being supplied a 111 instruction for five TEST CLOCK cycles. In FIG. 11 this is illustrated by off-the-shelf chip CHIP8 being provided TMS signal from auxiliary buffer chip CHIP11 via connection TMS2 at selected times. When JTAG testing is being done, the TEST ENABLE signal is set to ZERO, rather than to ONE as is the case when testing is being done in the manner described earlier in this specification and in patent application Ser. No. 513,636.

The auxiliary buffer chip as thus far considered provides within one monolithic integrated circuit for buffering a single test interface between a pair of off-the-shelf chips or between an off-the-shelf chip and a chip with built-in test circuitry. However, a monolithic i-c providing for buffering more than one such testing interface is also within the contemplation of the inventors. Such a chip can be constructed simply by replicating the auxiliary buffer circuitry as thus far described, cascading together their respective chip selectors CS with the CHIP SELECT OUT signal of each preceding chip selector in the cascade providing the CHIP SELECT IN signal of the next chip selector thereafter, and paralleling the corresponding ones of their SERIAL TEST FEED, TEST OUT, TEST CLOCK, TEST ENABLE, INSTRUCT 0, INSTRUCT 1 and INSTRUCT 0 connections. However, certain economies of structure are possible when a plurality of auxiliary buffer circuits are located within the same monolithic i-c. There is no need to replicate the two-phase non-overlapping clock generator CG (if used), the 3-into-8 decoder DEC', logic inverter INV8, the test vector register (e.g., as comprises cascaded bit latches CBL5) and its associated clocking circuitry, or portions of the circuitry used to generate the αENABLE, βENABLE and γENABLE bits. A shared test vector register must have sufficient bit-width to span the α, β and γ DATA INPUT ports so that voter operation and error detection can be tested.

Separate first-switch-means-controlling registers (e.g., as each comprise cascaded bit latches CBL6) and separate second-switch-means-controlling registers (e.g., as each comprise cascaded bit latches CBL7) and their associated clocking circuitry are retained for the individual auxiliary buffer circuits. Separate first-switch-means-controlling registers and separate second-switch-means-controlling registers are needed to implement the fault correction procedures previously described. Separate second-switch-means-controlling registers, rather than a shared test vector mask register, provide the test vector masking function and avoid the need for additional circuitry to select the test vector register to the specific auxiliary buffer circuits.

A plurality of auxiliary buffer circuits on the same monolithic integrated circuit can be selectively addressed using a chunk selector in addition to a chip selector, rather than simply relying on a replicated "chip" selector.

One skilled in the art to which this disclosure pertains and acquainted with the disclosures of the inventors and their co-workers will be enabled to design a number of variants of the auxiliary buffer circuits described in the foregoing specification; and this should be borne in mind when construing the claims which follow, to include within their scope all apparatus constructed in accordance with the precepts of the invention.

What is claimed is:

1. A buffer integrated circuit providing a testing interface and comprising:
   a test enable terminal for receiving a test enable bit therethrough;
   a test input terminal;
   a test output terminal;
   a chip select input terminal;
   a chip select output terminal;
   first and second clocked bit latches, in cascade connection between said chip select input terminal and said chip select output terminal, said first and second clocked bit latches for storing a chip select bit and for storing a chip test output enable bit, respectively, as may be received through said chip select input terminal during selective clocking of said first and second clocked bit latches;
   a first plurality of tristate drivers, N in number, each having a respective data bit input terminal, a respective control bit input terminal and a respective data bit output terminal, which data bit output terminals together form a data output port for said buffer integrated circuit;
   means for applying data signal bits to the data bit input terminals of said first plurality of tristate drivers;
   means for applying respective control signal bits to the control bit input terminals of said first plurality of tristate drivers;
   multiplexer means for selecting to said test output terminal the respective logic condition at any one of the data bit output terminals of said first plurality of tristate drivers;
   a second plurality of tristate drivers, N in number, included in said multiplexer means, each of said tristate drivers in said second plurality having a respective data bit input terminal connecting to the data bit output terminal of a respective said tristate driver in said first plurality, having a respective control bit input terminal, and having a respective data bit output terminal;
   a further tristate driver included in said multiplexer means, said further tristate driver having a data bit input terminal to which the data bit output terminals of said tristate drivers in said second plurality thereof each connect, having a control bit input terminal, and having a data bit output terminal connected to said test output terminal;
   means, responding to said chip test output enable bit being stored in said second clocked bit latch and to a test enable bit being received at said test enable terminal, for applying a respective control bit to the control bit input terminal of said further tristate driver which control bit is of a type that conditions the data bit output terminal of said further tristate driver to provide a relatively low-impedance drive from its data bit output terminal as compared to the condition where a control bit of that type is not applied to the control bit input terminal of said further tristate driver;

a first serial-in/parallel-out register being included in said multiplexer means, having a serial input port connected from said test input terminal for receiving test output enable signals one bit at a time during selective clocking of that register and having a parallel output port with a respective bit place connected to each control bit input terminal of said second plurality of tristate drivers;

a second serial-in/parallel-out register being included in said means for applying output enable bits to the control bit input terminals of said first plurality of tristate drivers, having a serial input port connected from said test input terminal for receiving output enable signals one bit at a time during selective clocking of that register and having a parallel output port with a respective bit place corresponding to each control bit input terminal of said first plurality of tristate drivers; and respective means corresponding to each tristate driver in said first plurality, responding either to at test enable bit not being received at said test enable terminal or to an output enable bit in the bit place of said second serial-in/parallel-out register corresponding to the control bit input terminal of the corresponding said tristate driver, for applying a control bit to the control bit terminal of that corresponding said tristate driver which control bit is of a type that conditions the data output terminal of that corresponding said tristate driver to provide a relatively low-impedance drive from its data bit output terminal as compared to the condition where a control bit of that type is not applied to the control bit terminal of that corresponding said tristate driver.

2. A buffer integrated circuit as set forth in claim 1 wherein said first and second clocked bit latches are connected in cascade connection between said chip select input terminal and said chip select output terminal with said first clocked bit latch connected before said second clocked bit latch.

3. A buffer integrated circuit as set forth in claim 1 wherein said means for applying data signal bits to the data bit input terminals of said first plurality of tristate drivers comprises:

a first data input port for said buffer integrated circuit having N parallel bit places therein;

respective first switch means for selectively connecting each data bit input terminal of said tristate drivers in said first plurality thereof to a corresponding one of said first data input port bit places, as determined by a respective control bit received by each said first switch means;

a third serial-in/parallel-out register, having a serial input port connected from said test input terminal for receiving test vectors one bit at a time during selective clocking of that register and having a parallel output port with a respective bit place corresponding to each data bit input terminal of said first plurality of tristate drivers;

respective second switch means for selectively connecting each data bit input terminal of said tristate drivers in said first plurality thereof to the corresponding bit place of said third serial-in/parallel-out register, as determined by a respective control bit received by each said second switch means.

4. A buffer integrated circuit as set forth in claim 3 including:

a fourth serial-in/parallel-out register, having a serial input port connected from said test input terminal for receiving control bits for said first switch means one bit at a time during selective clocking of that register, and having a parallel output port with a respective bit place corresponding to each said first switch means;

respective first switch control means corresponding to each said first switch means, for applying a respective control bit thereto as causes that said first switch means to selectively connect, responsive to said test enable terminal not receiving said test enable bit or the corresponding bit place of said fourth serial-in/parallel-out register output port being in a first rather than a second logic state;

a fifth serial-in/parallel-out register, having a serial input port connected from said test input terminal for receiving control bits for said second switch means one bit at a time during selective clocking of that register, and having a parallel output port with a respective bit place corresponding to each said second switch means;

respective second switch control means corresponding to each said second switch means, for applying a respective control bit thereto as causes that second switch means to selectively connect, responsive to said test enable terminal receiving said test enable bit at the same time the corresponding bit place of said fifth serial-in/parallel-out register being in a first rather than a second logic state; and means responsive to respective commands for supplying clocking signal to said first and second clocked bit latches, to said first serial-in/parallel-out register, to said second serial-in/parallel-out register, to said third serial-in/parallel-out register, to said fourth serial-in/parallel-out register, to said fifth serial-in/parallel-out register, or to none of them.

5. A buffer integrated circuit as set forth in claim 4 wherein said means responsive to respective commands for supplying clocking signal includes therein:

a decoder for determining which of said commands is supplied thereto via a set of instruction lines;

means for generating clocking signal;

means for applying clocking signal to said first and second clocked bit latches responsive to said decoder receiving said command to supply clocking signal to said first and second clocked bit latches;

means for applying clocking signal to said first serial-in/parallel-out register responsive to a test output enable bit being stored in said second clocked bit latch and to said decoder at the same time receiving said command to supply clocking signal to said first serial-in/parallel-out register;

means for applying clocking signal to said second serial-in/parallel-out register responsive to a chip select bit being stored in said first clocked bit latch and to said decoder at the same time receiving said command to supply clocking signal to said second serial-in/parallel-out register;

means for applying clocking signal to said third serial-in/parallel-out register responsive to a chip select bit being stored in said first clocked bit latch and to said decoder at the same time receiving said command to supply clocking signal to said third serial-in/parallel-out register;

means for applying clocking signal to said fourth serial-in/parallel-out register responsive to a chip select bit being stored in said first clocked bit latch and to said decoder at the same time receiving said command to supply clocking signal to said fourth serial-in/parallel-out register; and means for applying clocking signal to said fifth serial-in/parallel-out register responsive to a chip select bit being stored in said first clocked bit latch and to said decoder at the same time receiving said command to supply clocking signal to said fifth serial-in/parallel-out register.

6. A buffer integrated circuit as set forth in claim 3 including:

a fourth serial-in/parallel-out register having a serial input port connected from said test input terminal for receiving control bits for each said first switch means and each said second switch means one bit at a time during selective clocking of that register, and having a parallel output port with a respective bit place corresponding to each of said first switch means and said second switch means;

respective first switch control means corresponding to each said first switch means for applying a respective control bit thereto as causes that said first switch means to selectively connect, responsive to said test enable terminal not receiving said test enable bit or the corresponding bit place of said fourth serial-in/parallel-out register output port being in a first rather than a second logic state;

respective second switch control means corresponding to each said second switch means for applying a control bit thereto as causes that said second switch means to selectively connect, responsive to said test enable terminal receiving said test enable bit at the same time the corresponding bit place of said fourth serial-in/parallel-out register output port is in a first rather than a second logic state; and means responsive to respective commands for supplying clocking signal to said first and second clocked bit latches, to said first serial-in/parallel-out register, to said second serial-in/parallel-out register, to said third serial-in/parallel-out register, to said fourth serial-in/parallel-out register, or to none of them.

7. A buffer integrated circuit as set forth in claim 6 wherein said means responsive to respective commands for supplying clocking signal includes therein:

means for generating clocking signal;

a decoder for determining which of said commands is supplied thereto via a set of instruction lines;

means for applying clocking signal to said first and second clocked bit latches responsive to said decoder receiving said command to supply clocking signal to said first and second clocked bit latches;

means for applying clocking signal to said first serial-in/parallel-out register responsive to a test output enable bit being stored in said second clocked bit latch and to said decoder at the same time receiving said command to supply clocking signal to said first serial-in/parallel-out register;

means for applying clocking signal to said second serial-in/parallel-out register responsive to a chip select bit being stored in said first clocked bit latch and to said decoder at the same time receiving said command to supply clocking signal to said second serial-in/parallel-out register;

means for applying clocking signal to said third serial-in/parallel-out register responsive to a chip select bit being stored in said first clocked bit latch and to said decoder at the same time receiving said command to supply clocking signal to said third serial-in/parallel-out register; and means for applying clocking signal to said fourth serial-in/parallel-out register responsive to a chip select bit being stored in said first clocked bit latch and to said decoder at the same time receiving said command to supply clocking signal to said fourth serial-in/parallel-out register.

8. A buffer integrated circuit as set forth in claim 6 including:

means responsive to a further command for supplying clocking signal to said third serial-in/parallel-out register and at the same time conditioning said third serial-in/parallel-out register for circulating the test vectors stored therein.

9. A buffer integrated circuit as set forth in claim 8 wherein said means responsive to respective commands and said means responsive to a further command together include:

a decoder for determining which of said commands is supplied thereto via a set of instruction lines;

means for generating clocking signal;

means for applying clocking signal to said first and second clocked bit latches responsive to said decoder receiving said command to supply clocking signal to said first and second clocked bit latches;

means for applying clocking signal to said first serial-in/parallel-out register responsive to a test output enable bit being stored in said second clocked bit latch and to said decoder at the same time receiving said command to supply clocking signal to said first serial-in/parallel-out register;

means for applying clocking signal to said second serial-in/parallel-out register responsive to a chip select bit being stored in said first clocked bit latch and to said decoder at the same time receiving said command to supply clocking signal to said second serial-in/parallel-out register;

means for applying clocking signal to said third serial-in/parallel-out register responsive to a chip select bit being stored in said first clocked bit latch and to said decoder at the same time receiving said further command or said command to supply clocking signal to said third serial-in/parallel-out register; and means for applying clocking signal to said fourth serial-in/parallel-out register responsive to a chip select bit being stored in said first clocked bit latch and to said decoder at the same time receiving said command to supply clocking signal to said fourth serial-in/parallel-out register.

10. A buffer integrated circuit as set forth in claim 3 including:

a fourth serial-in/parallel-out register, having a serial input port connected from said test input terminal for receiving control bits for said first switch means one bit at a time during selective clocking of that register, and having a parallel output port with a first set of alternate bit places respectively corresponding to each said first switch means and with a second set of alternate bit places respectively corresponding to each said second switch means and interleaving with said first set of alternate bit places;

respective first switch control means corresponding to each said first switch means, for supplying a respective control bit thereto as causes that said first switch means to selectively connect, responsive to said test enable terminal not receiving said test enable bit or the corresponding bit place of said fourth serial-in/parallel-out register output port being in a first rather than a second state;

respective second switch control means corresponding to each said second switch means, for supplying a respective control bit thereto as causes that said second switch means to selectively connect, responsive to said test enable terminal receiving said test enable bit at the same time the corresponding bit place of said fourth serial-in/parallel-out register output port is in a first rather than a second state; and means responsive to respective commands for supplying clocking signal to said first and second clocked bit latches, to said first serial-in/parallel-out register, to said second serial-in/parallel-out register, to said third serial-in/parallel-out register, to said fourth serial-in/parallel-out register, or to none of them.

11. A buffer integrated circuit as set forth in claim 10 wherein said means responsive to respective commands for supplying clocking signal includes therein:

means for generating clocking signal;

a decoder for determining which of said commands is supplied thereto via a set of instruction lines;

means for applying clocking signal to said first and second clocked bit latches responsive to said decoder receiving said command to supply clocking signal to said first and second clocked bit latches;

means for applying clocking signal to said first serial-in/parallel-out register responsive to a test output enable bit being stored in said second clocked bit latch and to said decoder at the same time receiving said command to supply clocking signal to said first serial-in/parallel-out register;

means for applying clocking signal to said second serial-in/parallel-out register responsive to a chip select bit being stored in said first clocked bit latch and to said decoder at the same time receiving said command to supply clocking signal to said second serial-in/parallel-out register;

means for applying clocking signal to said third serial-in/parallel-out register responsive to a chip select bit being stored in said first clocked bit latch and to said decoder at the same time receiving said command to supply clocking signal to said third serial-in/parallel-out register; and means for applying clocking signal to said fourth serial-in/parallel-out register responsive to a chip select bit being stored in said first clocked bit latch and to said decoder at the same time receiving said command to supply clocking signal to said fourth serial-in/parallel-out register.

12. A buffer integrated circuit as set forth in claim 10 including:

means responsive to a further command for supplying clocking signal to said third serial-in/parallel-out register and at the same time conditioning said third serial-in/parallel-out register for circulating the test vectors stored therein.

13. A buffer integrated circuit as set forth in claim 12 wherein said means responsive to respective commands and said means responsive to a further command together include:

a decoder for determining which of said commands is supplied thereto via a set of instruction lines;

means for generating clocking signal;

means for applying clocking signal to said first and second clocked bit latches responsive to said decoder receiving said command to supply clocking signal to said first and second clocked bit latches;

means for applying clocking signal to said first serial-in/parallel-out register responsive to a test output enable bit being stored in said second clocked bit latch and to said decoder at the same time receiving said command to supply clocking signal to said first serial-in/parallel-out register;

means for applying clocking signal to said second serial-in/parallel-out register responsive to a chip select bit being stored in said first clocked bit latch and to said decoder at the same time receiving said command to supply clocking signal to said second serial-in/parallel-out register;

means for applying clocking signal to said third serial-in/parallel-out register responsive to a chip select bit being stored in said first clocked bit latch and to said decoder at the same time receiving said further command or said command to supply clocking signal to said third serial-in/parallel-out register; and means for applying clocking signal to said fourth serial-in/parallel-out register responsive to a chip select bit being stored in said first clocked bit latch and to said decoder at the same time receiving said command to supply clocking signal to said fourth serial-in/parallel-out register.

14. A buffer integrated circuit as set forth in claim 1 wherein said means for applying data signal bits to the control bit input terminals of said first plurality of tristate drivers comprises;

first, second and third data input ports for said buffer integrated circuit, each respectively having N parallel bit places therein;

a third serial-in/parallel-out register, having a serial input port connected from said test input terminal for receiving one bit at a time during selective clocking of that register a triple-modular-redundancy token bit interspersed among other bits, and having a parallel output port with first, second and third bit places therein;

means, responsive to said triple-modular-redundancy token bit appearing in the first bit place of the output port of said third serial-in/parallel-out register, for generating a first input enable signal;

means, responsive to said triple-modular-redundancy token bit appearing in the second bit place of the output port of said third serial-in/parallel-out register, for generating a second input enable signal;

means, responsive to said triple-modular-redundancy token bit appearing in the third bit place of the output port of said third serial-in/parallel-out register, for generating a third input enable signal;

a voter circuit of the type performing majority logic on a bit-sliced basis, said voter circuit having first, second and third input ports and having an output port, each of which ports has N respective bit places therein, the N respective bit places of the output port of said voter circuit supplying respective ones of data bits applied to the data bit terminals of said first plurality of tristate drivers;

respective first switch means for selectively connecting to each bit place of the first input port of said voter circuit from a respective bit place of said first data input port, as determined by a respective control bit received by each said first switch means;

a fourth serial-in/parallel-out register, having a serial input port connected from said test input terminal for receiving test vectors one bit at a time during selective clocking of that register and having a parallel output port with a respective bit place corresponding to each bit place of the first input port of said voter circuit;

respective second switch means for selectively connecting to each bit place of the first input port of said voter circuit from the corresponding bit place of the output port of said fourth serial-in/parallel-out register, as determined by a respective control bit received by each said second switch means;

respective third switch means for selectively connecting to each bit place of the second input port of said voter circuit from a respective bit place of said second data input port, as determined by a respective control bit received by each said third switch means;

a fifth serial-in/parallel-out register, having a serial input port connected from said test input terminal for receiving test vectors on bit a time during selective clocking of that register and having a parallel output port with a respective bit place corresponding to each bit place of the second input port of said voter circuit;

respective fourth switch means for selectively connecting to each bit place of the second input port of said voter circuit from the corresponding bit place of the output port of said fifth serial-in/parallel-out register, as determined by a respective control bit received by each said fourth switch means;

respective fifth switch means for selectively connecting to each bit place of the third input port of said voter circuit from a respective bit place of said third data input port, as determined by a respective control bit received by each said fifth switch means;

a sixth serial-in/parallel-out register, having a serial input port connected from said test input terminal for receiving test vectors one bit at a time during selective clocking of that register and having a parallel output port with a respective bit place corresponding to each bit place of the third input port of said voter circuit; and respective sixth switch means for selectively connecting to each bit place of the third input port of said voter circuit from the corresponding bit place of the output port of said sixth serial-in/parallel-out register, as determined by a respective control bit received by each said sixth switch means.

15. A buffer integrated circuit as set forth in claim 14 including:

respective first, second and third bit-error detectors associated with each bit slice of said voter circuit responding to any differences between the bit that bit slice supplies to the output port of said voter circuit and the bits that bit slice receives respectively from the second, second and third output ports of said voter circuit for generating respective error indications;

means for ORing error indications from said first bit-error detectors to generate a first bit-error OR response;

means for ORing error indications from said second bit-error detectors to generate a second bit-error OR response; and means for ORing error indications from said third bit-error detectors to generate a third bit-error OR response.

16. A buffer integrated circuit as set forth in claim 15 including:

means for ANDing said first bit-error OR response and said first input enable signal to generate a first AND response;

means for ANDing said second bit-error OR response and said second input enable signal to generate a second AND response;

means for ANDing said third bit-error OR response and said third input enable signal to generate a third AND response; and means for ORing said first AND response, said second AND response, and said third AND response to generate a buffer integrated circuit fault indication.

17. A buffer integrated circuit as set forth in claim 14 including:

a seventh serial-in/parallel-out register, having a serial input port connected from said test input terminal for receiving control bits for said first switch means one bit at a time during selective clocking of that register, and having a parallel output port with a respective bit place corresponding to each said first switch means;

respective first switch control means corresponding to each said first switch means, for supplying a respective control bit thereto as causes that said first switch means to selectively connect, responsive to said test enable terminal not receiving said test enable bit or the corresponding bit place of said seventh serial-in/parallel-out register output port being in a first rather than a second state;

an eighth serial-in/parallel-out register, having a serial input port connected from said test input terminal for receiving control bits for said second switch means one bit at a time during selective clocking of that register, and having a parallel output port with a respective bit place corresponding to each said second switch means;

respective second switch control means corresponding to each said second switch means, for supplying a respective control bit thereto as causes that said second switch means to selectively connect, responsive to said test enable terminal receiving said test enable bit at the same time the corresponding bit place of said eighth serial-in/parallel-out register output port is in a first rather than a second state;

a ninth serial-in/parallel-out register, having a serial input port connected from said test input terminal for receiving control bits for said third switch means one bit at a time during selective clocking of that register, and having a parallel output port with a respective bit place corresponding to each said third switch means;

respective third switch control means corresponding to each said third switch means, for supplying a respective control bit thereto as causes that said third switch means to selectively connect, responsive to said test enable terminal not receiving said test enable bit or the corresponding bit place of said ninth serial-in/parallel-out register output port being in a first rather than a second state;

a tenth serial-in/parallel-out register, having a serial input port connected from said test input terminal for receiving control bits for said fourth switch means one bit at a time during selective clocking of that register, and having a parallel output port with a respective bit place corresponding to each said fourth switch means;

respective fourth switch control means corresponding to each said fourth switch means, for supplying a respective control bit thereto as causes that said fourth switch means to selectively connect, responsive to said test enable terminal receiving said test enable bit at the same time the corresponding bit place of said tenth serial-in/parallel-out register output port is in a first rather than a second state;

an eleventh serial-in/parallel-out register, having a serial input port connected from said test input terminal for receiving control bits for said fifth switch means one bit at a time during selective clocking of that register, and having a parallel output port with a respective bit place corresponding to each said fifth switch means;

respective fifth switch control means corresponding to each said fifth switch means, for supplying a respective control bit thereto as causes that said fifth switch means to selectively connect, responsive to said test enable terminal not receiving said test enable bit or the corresponding bit place of said eleventh serial-in/parallel-out register output port being in a first rather than a second state;

a twelfth serial-in/parallel-out register, having a serial input port connected from said test input terminal for receiving control bits for said sixth switch means one bit at a time during selective clocking of that register, and having a parallel output port with a respective bit place corresponding to each said sixth switch means;

respective sixth switch control means corresponding to each said sixth switch means, for supplying a respective control bit thereto as causes that said sixth switch means to selectively connect, responsive to said test enable terminal receiving said test enable bit at the same time the corresponding bit place of said twelfth serial-in/parallel-out register output port is in a first rather than a second state; and means responsive to respective commands for supplying clocking signal to said first and second clocked bit latches, to said first serial-in/parallel-out register, to said second serial-in/parallel-out register, to said third serial-in/parallel-out register, conditionally to each of said fourth and fifth and sixth serial-in/parallel-out registers, to each of said seventh and ninth and eleventh serial-in/parallel-out registers conditionally, to each of said eighth and tenth and twelfth serial-in/parallel-out registers conditionally, or to none of them.

18. A buffer integrated circuit as set forth in claim 17 wherein said means responsive to respective commands for supplying clocking signal includes therein:

a decoder for determining which of said commands is supplied thereto via a set of instruction lines;

means for generating clocking signal;

means for applying clocking signal to said first and second clocked bit latches responsive to said decoder receiving said command to supply clocking signal to said first and second clocked bit latches;

means for applying clocking signal to said first serial-in/parallel-out register responsive to a test output enable bit being stored in said second clocked bit latch and to said decoder at the same time receiving said command to supply clocking signal to said first serial-in/parallel-out register;

means for applying clocking signal to said second serial-in/parallel-out register responsive to a chip select bit being stored in said first clocked bit latch and to said decoder at the same time receiving said command to supply clocking signal to said second serial-in/parallel-out register;

means for applying clocking signal to said third serial-in/parallel-out register responsive to a chip select bit being stored in said first clocked bit latch and to said decoder at the same time receiving said command to supply clocking signal to said third serial-in/parallel-out register means for applying clocking signal to said fourth serial-in/parallel-out register responsive to the simultaneous occurrences of said first input enable signal being generated, a chip select bit being stored in said first clocked bit latch, and said decoder receiving said command to supply clocking signal conditionally to each of said fourth, fifth and sixth serial-in/parallel-out registers;

means for applying clocking signal to said fifth serial-in/parallel-out register responsive to the simultaneous occurrences of said second input enable signal being generated, a chip select bit being stored in said first clocked bit latch, and said decoder receiving a command to said fourth, fifth and sixth serial-in/parallel-out registers;

means for applying clocking signal to said sixth serial-in/parallel-out register responsive to the simultaneous occurrences of said third input enable signal being generated, a chip select bit being stored in said first clocked bit latch, and said decoder receiving said command to supply clocking signal conditionally to each of said fourth, fifth and sixth serial-in/parallel-out registers;

means for applying clocking signal to said seventh serial-in/parallel-out register responsive to the simultaneous occurrences of said first input enable signal being generated, a chip select bit being stored in said first clocked bit latch and said decoder at the same time receiving said command to supply clocking signal conditionally to each of said seventh, ninth and eleventh serial-in/parallel-out registers;

means for applying clocking signal to said eighth serial-in/parallel-out register responsive to the simultaneous occurrences of said first input enable signal being generated, a chip select bit being stored in said first clocked bit latch and said decoder at the same time receiving said command to supply clocking signal conditionally to each of said eighth, tenth and twelfth serial-in/parallel-out registers;

means for applying clocking signal to said ninth serial-in/parallel-out register responsive to the simultaneous occurrences of said second input enable signal being generated, a chip select bit being stored in said first clocked bit latch and said decoder at the same time receiving said command to supply clocking signal conditionally to each of said seventh, ninth and eleventh serial-in/parallel-out registers;

means for applying clocking signal to said tenth serial-in/parallel-out register responsive to the simultaneous occurrences of said second input enable signal being generated, a chip select bit being stored in said first clocked bit latch, and said decoder receiving said command to supply clocking signal conditionally to each of said eighth, tenth and twelfth serial-in/parallel-out registers;

means for applying clocking signal to said eleventh serial-in/parallel-out register responsive to the simultaneous occurrences of said third input enable signal being generated, a chip select bit being stored in said first clocked bit latch, and said decoder receiving said command to supply clocking signal conditionally to each of said seventh, ninth and eleventh serial-in/parallel-out registers; and means for applying clocking signal to said twelfth serial-in/parallel-out register responsive to the simultaneous occurrences of said third input enable signal being generated, a chip select bit being stored in said first clocked bit latch, and said decoder receiving said command to supply clocking signal to each of said eighth and tenth and twelfth serial-in/parallel-out registers conditionally.

19. A buffer integrated circuit as set forth in claim 17 including:

respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a first bit-error OR response;

means for ORing error indications from said second bit-error detectors to generate a second bit-error OR response; and means for ORing error indications from said third bit-error detectors to generate a third bit-error OR response.

20. A buffer integrated circuit as set forth in claim 19 including:

means for ANDing said first bit-error OR response and said first input enable signal to generate a first AND response;

means for ANDing said second bit-error OR response and said second input enable signal to generate a second AND response;

means for ANDing said third bit-error OR response and said third input enable signal to generate a third AND response; and means for ORing said first AND response, said second AND response, and said third AND response to generate a buffer integrated circuit fault indication.

21. A buffer integrated circuit as set forth in claim 14 including:

a seventh serial-in/parallel-out register having a serial input port connected from said test input terminal for receiving control bits for each said first switch means and each said second switch means one bit at a time during selective clocking of that register, and having a parallel output port with a respective bit place corresponding to each of said first switch means and said second switch means;

respective first switch control means corresponding to each said first switch means, for supplying a respective control bit thereto as causes that said first switch means to selectively connect, responsive to said test enable terminal not receiving said test enable bit or the corresponding bit place of said seventh serial-in/parallel-out register output port being in a first rather than a second state;

respective second switch control means corresponding to each said second switch means, for supplying a respective control bit thereto as causes that said second switch means to selectively connect, responsive to said test enable terminal receiving said test enable bit at the same time the corresponding bit place of said seventh serial-in/parallel-out register output port is in a first rather than a second state;

an eighth serial-in/parallel-out register having a serial input port connected from said test input terminal for receiving control bits for each said third switch means and each said fourth switch means one bit at a time during selective clocking of that register, and having a parallel output port with a respective bit place corresponding to each of said third switch means and said fourth switch means;

respective third switch control means corresponding to each said third switch means, for supplying a respective control bit thereto as causes that said third switch means to selectively connect, responsive to said test enable terminal not receiving said test enable bit or the corresponding bit place of said eighth serial-in/parallel-out register output port being in a first rather than a second state;

respective fourth switch control means corresponding to each said fourth switch means, for supplying a respective control bit thereto as causes that said fourth switch means to selectively connect, responsive to said test enable terminal receiving said test enable bit at the same time the corresponding bit place of said eighth serial-in/parallel-out register output port is in a first rather than a second state;

a ninth serial-in/parallel-out register having a terminal for receiving control bits for each said fifth switch means and each said sixth switch means one bit at a time during selective clocking of that register, and having a parallel output port with a respective bit place corresponding to each of said fifth switch means and said sixth switch means;

respective fifth switch control means corresponding to each said fifth switch means, for supplying a respective control bit thereto as causes that said fifth switch means to selectively connect, responsive to said test enable terminal not receiving said test enable bit or the corresponding bit place of said ninth serial-in/parallel-out register output port being in a first rather than a second state;

respective sixth switch control means corresponding to each said sixth switch means, for supplying a respective control bit thereto as causes that said sixth switch means to selectively connect, responsive to said test enable terminal receiving said test enable bit at the same time the corresponding bit place of said ninth serial-in/parallel-out register output port is in a first rather than a second state; and means responsive to respective commands for supplying clocking signal to said first and second clocked bit latches, to said first serial-in/parallel-out register, to said second serial-in/parallel-out register, to said third serial-in/parallel-out register, to each of said fourth and fifth and sixth serial-in/parallel-out registers conditionally, to each of said seventh and eighth and ninth serial-in/parallel-out registers conditionally, or to none of them.

22. A buffer integrated circuit as set forth in claim 21 wherein said means responsive to respective commands for supplying clocking signal includes therein:
   a decoder for determining which of said commands is supplied thereto via a set of instruction lines;
   means for generating clocking signal;
   means for applying clocking signal to said first and second clocked bit latches responsive to said decoder receiving said command to supply clocking signal to said first and second clocked bit latches;
   means for applying clocking signal to said first serial-in/parallel-out register responsive to a test output enable bit being stored in said second clocked bit latch and to said decoder at the same time receiving said command to supply clocking signal to said first serial-in/parallel-out register;
   means for applying clocking signal to said second serial-in/parallel-out register responsive to a chip select bit being stored in said first clocked bit latch and to said decoder at the same time receiving said command to supply clocking signal to said second serial-in/parallel-out register;
   means for applying clocking signal to said third serial-in/parallel-out register responsive to a chip select bit being stored in said first clocked bit latch and to said decoder at the same time receiving said command to supply clocking signal to said third serial-in/parallel-out register
   means for applying clocking signal to said fourth serial-in/parallel-out register responsive to the simultaneous occurrences of said first input enable signal being generated, a chip select bit being stored in said first clocked bit latch, and said decoder receiving said command to supply clocking signal conditionally to each of said fourth, fifth and sixth serial-in/parallel-out registers;
   means for applying clocking signal to said fifth serial-in/parallel-out register responsive to the simultaneous occurrences of said second input enable signal being generated, a chip select bit being stored in said first clocked bit latch, and said decoder receiving said command to supply clocking signal conditionally to each of said fourth, fifth and sixth serial-in/parallel-out registers;
   means for applying clocking signal to said sixth serial-in/parallel-out register responsive to the simultaneous occurrences of said third input enable signal being generated, a chip select bit being stored in said first clocked bit latch, and said decoder receiving said command to supply clocking signal conditionally to each of said fourth, fifth and sixth serial-in/parallel-out registers;
   means for applying clocking signal to said seventh serial-in/parallel-out register responsive to the simultaneous occurrences of said first input enable signal being generated, a chip select bit being stored in said first clocked bit latch and said decoder at the same time receiving said command to supply clocking signal to each of said seventh, eighth and ninth serial-in/parallel-out registers conditionally;
   means for applying clocking signal to said eighth serial-in/parallel-out register responsive to the simultaneous occurrences of said second input enable signal being generated, a chip select bit being stored in said first clocked bit latch and said decoder at the same time receiving said command to supply clocking signal to each of said seventh, eighth and ninth serial-in/parallel-out registers conditionally; and
   means for applying clocking signal to said ninth serial-in/parallel-out register responsive to the simultaneous occurrences of said third input enable signal being generated, a chip select bit being stored in said first clocked bit latch and said decoder at the same time receiving said command to supply clocking signal to each of said seventh, eighth and ninth serial-in/parallel-out registers conditionally.

23. A buffer integrated circuit as set forth in claim 22 including:
   respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;
   means for ORing error indications from said first bit-error detectors to generate a first bit-error OR response;
   means for ORing error indications from said second bit-error detectors to generate a second bit-error OR response; and
   means for ORing error indications from said third bit-error detectors to generate a third bit-error OR response.

24. A buffer integrated circuit as set forth in claim 23 including:
   means for ANDing said first bit-error OR response and said first input enable signal to generate a first AND response;
   means for ANDing said second bit-error OR response and said second input enable signal to generate a second AND response;
   means for ANDing said third bit-error OR response and said third input enable signal to generate a third AND response; and
   means for ORing said first AND response, said second AND response, and said third AND response to generate a buffer integrated circuit fault indication.

25. A multiplicity of buffer integrated circuits as set forth in claim 24 connecting together groups of integrated circuits of the same type as each other, to form a fault-tolerant electronic system for use with a routing computer that responds to any circuit fault indications from said buffer integrated circuits to attempt to condition said buffer integrated circuits for interconnecting said integrated circuits of other type to provide at least one data path through said fault-tolerant electronic system.

26. A buffer integrated circuit as set forth in claim 21 including:
   means responsive to a further command for supplying clocking signal to each of said fourth, fifth and sixth serial-in/parallel-out registers conditionally and at the same time conditioning said fourth, fifth and sixth serial-in/parallel-out registers each for responding to clocking signal supplied thereto to circulate the test vectors stored therein.

27. A buffer integrated circuit as set forth in claim 26 wherein said means responsive to respective commands and said means responsive to a further command together include:
- a decoder for determining which of said commands is supplied thereto via a set of instruction lines;
- means for generating clocking signal;
- means for applying clocking signal to said first and second clocked bit latches responsive to said decoder receiving said command to supply clocking signal to said first and second clocked bit latches;
- means for applying clocking signal to said first serial-in/parallel-out register responsive to a test output enable bit being stored in said second clocked bit latch and to said decoder at the same time receiving said command to supply clocking signal to said first serial-in/parallel-out register;
- means for applying clocking signal to said second serial-in/parallel-out register responsive to a chip select bit being stored in said first clocked bit latch and to said decoder at the same time receiving said command to supply clocking signal to said second serial-in/parallel-out register;
- means for applying clocking signal to said third serial-in/parallel-out register responsive to a chip select bit being stored in said first clocked bit latch and to said decoder at the same time receiving said command to supply clocking signal to said third serial-in/parallel-out register
- means for applying clocking signal to said fourth serial-in/parallel-out register responsive to the simultaneous occurrences of said first input enable signal being generated, a chip select bit being stored in said first clocked bit latch, and said decoder receiving either said further command or said command to supply clocking signal to each of said fourth, fifth and sixth serial-in/parallel-out registers conditionally;
- means for applying clocking signal to said fifth serial-in/parallel-out register responsive to the simultaneous occurrences of said second input enable signal being generated, a chip select bit being stored in said first clocked bit latch, and said decoder receiving either said further command said command to supply clocking signal to each of said fourth, fifth and sixth serial-in/parallel-out registers conditionally;
- means for applying clocking signal to said sixth serial-in/parallel-out register responsive to the simultaneous occurrences of said third input enable signal being generated, a chip select bit being stored in said first clocked bit latch, and said decoder receiving either said further command said command to supply clocking signal to each of said fourth, fifth and sixth serial-in/parallel-out registers conditionally;
- means for applying clocking signal to said seventh serial-in/parallel-out register responsive to the simultaneous occurrences of said first input enable signal being generated, a chip select bit being stored in said first clocked bit latch and said decoder at the same time receiving said command to supply clocking signal to each of said seventh, eighth and ninth serial-in/parallel-out registers conditionally;
- means for applying clocking signal to said eighth serial-in/parallel-out register responsive to the simultaneous occurrences of said second input enable signal being generated, a chip select bit being stored in said first clocked bit latch and said decoder at the same time receiving said command to supply clocking signal to each of said seventh, eighth and ninth serial-in/parallel-out registers conditionally; and
- means for applying clocking signal to said ninth serial-in/parallel-out register responsive to the simultaneous occurrences of said third input enable signal being generated, a chip select bit being stored in said first clocked bit latch and said decoder at the same time receiving said command to supply clocking signal to each of said seventh, eighth and ninth serial-in/parallel-out registers conditionally.

28. A buffer integrated circuit as set forth in claim 27 including:
- respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;
- means for ORing error indications from said first bit-error detectors to generate a first bit-error OR response;
- means for ORing error indications from said second bit-error detectors to generate a second bit-error OR response; and
- means for ORing error indications from said third bit-error detectors to generate a third bit-error OR response.

29. A buffer integrated circuit as set forth in claim 28 including:
- means for ANDing said first bit-error OR response and said first input enable signal to generate a first AND response;
- means for ANDing said second bit-error OR response and said second input enable signal to generate a second AND response;
- means for ANDing said third bit-error OR response and said third input enable signal to generate a third AND response; and
- means for ORing said first AND response, said second AND response, and said third AND response to generate a buffer integrated circuit fault indication.

30. A multiplicity of buffer integrated circuits as set forth in claim 29 connecting together groups of integrated circuits of the same type as each other, to form a fault-tolerant electronic system for use with a routing computer that responds to any circuit fault indications from said buffer integrated circuits to attempt to condition said buffer integrated circuits for interconnecting said integrated circuits of other type to provide at least one data path through said fault-tolerant electronic system.

31. A buffer integrated circuit providing a testing interface and comprising:
- first, second and third data ports for said buffer integrated circuit, each respectively having a number N of parallel bit places therein;
- a test enable terminal for receiving a test enable bit therethrough;
- a triple-modular-redundancy enable terminal for receiving a triple-modular-redundancy enable bit therethrough;
- a test input terminal;
- a test output terminal;

a chip select input terminal;

a chip select output terminal;

a first plurality of tristate drivers, N in number, each having a respective data bit input terminal, a respective control bit input terminal and a respective data bit output terminal, which data bit output terminals together form a data output port for said buffer integrated circuit;

means for applying data signal bits to the data bit input terminals of said first plurality of tristate drivers;

means for applying respective control signal bits to the control bit input terminals of said first plurality of tristate drivers;

multiplexer means for selecting to said test output terminal the respective logic condition at any one of the data bit output terminals of said first plurality of tristate drivers;

a voter circuit of the type performing majority logic on a bit-sliced basis, said voter circuit having first, second and third input ports and having an output port, each of which ports has N respective bit places therein, the N respective bit places of the output port of said voter circuit supplying respective ones of data bits applied to the data bit terminals of said first plurality of tristate drivers;

first, second, third and fourth clocked bit latches, in cascade connection between said chip select input terminal and said chip select output terminal, said first, second, third and fourth clocked bit latches for storing a first input data port select bit, for storing a second input data port select bit, for storing a third input data port select bit and for storing a chip test output enable bit, respectively, as may be received through said chip select input terminal during selective clocking of said first and second clocked bit latches;

means, responsive to said triple-modular-redundancy enable bit currently being unavailable, for generating a first input enable signal;

means, responsive to said first input data port select bit being available, for generating a first input enable signal;

means, responsive to said second input data port select bit and said triple-modular-redundancy enable bit being simultaneously available, for generating a second input enable signal;

means, responsive to said third input data port select bit and said triple-modular-frequency enable bit being simultaneously available, for generating a third input enable signal;

means for ORing said first, second and third input data port select bits to generate a single-bit chip select signal;

a second plurality of tristate drivers, N in number, included in said multiplexer means, each of said tristate drivers in said second plurality having a respective data bit input terminal connecting to the data bit output terminal of a respective said tristate driver in said first plurality, having a respective control bit input terminal, and having a respective data bit output terminal;

a further tristate driver included in said multiplexer means, said further tristate driver having a data bit input terminal to which the data bit output terminals of said tristate drivers in said second plurality thereof each connect, having a control bit input terminal, and having a data bit output terminal connected to said test output terminal;

means, responding to said chip test output enable bit being stored in said fourth clocked bit latch and to a test enable bit being received at said test enable terminal, for applying a respective control bit to the control bit input terminal of said further tristate driver which control bit is of a type that conditions the data bit output terminal of said further tristate driver to provide a relatively low-impedance drive from its data bit output terminal as compared to the condition where a control bit of that type is not applied to the control bit input terminal of said further tristate driver;

a first serial-in/parallel-out register being included in said multiplexer means, having a serial input port connected from said test input terminal for receiving test output enable signals one bit at a time during selective clocking of that register and having a parallel output port with a respective bit place connected to each control bit input terminal of said second plurality of tristate drivers;

a second serial-in/parallel-out register being included in said means for applying output enable bits to the control bit input terminals of said first plurality of tristate drivers, having a serial input port connected from said test input terminal for receiving output enable signals one bit at a time during selective clocking of that register and having a parallel output port with a respective bit place corresponding to each control bit input terminal of said first plurality of tristate drivers;

respective means corresponding to each tristate driver in said first plurality, responding either to a test enable bit not being received at said test enable terminal or to an output enable bit in the bit place of said second serial-in/parallel-out register corresponding to the control bit input terminal of the corresponding said tristate driver, for applying a control bit to the control bit terminal of that corresponding said tristate driver which control bit is of a type that conditions the data output terminal of that corresponding said tristate driver to provide a relatively low-impedance drive from its data bit output terminal as compared to the condition where a control bit of that type is not applied to the control bit terminal of that corresponding said tristate driver;

respective first switch means for selectively connecting to each bit pace of the first input port of said voter circuit from a respective bit place of said first data input port, as determined by a respective control bit received by each said first switch means;

a third serial-in/parallel-out register, having a serial input port connected from said test input terminal for receiving test vectors one bit at a time during selective clocking of that register and having a parallel output port with a respective bit place corresponding to each bit place of the first input port of said voter circuit;

respective second switch means for selectively connecting to each bit place of the first input port of said voter circuit from the corresponding bit place of the output port of said third serial-in/parallel-out register, as determined by a respective control bit received by each said second switch means;

respective third switch means for selectively connecting to each bit place of the second input port of said voter circuit from a respective bit place of said second data input port, as determined by a respective control bit received by each said third switch means;

a fourth serial-in/parallel-out register, having a serial input port connected from said test input terminal for receiving test vectors one bit at a time during selective clocking of that register and having a parallel output port with a respective bit place corresponding to each bit place of the second input port of said voter circuit;

respective fourth switch means for selectively connecting to each bit place of the second input port of said voter circuit from the corresponding bit place of the output port of said fourth serial-in/parallel-out register, as determined by a respective control bit received by each said fourth switch means;

respective fifth switch means for selectively connecting to each bit place of the third input port of said voter circuit from a respective bit place of said third data input port, as determined by a respective control bit received by each said fifth switch means;

a fifth serial-in/parallel-out register, having a serial input port connected from said test input terminal for receiving test vectors one bit at a time during selective clocking of that register and having a parallel output port with a respective bit place corresponding to each bit place of the third input port of said voter circuit; and respective sixth switch means for selectively connecting to each bit place of the third input port of said voter circuit from the corresponding bit place of the output port of said fifth serial-in/parallel-out register, as determined by a respective control bit received by each said sixth switch means.

32. A buffer integrated circuit as set forth in claim 31 wherein said first, second, third and fourth clocked bit latches are connected in order of their ordinal numbering in their said cascade connection between said chip select input terminal and said chip select output terminal.

33. A buffer integrated circuit as set forth in claim 31 including:

respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a first bit-error OR response;

means for ORing error indications from said second bit-error detectors to generate a second bit-error OR response; and means for ORing error indications from said third bit-error detectors to generate a third bit-error OR response.

34. A buffer integrated circuit as set forth in claim 33 including:

means for ANDing said first bit-error OR response and said first input enable signal to generate a first AND response;

means for ANDing said second bit-error OR response and said second input enable signal to generate a second AND response;

means for ANDing said third bit-error OR response and said third input enable signal to generate a third AND response; and means for ORing said first AND response, said second AND response, and said third AND response to generate a buffer integrated circuit fault indication.

35. A buffer integrated circuit as set forth in claim 31 including:

a sixth serial-in/parallel-out register, having a serial input port connected from said test input terminal for receiving control bits for said first switch means one bit at a time during selective clocking of that register, and having a parallel output port with a respective bit place corresponding to each said first switch means;

respective first switch control means corresponding to each said first switch means, for supplying a respective control bit thereto as causes that said first switch means to selectively connect, responsive to said test enable terminal not receiving said test enable bit or the corresponding bit place of said sixth serial-in/parallel-out register output port being in a first rather than a second state;

a seventh serial-in/parallel-out register, having a serial input port connected from said test input terminal for receiving control bits for said second switch means one bit at a time during selective clocking of that register, and having a parallel output port with a respective bit place corresponding to each said second switch means;

respective second switch control means corresponding to each said second switch means, for supplying a respective control bit thereto as causes that said second switch means to selectively connect, responsive to said test enable terminal receiving said test enable bit at the same time the corresponding bit place of said seventh serial-in/parallel-out register output port is in a first rather than a second state;

an eighth serial-in/parallel-out register, having a serial input port connected from said test input terminal for receiving control bits for said third switch means one bit at a time during selective clocking of that register, and having a parallel output port with a respective bit place corresponding to each said third switch means;

respective third switch control means corresponding to each said third switch means, for supplying a respective control bit thereto as causes that said third switch means to selectively connect, responsive to said test enable terminal not receiving said test enable bit or the corresponding bit place of said eighth serial-in/parallel-out register output port being in a first rather than a second state;

a ninth serial-in/parallel-out register, having a serial input port connected from said test input terminal for receiving control bits for said fourth switch means one bit at a time during selective clocking of that register, and having a parallel output port with a respective bit place corresponding to each said fourth switch means;

respective fourth switch control means corresponding to each said fourth switch means, for supplying a respective control bit thereto as causes that said fourth switch means to selectively connect, responsive to said test enable terminal receiving said test enable bit at the same time the corresponding bit place of said ninth serial-in/parallel-out register output port is in a first rather than a second state;

a tenth serial-in/parallel-out register, having a serial input port connected from said test input terminal for receiving control bits for said fifth switch means one bit at a time during selective clocking of that register, and having a parallel output port with a respective bit place corresponding to each said fifth switch means;

respective fifth switch control means corresponding to each said fifth switch means, for supplying a respective control bit thereto as causes that said fifth switch means to selectively connect, responsive to said test enable terminal not receiving said test enable bit or the corresponding bit place of said tenth serial-in/parallel-out register output port being in a first rather than a second state;

an eleventh serial-in/parallel-out register, having a serial input port connected from said test input terminal for receiving control bits for said sixth switch means one bit at a time during selective clocking of that register, and having a parallel output port with a respective bit place corresponding to each said sixth switch means;

respective sixth switch control means corresponding to each said sixth switch means, for supplying a respective control bit thereto as causes that said sixth switch means to selectively connect, responsive to said test enable terminal receiving said test enable bit at the same time the corresponding bit place of said eleventh serial-in/parallel-out register output port is in a first rather than a second state; and means responsive to respective commands for supplying clocking signal to said first and second and third and fourth clocked bit latches, to said first serial-in/parallel-out register, to said second serial-in/parallel-out register, to each of said third and fourth and fifth serial-in/parallel-out registers, conditionally, to each of said sixth and eighth and tenth serial-in/parallel-out registers conditionally, to each of said seventh and ninth and eleventh serial-in/parallel-out registers conditionally, or to none of them.

36. A buffer integrated circuit as set forth in claim 35 wherein said means responsive to respective commands for supplying clocking signal includes therein:

a decoder for determining which of said commands is supplied thereto via a set of instruction lines;

means for generating clocking signal;

means for applying clocking signal to said first and second and third and fourth clocked bit latches responsive to said command to supply clocking signal to said first and second and third and fourth clocked bit latches being received by said decoder;

means for applying clocking signal to said first serial-in/parallel-out register responsive to a test output enable bit being stored in said fourth clocked bit latch and to said decoder at the same time receiving said command to supply clocking signal to said first serial-in/parallel-out register;

means for applying clocking signal to said second serial-in/parallel-out register responsive to a single-bit chip select signal being generated by said means for ORing said first, second and third input data port select bits at the same time said command to supply clocking signal to said second serial-in/parallel-out register is received by said decoder;

means for applying clocking signal to said third serial-in/parallel-out register responsive to the simultaneous occurrences of said first input enable signal being generated and said decoder receiving said command to supply clocking signal to each of said third and fourth and fifth serial-in/parallel-out registers conditionally;

means for applying clocking signal to said fourth serial-in/parallel-out register responsive to the simultaneous occurrences of said second input enable signal being generated and said decoder receiving said command to supply clocking signal to each of said third and fourth and fifth serial-in/parallel-out registers conditionally;

means for applying clocking signal to said fifth serial-in/parallel-out register responsive to the simultaneous occurrences of said third input enable signal being generated and said decoder receiving said command to supply clocking signal to each of said third and fourth and fifth serial-in/parallel-out registers conditionally;

means for applying clocking signal to said sixth serial-in/parallel-out register responsive to the simultaneous occurrences of said first input enable signal being generated and said decoder receiving said command to supply clocking signal to each of said sixth and eighth and tenth serial-in/parallel-out registers conditionally;

means for applying clocking signal to said seventh serial-in/parallel-out register responsive to the simultaneous occurrences of said first input enable signal being generated and said decoder receiving said command to supply clocking signal to each of said seventh and ninth and eleventh serial-in/parallel-out registers conditionally;

means for applying clocking signal to said eighth serial-in/parallel-out register responsive to the simultaneous occurrences of said second input enable signal being generated and said decoder receiving said command to supply clocking signal to each of said sixth and eighth and tenth serial-in/parallel-out registers conditionally;

means for applying clocking signal to said ninth serial-in/parallel-out register responsive to the simultaneous occurrences of said second input enable signal being generated and said decoder receiving said command to supply clocking signal to each of said seventh and ninth and eleventh serial-in/parallel-out registers conditionally;

means for applying clocking signal to said tenth serial-in/parallel-out register responsive to the simultaneous occurrences of said third input enable signal being generated and said decoder receiving said command to supply clocking signal to each of said sixth and eighth and tenth serial-in/parallel-out registers conditionally; and means for applying clocking signal to said eleventh serial-in/parallel-out register responsive to the simultaneous occurrences of said third input enable signal being generated and said decoder receiving said command to supply clocking signal to each of said seventh and ninth and eleventh serial-in/parallel-out registers conditionally.

37. A buffer integrated circuit as set forth in claim 35 including:

respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a first bit-error OR response;

means for ORing error indications from said second bit-error detectors to generate a second bit-error OR response; and means for ORing error indications from said third bit-error detectors to generate a third bit-error OR response.

38. A buffer integrated circuit as set forth in claim 37 including:

means for ANDing said first bit-error OR response and said first input enable signal to generate a first AND response;

means for ANDing said second bit-error OR response and said second input enable signal to generate a second AND response;

means for ANDing said third bit-error OR response and said third input enable signal to generate a third AND response; and means for ORing said first AND response, said second AND response, and said third AND response to generate a buffer integrated circuit fault indication.

39. A multiplicity of buffer integrated circuits as set forth in claim 38 connecting together groups of integrated circuits of the same type as each other, to form a fault-tolerant electronic system for use with a routing computer that responds to any circuit fault indications from said buffer integrated circuits to attempt to condition said buffer integrated circuits for interconnecting said integrated circuits of other type to provide at least one data path through said fault-tolerant electronic system.

40. A buffer integrated circuit as set forth in claim including:

means responsive to a further command for conditionally supplying clocking signal to each of said third, fourth and fifth serial-in/parallel-out registers and at the same time conditioning said third, fourth and fifth serial-in/parallel-out registers each for responding to clocking signal supplied thereto to circulate the test vectors stored therein.

41. A buffer integrated circuit as set forth in claim 40 wherein said means responsive to respective commands and said means responsive to a further command together include:

a decoder for determining which of said commands is supplied thereto via a set of instruction lines;

means for generating clocking signal;

means for applying clocking signal to said first and second and third and fourth clocked bit latches responsive to said command to supply clocking signal to said first and second and third and fourth clocked bit latches being received by said decoder;

means for applying clocking signal to said first serial-in/parallel-out register responsive to a test output enable bit being stored in said fourth clocked bit latch and to said decoder at the same time receiving said command to supply clocking signal to said first serial-in/parallel-out register;

means for applying clocking signal to said second serial-in/parallel-out register responsive to a single-bit chip select signal being generated by said means for ORing said first, second and third input data port select bits at the same time said command to supply clocking signal to said second serial-in/parallel-out register is received by said decoder;

means for applying clocking signal to said third serial-in/parallel-out register responsive to the simultaneous occurrences of said first input enable signal being generated and said decoder receiving said command to supply clocking signal to each of said third and fourth and fifth serial-in/parallel-out registers conditionally;

means for applying clocking signal to said fourth serial-in/parallel-out register responsive to the simultaneous occurrences of said second input enable signal being generated and said decoder receiving said command to supply clocking signal to each of said third and fourth and fifth serial-in/parallel-out registers conditionally;

means for applying clocking signal to said fifth serial-in/parallel-out register responsive to the simultaneous occurrences of said third input enable signal being generated and said decoder receiving said command to supply clocking signal to each of said third and fourth and fifth serial-in/parallel-out registers conditionally;

means for applying clocking signal to said sixth serial-in/parallel-out register responsive to the simultaneous occurrences of said first input enable signal being generated and said decoder receiving said command to supply clocking signal to each of said sixth and eighth and tenth serial-in/parallel-out registers conditionally;

means for applying clocking signal to said seventh serial-in/parallel-out register responsive to the simultaneous occurrences of said first input enable signal being generated and said decoder receiving said command to supply clocking signal to each of said seventh and ninth and eleventh serial-in/parallel-out registers conditionally;

means for applying clocking signal to said eighth serial-in/parallel-out register responsive to the simultaneous occurrences of said second input enable signal being generated and said decoder receiving said command to supply clocking signal to each of said sixth and eighth and tenth serial-in/parallel-out registers conditionally;

means for applying clocking signal to said ninth serial-in/parallel-out register responsive to the simultaneous occurrences of said second input enable signal being generated and said decoder receiving said command to supply clocking signal to each of said seventh and ninth and eleventh serial-in/parallel-out registers conditionally;

means for applying clocking signal to said tenth serial-in/parallel-out register responsive to the simultaneous occurrences of said third input enable signal being generated and said decoder receiving said command to supply clocking signal to each of said sixth and eighth and tenth serial-in/parallel-out registers conditionally; and means for applying clocking signal to said eleventh serial-in/parallel-out register responsive to the simultaneous occurrences of said third input enable signal being generated and said decoder receiving said command to supply clocking signal to each of said seventh and ninth and eleventh serial-in/parallel-out registers conditionally.

42. A buffer integrated circuit as set forth in claim 41 including:
respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;
means for ORing error indications from said first bit-error detectors to generate a first bit-error OR response;
means for ORing error indications from said second bit-error detectors to generate a second bit-error OR response; and
means for ORing error indications from said third bit-error detectors to generate a third bit-error OR response.

43. A buffer integrated circuit as set forth in claim 42 including:
means for ANDing said first bit-error OR response and said first input enable signal to generate a first AND response;
means for ANDing said second bit-error OR response and said second input enable signal to generate a second AND response;
means for ANDing said third bit-error OR response and said third input enable signal to generate a third AND response; and
means for ORing said first AND response, said second AND response, and said third AND response to generate a buffer integrated circuit fault indication.

44. A multiplicity of buffer integrated circuits as set forth in claim 43 connecting together groups of integrated circuits of the same type as each other, to form a fault-tolerant electronic system for use with a routing computer that responds to any circuit fault indications from said buffer integrated circuits to attempt to condition said buffer integrated circuits for interconnecting said integrated circuits of other type to provide at least one data path through said fault-tolerant electronic system.

45. A buffer integrated circuit as set forth in claim 31 including:
a sixth serial-in/parallel-out register having a serial input port connected from said test input terminal for receiving control bits for each said first switch means and each said second switch means one bit at a time during selective clocking of that register, and having a parallel output port with a respective bit place corresponding to each of said first switch means and said second switch means;
respective first switch control means corresponding to each said first switch means, for supplying a respective control bit thereto as causes that said first switch means to selectively connect, responsive to said test enable terminal not receiving said test enable bit or the corresponding bit place of said sixth serial-in/parallel-out register output port being in a first rather than a second state;
respective second switch control means corresponding to each said second switch means, for supplying a respective control bit thereto as causes that said second switch means to selectively connect, responsive to said test enable terminal receiving said test enable bit at the same time the corresponding bit place of said sixth serial-in/parallel-out register output port is in a first rather than a second state;
a seventh serial-in/parallel-out register having a serial input port connected from said test input terminal for receiving control bits for each said third switch means and each said fourth switch means one bit at a time during selective clocking of that register, and having a parallel output port with a respective bit place corresponding to each of said third switch means and said fourth switch means;
respective third switch control means corresponding to each said third switch means, for supplying a respective control bit thereto as causes that said third switch means to selectively connect, responsive to said test enable terminal not receiving said test enable bit or the corresponding bit place of said seventh serial-in/parallel-out register output port being in a first rather than a second state;
respective fourth switch control means corresponding to each said fourth switch means, for supplying a respective control bit thereto as causes that said fourth switch means to selectively connect, responsive to said test enable terminal receiving said test enable bit at the same time the corresponding bit place of said seventh serial-in/parallel-out register output port is in a first rather than a second state;
an eighth serial-in/parallel-out register having a serial input port connected from said test input terminal for receiving control bits for each said fifth switch means and each said sixth switch means one bit at a time during selective clocking of that register, and having a parallel output port with a respective bit place corresponding to each of said fifth switch means and said sixth switch means;
respective fifth switch control means corresponding to each said fifth switch means, for supplying a respective control bit thereto as causes that said fifth switch means to selectively connect, responsive to said test enable terminal not receiving said test enable bit or the corresponding bit place of said eighth serial-in/parallel-out register output port being in a first rather than a second state;
respective sixth switch control means corresponding to each said sixth switch means, for supplying a respective control bit thereto as causes that said sixth switch means to selectively connect, responsive to said test enable terminal receiving said test enable bit at the same time the corresponding bit place of said eighth serial-in/parallel-out register output port is in a first rather than a second state; and
means responsive to respective commands for supplying clocking signal to said first and second and third and fourth clocked bit latches, to said first serial-in/parallel-out register, to said second serial-in/parallel-out register to each of said third and fourth and fifth serial-in/parallel-out registers conditionally, to each of said sixth and seventh and eighth serial-in/parallel-out registers conditionally, or to none of them.

46. A buffer integrated circuit as set forth in claim 45 wherein said means responsive to respective commands for supplying clocking signal includes therein:

a decoder for determining which of said commands is supplied thereto via a set of instruction lines;

means for generating clocking signal;

means for applying clocking signal to said first and second and third and fourth clocked bit latches responsive to said command to supply clocking signal to said first and second and third and fourth clocked bit latches being received by said decoder;

means for applying clocking signal to said first serial-in/parallel-out register responsive to a test output enable bit being stored in said fourth clocked bit latch and to said decoder at the same time receiving said command to supply clocking signal to said first serial-in/parallel-out register;

means for applying clocking signal to said second serial-in/parallel-out register responsive to a single-bit chip select signal being generated by said means for ORing said first, second and third input data port select bits at the same time said command to supply clocking signal to said second serial-in/parallel-out register is received by said decoder;

means for applying clocking signal to said third serial-in/parallel-out register responsive to the simultaneous occurrences of said first input enable signal being generated and said decoder receiving said command to supply clocking signal to each of said third and fourth and fifth serial-in/parallel-out registers conditionally;

means for applying clocking signal to said fourth serial-in/parallel-out register responsive to the simultaneous occurrences of said second input enable signal being generated and said decoder receiving said command to supply clocking signal to each of said third and fourth and fifth serial-in/parallel-out registers conditionally;

means for applying clocking signal to said fifth serial-in/parallel-out register responsive to the simultaneous occurrences of said third input enable signal being generated and said decoder receiving said command to supply clocking signal to each of said third and fourth and fifth serial-in/parallel-out registers conditionally;

means for applying clocking signal to said sixth serial-in/parallel-out register responsive to the simultaneous occurrences of said first input enable signal being generated and said decoder receiving said command to supply clocking signal to each of said sixth and seventh and eighth serial-in/parallel-out registers conditionally;

means for applying clocking signal to said seventh serial-in/parallel-out register responsive to the simultaneous occurrences of said second input enable signal being generated and said decoder receiving said command to supply clocking signal to each of said sixth and seventh and eighth serial-in/parallel-out registers conditionally; and means for applying clocking signal to said eighth serial-in/parallel-out register responsive to the simultaneous occurrences of said third input enable signal being generated and said decoder receiving said command to supply clocking signal to each of said sixth and seventh and eighth serial-in/parallel-out registers conditionally.

47. A buffer integrated circuit as set forth in claim 46 including:

respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a first bit-error OR response;

means for ORing error indications from said second bit-error detectors to generate a second bit-error OR response; and means for ORing error indications from said third bit-error detectors to generate a third bit-error OR response.

48. A buffer integrated circuit as set forth in claim 47 including:

means for ANDing said first bit-error OR response and said first input enable signal to generate a first AND response;

means for ANDing said second bit-error OR response and said second input enable signal to generate a second AND response;

means for ANDing said third bit-error OR response and said third input enable signal to generate a third AND response; and means for ORing said first AND response, said second AND response, and said third AND response to generate a buffer integrated circuit fault indication.

49. A multiplicity of buffer integrated circuits as set forth in claim 48 connecting together groups of integrated circuits of the same type as each other, to form a fault-tolerant electronic system for use with a routing computer that responds to any circuit fault indications from said buffer integrated circuits to attempt to condition said buffer integrated circuits for interconnecting said integrated circuits of other type to provide at least one data path through said fault-tolerant electronic system.

50. A buffer integrated circuit as set forth in claim 45 including:

means responsive to a further command for conditionally supplying clocking signal to each of said third, fourth and fifth serial-in/parallel-out registers and at the same time conditioning said third, fourth and fifth serial-in/parallel-out registers each for responding to clocking signal supplied thereto to circulate the test vectors stored therein.

51. A buffer integrated circuit as set forth in claim 50 wherein said means responsive to respective commands for supplying clocking signal includes therein:

a decoder for determining which of said commands is supplied thereto via a set of instruction lines;

means for generating clocking signal;

means for applying clocking signal to said first and second and third and fourth clocked bit latches responsive to said command to supply clocking signal to said first and second and third and fourth clocked bit latches being received by said decoder;

means for applying clocking signal to said first serial-in/parallel-out register responsive to a test output enable bit being stored in said fourth clocked bit latch and to said decoder at the same time receiving said command to supply clocking signal to said first serial-in/parallel-out register;

means for applying clocking signal to said second serial-in/parallel-out register responsive to a single-bit chip select signal being generated by said means for ORing said first, second and third input data port select bits at the same time said command to supply clocking signal to said second serial-in/parallel-out register is received by said decoder;

means for applying clocking signal to said third serial-in/parallel-out register responsive to the simultaneous occurrences of said first input enable signal being generated and said decoder receiving said command to supply clocking signal to each of said third and fourth and fifth serial-in/parallel-out registers conditionally;

means for applying clocking signal to said fourth serial-in/parallel-out register responsive to the simultaneous occurrences of said second input enable signal being generated and said decoder receiving said command to supply clocking signal to each of said third and fourth and fifth serial-in/parallel-out registers conditionally;

means for applying clocking signal to said fifth serial-in/parallel-out register responsive to the simultaneous occurrences of said third input enable signal being generated and said decoder receiving said command to supply clocking signal to each of said third and fourth and fifth serial-in/parallel-out registers conditionally;

means for applying clocking signal to said sixth serial-in/parallel-out register responsive to the simultaneous occurrences of said first input enable signal being generated and said decoder receiving said command to supply clocking signal to each of said sixth and seventh and eighth serial-in/parallel-out registers conditionally;

means for applying clocking signal to said seventh serial-in/parallel-out register responsive to the simultaneous occurrences of said second input enable signal being generated and said decoder receiving said command to supply clocking signal to each of said sixth and seventh and eighth serial-in/parallel-out registers conditionally; and means for applying clocking signal to said eighth serial-in/parallel-out register responsive to the simultaneous occurrences of said third input enable signal being generated and said decoder receiving said command to supply clocking signal to each of said sixth and seventh and eighth serial-in/parallel-out registers conditionally.

52. A buffer integrated circuit as set forth in claim 51 including:

respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a first bit-error OR response;

means for ORing error indications from said second bit-error detectors to generate a second bit-error OR response; and means for ORing error indications from said third bit-error detectors to generate a third bit-error OR response.

53. A buffer integrated circuit as set forth in claim 52 including:

means for ANDing said first bit-error OR response and said first input enable signal to generate a first AND response;

means for ANDing said second bit-error OR response and said second input enable signal to generate a second AND response;

means for ANDing said third bit-error OR response and said third input enable signal to generate a third AND response; and means for ORing said first AND response, said second AND response, and said third AND response to generate a buffer integrated circuit fault indication.

54. A multiplicity of buffer integrated circuits as set forth in claim 53 connecting together groups of integrated circuits of the same type as each other, to form a fault-tolerant electronic system for use with a routing computer that responds to any circuit fault indications from said buffer integrated circuits to attempt to condition said buffer integrated circuits for interconnecting said integrated circuits of other type to provide at least one data path through said fault-tolerant electronic system.

55. An integrated circuit comprising:
a serial data input terminal;
a chip select input terminal;
a chip select output terminal;
means for generating clocking signal;
a clocked bit latch in connection between said chip select input terminal and said chip select output terminal for storing a chip select bit as may be received through said chip select input terminal during selective application of said clocking signal to said clocked bit latch;
a plurality of serial-in/parallel-out registers, each having a respective serial input port for loading data therethrough from said serial data input terminal one bit at a time during selective application of said clocking signal to that register and having a respective parallel output port;
a decoder for decoding a plurality of commands received in coded form to generate corresponding one-bit decoder results;
means responsive to the one-bit decoder result corresponding to a first of said commands for applying said clocking signal to said clocked bit latch;
means responsive to the one-bit decoder result corresponding to a second of said commands for applying said clocking signal to a first of said plurality of serial-in/parallel-out registers, for shifting a register select token bit from said serial data input terminal within said first serial-in/parallel-out register to appear at a bit place in its parallel output port, which said first serial-in/parallel-out register has a respective bit place in its parallel output port corresponding to each of the remaining ones of said plurality of serial-in/parallel-out registers; and
respective means corresponding to each remaining one of said plurality of serial-in/parallel-out registers for applying said clocking signal thereto, responsive to the one-bit decoder result corresponding to a third of said commands appearing concurrently with a register select token bit being in the corresponding bit place of the parallel output port of said first serial-in/parallel-out register.

56. In combination:
a first plurality of tristate drivers, N in number, each having a respective data bit input terminal, a respective control bit input terminal and a respective data bit output terminal, which data bit output terminals together form a data output port for said integrated circuit;

a voter circuit of the type performing majority logic on a bit-sliced basis, said voter circuit having first, second and third input ports and having an output port, each of which ports has N respective bit places therein, the N respective bit places of the output port of said voter circuit supplying respective ones of data bits applied to the data bit terminals of said first plurality of tristate drivers;

respective first, second and third bit-error detectors associated with each bit slice of said voter circuit responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a first bit-error OR response;

means for ORing error indications from said second bit-error detectors to generate a second bit-error OR response;

means for ORing error indications from said third bit-error detectors to generate a third bit-error OR response;

means for ANDing said first bit-error OR response and a first input enable signal to generate a first AND response;

means for ANDing said second bit-error OR response and a second input enable signal to generate a second AND response;

means for ANDing said third bit-error OR response and a third input enable signal to generate a third AND response; and means for ORing said first AND response, said second AND response, and said third AND response to generate a circuit fault indication.

57. A buffer integrated circuit providing a testing interface, said buffer integrated circuit being arranged in combination with said first, second and third data processing circuits of similar type, having respective input ports connected for receiving the same input signal and having respective output ports, each of which output ports has N respective bit places therein, N being an integer greater than one, wherein said buffer integrated circuit further includes:

a first plurality of tristate drivers, N in number, each having a respective data bit input terminal, a respective control bit input terminal and a respective data output terminal, which data bit input terminals together form a data input port for said buffer integrated circuit, and which data bit output terminals together form a data output port for said buffer integrated circuit;

means for applying data signal bits to the data bit input terminals of said first plurality of tristate drivers;

means for applying respective control signal bits to the control bit input terminals of said first plurality of tristate drivers;

a test output terminal;

multiplexer means for selecting to said test output terminal the respective logic condition at any one of the data bit output terminals of said first plurality of tristate drivers;

a voter circuit of the type performing majority logic on a bit-sliced basis, said voter circuit having first, second and third input ports and having an output port, each of which ports has N respective bit places therein, the N respective bit places of the output port of said voter circuit supplying respective ones of data bits applied to the data bit terminals of said first plurality of tristate drivers;

respective first, second and third bit-error detectors associated with each bit slice of said voter circuit responding to any differences between the bit that bit slice supplies to the output port of said voter circuit and the bits that bit slice receives respectively from the first, second and third input ports of said voter circuit for generating respective error indications;

means for ORing error indications from said first bit-error detectors to generate a first bit-error OR response;

means for ORing error indications from said second bit-error detectors to generate a second bit-error OR response;

means for ORing error indications from said third bit-error detectors to generate a third bit-error OR response;

means responsive to a first input enable signal for selectively connecting the output port of said first data processing circuit to the first input port of said voter circuit;

means responsive to a second input enable signal for selectively connecting the output port of said second data processing circuit to the second input port of said voter circuit;

means responsive to a third input enable signal for selectively connecting the output port of said third data processing circuit to the third input port of said voter circuit;

means for ANDing said first bit-error OR response and said first input enable signal to generate a first AND response;

means for ANDing said second bit-error OR response and a second input enable signal to generate a second AND response;

means for ANDing said third bit-error OR response and a third input enable signal to generate a third AND response; and means for ORing said first AND response, said second AND response, and said third AND response to generate a circuit fault indication.

58. A combination as set forth in claim 57 operated so as to apply a prescribed pattern of said first, second and third input enable signals thereto as long as said circuit fault indication is not generated; and when said circuit fault indication is generated changing in a prescribed manner said prescribed pattern of said first, second and third input enable signals applied thereto until said circuit fault indication is not generated.

59. In combination:

a voter circuit of the type performing majority logic on a bit-sliced basis, said voter circuit having first, second and third input ports connected at least, said voter circuit having an output port, each of which ports of said voter circuit has N respective bit places therein, N being an integer greater than one;

first, second and third data processing circuits of the same type, having respective input ports connected for receiving the same input signal and having respective output ports, each of which output ports has N respective bit places therein;

means for applying, at least at selected times, a signal from the output port of said first data processing circuit to the first input port of said voter circuit and being of a type for selectively applying the signal from the output port of said first data processing circuit to the first input port of said voter circuit in response to a first input enable signal;

means for applying, at least at selected times, a signal from the output port of said second data processing circuit to the first input port of said voter circuit and being of a type for selectively applying the signal from the output port of said second data processing circuit to the second input port of said voter circuit in response to a second input enable signal;

means for applying, at least at selected times, a signal from the output port of said third data processing circuit to the third input port of said voter circuit and being of a type for selectively applying the signal from the output port of said third data processing circuit to the third input port of said voter circuit in response to a third input enable signal;

respective first, second and third bit-error detectors associated with each bit slice of said voter circuit for responding to any differences between the bit that bit slice supplies to the output port of said voter circuit and the bits that bit slice receives respectively at the first, second and third input ports of said voter circuit for generating respective error indications;

means for ORing error indications from said first bit-error detectors to generate a signal indicative of a likelihood of fault in said first data processing circuit;

means for ORing error indications from said second bit-error detectors to generate a signal indicative of a likelihood of fault in said second data processing circuit;

means for ORing error indications from said third bit-error detectors to generate a signal indicative of a likelihood of fault in said third data processing circuit; and means for responding to any of said signals indicative of a likelihood of fault being generated to generate an indication of a fault in at least one of said first, second and third data processing circuits, and comprising:

means for ANDing said first enable signal and said signal indicative of a likelihood of fault in said first data processing circuit to generate a first AND response;

means for ANDing said second enable signal and said signal indicative of a likelihood of fault in said second data processing circuit to generate a second AND response;

means for ANDing said third enable signal and said signal indicative of a likelihood of fault in said third data processing circuit to generate a third AND response;

means for ORing said first AND response, said second AND response, and said third AND response to generate said indication of a fault in at least one of said first, second and third data processing circuits.

60. A combination as set forth in claim 59 operated so as to apply a prescribed pattern of said first, second and third input enable signals thereto as long as said indication of a fault in at least one of said first, second and third data processing circuits is not generated; and when said indication of a fault in at least one of said first, second and third data processing circuits is generated changing in a prescribed manner said prescribed pattern of said first, second and third input enable signals applied thereto until said indication of a fault in at least one of said first, second and third data processing circuits is not generated.

* * * * *